United States Patent
Chuang et al.

(10) Patent No.: US 12,300,566 B2
(45) Date of Patent: May 13, 2025

(54) INTEGRATED CHIP WITH GOOD THERMAL DISSIPATION PERFORMANCE

(71) Applicant: Taiwan Semiconductor Manufacturing Company, Ltd., Hsinchu (TW)

(72) Inventors: Harry-Hak-Lay Chuang, Zhubei (TW); Hsin Fu Lin, Hsinchu County (TW); Shiang-Hung Huang, New Taipei (TW); Tsung-Hao Yeh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 227 days.

(21) Appl. No.: 17/728,048

(22) Filed: Apr. 25, 2022

(65) Prior Publication Data
US 2023/0010333 A1   Jan. 12, 2023

Related U.S. Application Data

(60) Provisional application No. 63/222,556, filed on Jul. 16, 2021, provisional application No. 63/220,093, filed on Jul. 9, 2021.

(51) Int. Cl.
| | |
|---|---|
| H01L 23/367 | (2006.01) |
| H01L 21/762 | (2006.01) |
| H01L 23/528 | (2006.01) |
| H10D 86/00 | (2025.01) |
| H10D 86/01 | (2025.01) |

(52) U.S. Cl.
CPC ...... *H01L 23/367* (2013.01); *H01L 21/76283* (2013.01); *H01L 23/5283* (2013.01); *H10D 86/01* (2025.01); *H10D 86/201* (2025.01)

(58) Field of Classification Search
CPC .......... H01L 27/1203; H01L 23/53295; H01L 21/84; H01L 21/76896; H01L 23/481; H01L 27/0248
USPC .......................................... 257/347; 438/149
See application file for complete search history.

(56) References Cited

U.S. PATENT DOCUMENTS

| | | | | |
|---|---|---|---|---|
| 5,970,346 A | * | 10/1999 | Liaw | H01L 23/5258 438/281 |
| 6,307,213 B1 | * | 10/2001 | Huang | H01L 23/5258 257/50 |
| 2002/0063305 A1 | * | 5/2002 | Koike | H01L 23/5258 257/E23.15 |

* cited by examiner

*Primary Examiner* — Hung K Vu
(74) *Attorney, Agent, or Firm* — Eschweiler & Potashnik, LLC

(57) ABSTRACT

Various embodiments of the present disclosure are directed towards an integrated chip (IC). The IC comprises a substrate. A semiconductor device is disposed on the substrate. An interlayer dielectric (ILD) structure is disposed over the substrate and the semiconductor device. A first intermetal dielectric (IMD) structure is disposed over the substrate and the ILD structure. An opening is disposed in the first IMD structure, wherein the opening overlies at least a portion of the semiconductor device.

20 Claims, 36 Drawing Sheets

INTEGRATED CHIP WITH GOOD THERMAL DISSIPATION PERFORMANCE

REFERENCE TO RELATED APPLICATIONS

This application claims the benefit of U.S. Provisional Application No. 63/220,093, filed on Jul. 9, 2021, and U.S. Provisional Application No. 63/222,556, filed on Jul. 16, 2021. The contents of the above-referenced patent applications are hereby incorporated by reference in their entirety.

BACKGROUND

Semiconductor devices are electronic components that exploit electronic properties of semiconductor materials to affect electrons or their associated fields. A widely used type of semiconductor device is metal-oxide-semiconductor field-effect transistor (MOSFET). Semiconductor devices have traditionally been formed on bulk semiconductor substrates. In recent years, semiconductor-on-insulator (SOI) substrates have emerged as an alternative to bulk semiconductor substrates. Another type of semiconductor device is a high voltage device, such as a high voltage laterally diffused metal oxide semiconductor (LDMOS) device that has the ability to handle high breakdown voltages (e.g., greater than about 20V or 50V) and high frequencies. As more SOI substrates and high voltage device are utilized, techniques and/or structures for dissipating heat are being implemented to improve device endurance and increase device density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
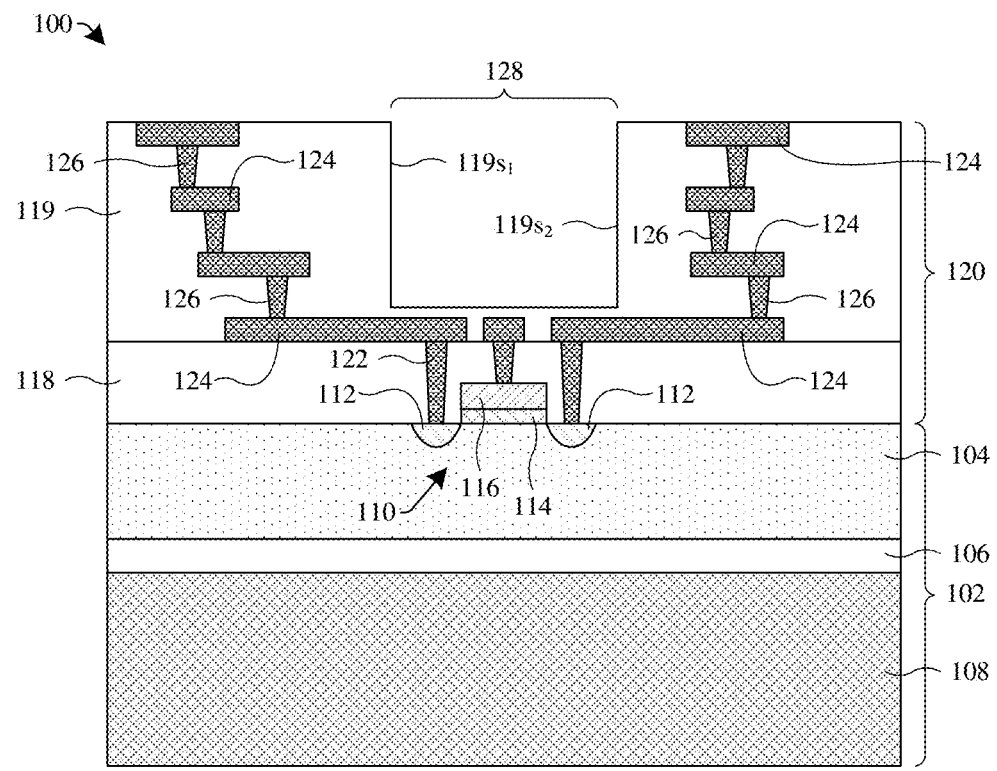
FIG. 1 illustrates a cross-sectional view of some embodiments of an integrated chip (IC) comprising an opening disposed in a first intermetal dielectric (IMD) structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips (ICs) comprise a semiconductor device (e.g., insulated gate field-effect transistors (IGFET)) disposed over/within a semiconductor-on-insulator (SOI) substrate. The SOI substrate comprises an insulating layer (e.g., a dielectric layer) that vertically separates a first semiconductor layer from a second semiconductor layer. The insulating layer is disposed below (e.g., directly below) the semiconductor device. An intermetal dielectric (IMD) structure and/or passivation layer(s) are disposed over the semiconductor device. An interconnect structure (e.g., copper interconnect structure) is embedded in the IMD structure.

Typically, the IMD structure and/or the passivation layers are disposed directly over the semiconductor device. The IMD structure, passivation layer(s), and insulating layer are made of materials (e.g., dielectric materials) that suppress thermal energy generated by the semiconductor device from easily dissipating out of the IC. As such, a typical IC with an SOI substrate may have poor thermal dissipation performance (e.g., low dissipation of thermal energy generated by the semiconductor device), which may reduce performance of the IC and/or destroy the semiconductor device (e.g., due to thermal runaway).

Various embodiments of the present disclosure are directed toward an integrated chip (IC) with good thermal dissipation performance (e.g., high dissipation of thermal energy generated by the semiconductor device). The IC of the present disclosure comprises a substrate. In some embodiments, the substrate is an SOI substrate that comprises a device layer disposed over an insulating layer. A semiconductor device is disposed on/over the substrate. An intermetal dielectric (IMD) structure is disposed over the substrate and the ILD structure. An opening (e.g., a void in the IMD structure) is disposed in the IMD structure. The opening overlies at least a portion of the semiconductor device. Because the opening overlies at least a portion of the semiconductor device, the thermal energy generated by the semiconductor device may be more efficiently dissipated away from the semiconductor device (e.g., by having less IMD material over the semiconductor device thermal heat may be more efficiently dissipated from the semiconductor device to the atmosphere). As such, the IC of the present disclosure has good thermal dissipation performance (e.g., high thermal dissipation of heat generated by the semiconductor device).

For example, in a typical IC, a portion of the IMD structure (and/or passivation layers) directly overlies the semiconductor device, which may suppress thermal dissipation from the semiconductor device. Unlike a typical IC, the opening overlies at least a portion of the semiconductor device. The opening may be more efficient at dissipating thermal energy than the portion of the IMD structure. Thus, the IC of the present disclosure may have improved thermal dissipation performance over the typical IC.

FIG. 1 illustrates a cross-sectional view 100 of some embodiments of an integrated chip (IC) comprising an opening 128 disposed in a first intermetal dielectric (IMD) structure 119.

As shown in the cross-sectional view 100 of FIG. 1, the IC comprises a substrate 102. The substrate 102 comprises any type of semiconductor body (e.g., monocrystalline silicon/CMOS bulk, germanium (Ge), silicon-germanium (SiGe), a III-V semiconductor, semiconductor-on-insulator (SOI), etc.). In some embodiments, the substrate 102 is a semiconductor-on-insulator (SOI) substrate (e.g., silicon-on-insulator). In such embodiments, the substrate 102 may comprise a device layer 104, an insulating layer 106, and a handle layer 108. The device layer 104 is disposed over the insulating layer 106 and the handle layer 108. The insulating layer 106 is disposed vertically between the handle layer 108 and the device layer 104.

The device layer 104 is a semiconductor material. The semiconductor material may be or comprise, for example, silicon (Si), germanium (Ge), silicon-germanium (SiGe), gallium arsenide (GaAs), some other semiconductor material, or a combination of the foregoing. In some embodiments, the device layer 104 is silicon (Si). In further embodiments, the device layer 104 is monocrystalline silicon.

The handle layer 108 is disposed below both the insulating layer 106 and the device layer 104. The handle layer 108 may be or comprise, a semiconductor material (e.g., silicon (Si), germanium (Ge), monocrystalline silicon, polycrystalline silicon, etc.), a doped semiconductor material (e.g., doped silicon (Si), doped germanium (Ge), etc.), a metal (e.g., copper (Cu), aluminum (Al), tungsten (W), gold (Au), silver (Ag), platinum (Pt), etc.), or the like.

The insulating layer 106 vertically separates the handle layer 108 from the device layer 104. The insulating layer 106 electrically isolates the device layer 104 from the handle layer 108. The insulating layer 106 may be or comprise, for example, an oxide (e.g., silicon dioxide ($SiO_2$)), a nitride (e.g., silicon nitride (SiN)), an oxy-nitride (e.g., silicon oxy-nitride (SiON)), a low-k dielectric (e.g., a dielectric material with a dielectric constant less than about 3.9), a high-k dielectric material (e.g., a dielectric material with a dielectric constant greater than about 3.9, such as hafnium oxide (HfO), tantalum oxide (TaO), hafnium silicon oxide (HfSiO), or the like), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), some other dielectric material, or a combination of the foregoing.

A first semiconductor device 110 (e.g., insulated gate field-effect transistors (IGFET)) is disposed on/over the substrate 102. In some embodiments, the first semiconductor device 110 is disposed on/over the device layer 104. For example, the first semiconductor device 110 comprises a pair of source/drain regions 112, a gate dielectric 114, and a gate electrode 116. The pair of source/drain regions 112 are regions of the device layer 104 having a first doping type (e.g., n-type).

The gate dielectric 114 is disposed over the device layer 104 and between the source/drain regions of the pair of source/drain regions 112. The gate electrode 116 overlies the gate dielectric 114. In some embodiments, the gate dielectric 114 and the gate electrode 116 are collectively referred to as a gate stack. In some embodiments, the gate electrode 116 is or comprises polysilicon. In such embodiments, the gate dielectric 114 may be or comprise, for example, an oxide (e.g., $SiO_2$). In other embodiments, the gate electrode 116 may be or comprise a metal, such as aluminum (Al), copper (Cu), titanium (Ti), tantalum (Ta), tungsten (W), molybdenum (Mo), cobalt (Co), or the like. In such embodiments, the gate dielectric 114 may be or comprise a high-k dielectric material, such as hafnium oxide (HfO), tantalum oxide (TaO), hafnium silicon oxide (HfSiO), hafnium tantalum oxide (HfTaO), aluminum oxide (AlO), zirconium oxide (ZrO), or the like.

An interlayer dielectric (ILD) structure 118 is disposed over both the first semiconductor device 110 and the substrate 102. The ILD structure 118 comprises one or more stacked ILD layers, which may respectively comprise a low-k dielectric (e.g., a dielectric material with a dielectric constant less than about 3.9), an oxide (e.g., $SiO_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like. In some embodiments, the ILD structure 118 is a single ILD layer.

A first intermetal dielectric (IMD) structure 119 is disposed over both the ILD structure 118 and the substrate 102. The first IMD structure 119 comprises one or more stacked IMD layers, which may respectively comprise a low-k dielectric (e.g., a dielectric material with a dielectric constant less than about 3.9), an oxide (e.g., $SiO_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like.

An interconnect structure 120 (e.g., metal interconnect) is disposed in (e.g., embedded in) the ILD structure 118 and the first IMD structure 119. The interconnect structure 120 is disposed over the substrate 102. The interconnect structure 120 comprises a plurality of conductive contacts 122 (e.g., metal contacts), a plurality of conductive lines 124 (e.g., metal wires), and a plurality of conductive vias 126 (e.g., metal vias). For clarity in the figures, only some of the plurality of conductive contacts 122, some of the plurality of conductive lines 124, and some of the plurality of conductive vias 126 are labeled in the figures. The interconnect structure 120 is configured to provide electrical connections between various devices of the IC. In other words, the plurality of conductive lines 124, the plurality of conductive vias 126, and the plurality of conductive contacts 122 are electrically coupled together in a predefined manner and are configured to provide electrical connections between the various devices of the IC.

The conductive contacts 122 are disposed in the ILD structure 118. The conductive contacts 122 extend through the ILD structure 118 to contact the pair of source/drain regions 112 and the gate electrode 116. In some embodiments, the plurality of conductive contacts 122 may be or comprise, for example, tungsten (W), copper (Cu), aluminum (Al), or the like.

The plurality of conductive lines 124 and the plurality of conductive vias 126 are disposed over the conductive contacts 122 and alternate back and forth from the conductive contacts 122 toward an upper surface of the first IMD structure 119. In some embodiments, the plurality of conductive lines 124 and the plurality of conductive vias 126 may be or comprise, for example, copper (Cu), aluminum (Al), gold (Au), silver (Ag), platinum (Pt), or the like.

An opening 128 is disposed in the first IMD structure 119. Sidewalls 119s of the first IMD structure 119 at least partially define sidewalls of the opening 128, respectively. For example, a first sidewall $119s_1$ of the sidewalls 119s of the first IMD structure 119 at least partially defines a first sidewall of the opening 128, a second sidewall $119s_2$ of the sidewalls 119s of the first IMD structure 119 at least partially defines a second sidewall of the opening 128, and so forth. In some embodiments, a bottom surface of the opening 128 (e.g., a bottommost surface of the opening 128) is defined by an upper surface of the first IMD structure 119.

The opening 128 overlies at least a portion of the first semiconductor device 110. For example, in some embodiments, the opening 128 overlies the gate electrode 116 (and the gate dielectric 114). In further embodiments, the opening 128 overlies the gate electrode 116 (and the gate dielectric 114) and at least one of the source/drain regions of the pair of source/drain regions 112. In other embodiments, the opening 128 overlies one of the source/drain regions of the pair of source/drain regions 112. In such embodiments, the opening 128 may overlie the one of the source/drain regions of the pair of source/drain regions 112 and at least a portion of the gate electrode 116 (and at least a portion of the gate dielectric 114). Because the opening 128 overlies at least a portion of the first semiconductor device 110, thermal energy generated by the first semiconductor device 110 may be efficiently dissipated away from the first semiconductor device 110 (e.g., dissipated from the first semiconductor device 110 to the atmosphere). Therefore, the IC of the present disclosure has good thermal dissipation performance (e.g., high thermal dissipation of heat generated by the semiconductor device).

Figure 2:
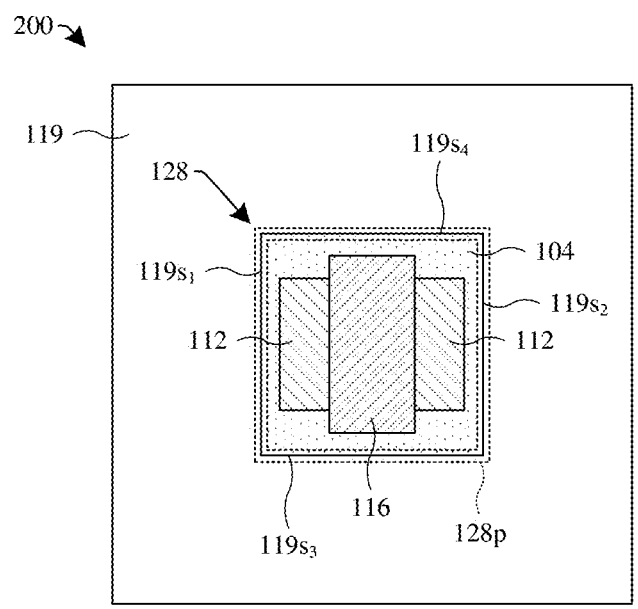
FIG. 2 illustrates a simplified top view of some embodiments of the IC of FIG. 1.

FIG. 2 illustrates a simplified top view 200 of some embodiments of the IC of FIG. 1. The simplified top view 200 of FIG. 2 is "simplified" because portions of the first IMD structure 119, portions of the interconnect structure 120, and portions of the ILD structure 118 that the opening 128 overlies are omitted from the simplified top view 200 of FIG. 2.

As shown in the top view 200 of FIG. 2, the opening 128 has a perimeter 128p. The perimeter 128p of the opening 128 is defined by the sidewalls 119s of the first IMD structure 119. For example, the perimeter 128p of the opening 128 is defined by a first sidewall $119s_1$ of the first IMD structure 119, a second sidewall $119s_2$ of the first IMD structure 119, a third sidewall $119s_3$ of the first IMD structure 119, and a fourth sidewall $119s_4$ of the first IMD structure 119.

In some embodiments, the perimeter 128p of the opening 128 may have a square shape. It will be appreciated that the perimeter 128p of the opening 128 is not limited to a square shape, but may have some other geometrical shape. For example, the perimeter 128p of the opening 128 may be rectangular, circular, oval, obround, triangular, some other geometric shape, or a combination of the foregoing. In some embodiments, as shown in the top view 200 of FIG. 2, the perimeter 128p of the opening 128 is defined by four sidewalls of the sidewalls 119s of the first IMD structure 119. Rather than being defined by four sidewalls of the sidewalls 119s of the first IMD structure 119, it will be appreciated that the perimeter 128p of the opening 128 may be defined by any number of sidewalls of the first IMD structure 119 that are connected together to form a closed loop path.

Also shown in the top view 200 of FIG. 2, the opening 128 overlies a portion of the first semiconductor device 110. In some embodiments, the portion of the first semiconductor device 110 is disposed laterally within the perimeter 128p of the opening 128. The perimeter 128p of the opening 128 laterally surrounds the portion of the first semiconductor device 110 in a closed loop path. For example, as shown in the top view 200 of FIG. 2, the perimeter 128p of the opening 128 extends laterally around the gate electrode 116 and the pair of source/drain regions 112, such that the gate electrode 116 and the pair of source/drain regions 112 are disposed laterally within the perimeter 128p of the opening 128. Because a portion of the first semiconductor device 110 is disposed laterally within the perimeter 128p of the opening 128, thermal energy generated by the first semiconductor device 110 may be more efficiently dissipated away from the first semiconductor device 110.

Figure 3:
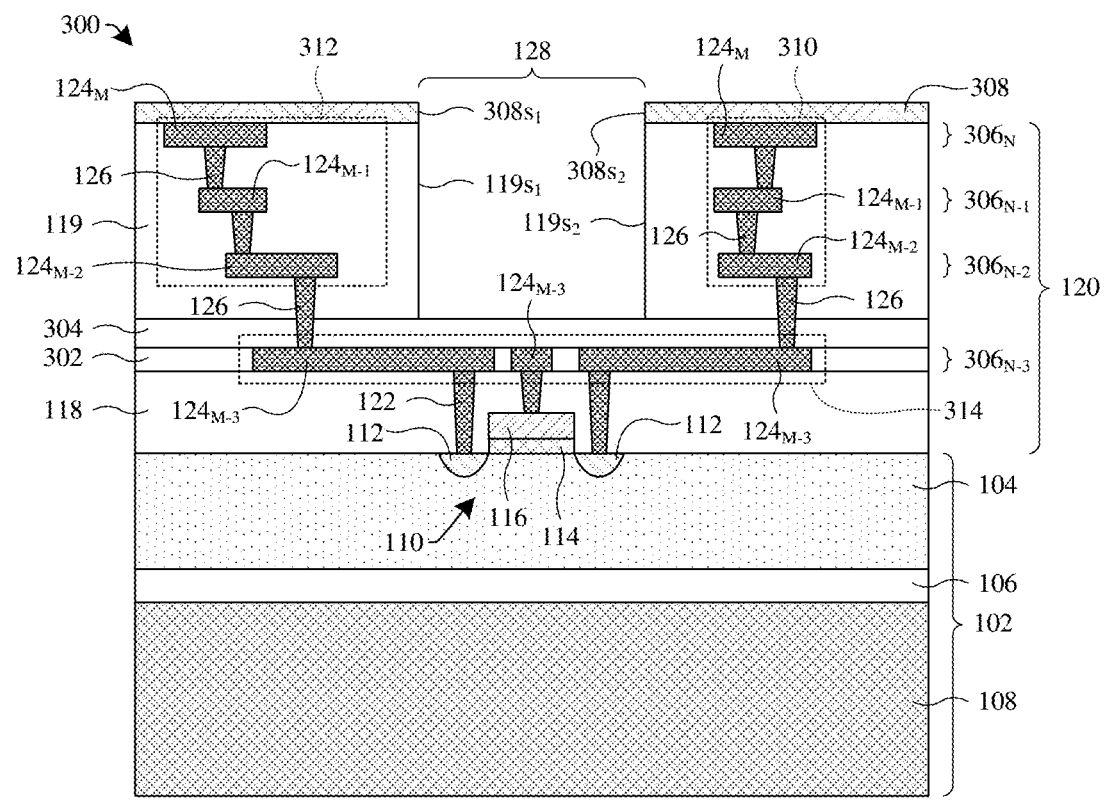
FIG. 3 illustrates a cross-sectional view of some other embodiments of the IC of FIG. 1.

FIG. 3 illustrates a cross-sectional view 300 of some other embodiments of the IC of FIG. 1.

As shown in the cross-sectional view 300 of FIG. 3, the IC comprises a second IMD structure 302. The second IMD structure 302 is disposed vertically between the ILD structure 118 and the first IMD structure 119. The second IMD structure 302 comprises one or more stacked IMD layers, which may respectively comprise a low-k dielectric (e.g., a dielectric material with a dielectric constant less than about 3.9), an oxide (e.g., $SiO_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like. In some embodiments, the second IMD structure 302 is a single IMD layer. The interconnect structure 120 is disposed in (e.g., embedded in) the second IMD structure 302.

In some embodiments, a third IMD structure 304 is disposed vertically between the second IMD structure 302 and the first IMD structure 119. In such embodiments, an upper surface of the third IMD structure 304 may define the bottom surface of the opening 128 (e.g., the bottommost surface of the opening 128). In other embodiments, the third IMD structure 304 may be omitted. In such embodiments, an upper surface of the second IMD structure 302 may define the bottom surface of the opening 128 (e.g., a bottommost surface of the opening 128). The third IMD structure 304 comprises one or more stacked IMD layers, which may respectively comprise a low-k dielectric (e.g., a dielectric material with a dielectric constant less than about 3.9), an oxide (e.g., $SiO_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like. In some embodiments, the third IMD structure 304 is a single IMD layer. The interconnect structure 120 is disposed in (e.g., embedded in) the third IMD structure 304.

The plurality of conductive lines 124 are disposed in a plurality of conductive layers 306 (e.g., a plurality of metal layers). The plurality of conductive layers 306 comprise N conductive layers, where N is any integer greater than or equal to 1. For example, as shown in the cross-sectional view 300 of FIG. 3, the plurality of conductive layers 306 comprises four (4) conductive layers (e.g., N is equal to four (4)). The plurality of conductive layers 306 extend laterally through the first IMD structure 119 and the second IMD structure 302. For example, a first conductive layer $306_{N\text{-}3}$ (e.g., metal layer 1) of the plurality of conductive layers 306 extends laterally through the second IMD structure 302, a second conductive layer $306_{N\text{-}2}$ (e.g., metal layer 2) of the plurality of conductive layers 306 extends laterally through the first IMD structure 119, a third conductive layer $306_{N\text{-}1}$ (e.g., metal layer 3) of the plurality of conductive layers 306 extends laterally through the first IMD structure 119, and a fourth conductive layer $306_N$ (e.g., metal layer 4) of the plurality of conductive layers 306 extends laterally through the first IMD structure 119. In some embodiments, the plurality of conductive layers 306 extend laterally through the third IMD structure 304. In other embodiments, the plurality of conductive layers 306 may not extend laterally through the third IMD structure 304. In further embodiments, the Nth conductive layer (e.g., the fourth conductive layer $306_N$) of the plurality of conductive layers 306 is an uppermost conductive layer of the plurality of conductive layers 306.

The plurality of conductive lines 124 comprises M groups of conductive lines, where M is any integer greater than or equal to 1. For example, as shown in the cross-sectional view 300 of FIG. 3, the plurality of conductive lines 124 comprises four (4) groups of conductive lines (e.g., M is equal to four (4)). Each of the M groups of conductive lines comprises one or more of the plurality of conductive lines 124. Each of the plurality of conductive layers 306 comprises one of the M groups of conductive layers. For example, as shown in the cross-sectional view 300 of FIG. 3, the first conductive layer $306_{N\text{-}3}$ of the plurality of conductive layers 306 comprises a first group of conductive lines $124_{M\text{-}3}$, the second conductive layer $306_{N\text{-}2}$ of the plurality of conductive layers 306 comprises a second group of conductive lines $124_{M\text{-}2}$, the third conductive layer $306_{N\text{-}1}$ of the plurality of conductive layers 306 comprises a third group of conductive lines $124_{M\text{-}1}$, and the fourth conductive layer $306_N$ of the plurality of conductive layers 306 comprises a fourth group of conductive lines $124_M$.

The plurality of conductive layers 306 are disposed over one another. For example, the second conductive layer $306_{N\text{-}2}$ is disposed over the first conductive layer $306_{N\text{-}3}$, the third conductive layer $306_{N\text{-}1}$ is disposed over the second conductive layer $306_{N\text{-}2}$, and the fourth conductive layer $306_N$ is disposed over the third conductive layer $306_{N\text{-}1}$. The plurality of conductive vias 126 extend vertically between the plurality of conductive layers 306 and electrically couple the plurality of conductive lines 124 of the plurality of conductive layers 306 together in a predefined manner. For example, a first group of conductive vias of the plurality of conductive vias 126 extend vertically between the first conductive layer $306_{N\text{-}3}$ and the second conductive layer $306_{N\text{-}2}$ and electrically couple the first group of conductive lines $124_{M\text{-}3}$ to the second group of conductive lines $124_{M\text{-}2}$ in a predefined manner, a second group of conductive vias of the plurality of conductive vias 126 extend vertically between the second conductive layer $306_{N\text{-}2}$ and the third conductive layer $306_{N\text{-}1}$ and electrically couple the second group of conductive lines $124_{M\text{-}2}$ to the third group of conductive lines $124_{M\text{-}1}$ in a predefined manner, and so forth.

Also shown in the cross-sectional view 300 of FIG. 3, a first passivation layer 308 is disposed over the first IMD structure 119, the interconnect structure 120, and the substrate 102. The first passivation layer 308 may be or comprise, for example, an oxide (e.g., $SiO_2$), a nitride (e.g., SiN), an oxy-nitride (e.g., $SiO_xN_y$), some other passivation material, or a combination of the foregoing. In some embodiments, the first passivation layer 308 is a different material than the first IMD structure 119. In further embodiments, the first passivation layer 308 has a planar upper surface.

The sidewalls 119s of the first IMD structure 119 and sidewalls 308s of the first passivation layer 308 at least partially define sidewalls of the opening 128. For example, the first sidewall $119s_1$ of the first IMD structure 119 and a first sidewall $308s_1$ of the sidewalls 308s of the first passivation layer 308 at least partially define the first sidewall of the opening 128, and the second sidewall $119s_2$ of the first IMD structure 119 and a second sidewall $308s_2$ of the sidewalls 308s of the first passivation layer 308 at least partially define the second sidewall of the opening 128. In some embodiments, the first sidewall $119s_1$ of the first IMD structure 119 is aligned (e.g., flush) with the first sidewall $308s_1$ of the first passivation layer 308. In further embodiments, the second sidewall $119s_2$ of the first IMD structure 119 is aligned (e.g., flush) with the second sidewall $308s_2$ of the first passivation layer 308.

The plurality of conductive lines 124 are spaced from the opening 128. More specifically, the plurality of conductive lines 124 are spaced from the sidewalls of the opening 128 and a bottom surface of the opening 128. In further embodiments, the second group of conductive lines $124_{M-2}$, the third group of conductive lines $124_{M-1}$, and the fourth groups of conductive lines $124_M$ are laterally spaced from the sidewalls of the opening 128. In yet further embodiments, the first group of conductive lines $124_{M-3}$ is vertically spaced from the sidewalls of the opening 128.

In some embodiments, the plurality of conductive vias 126 are spaced from the opening 128. In further embodiments, the plurality of conductive contacts 122 are spaced from the opening 128. In yet further embodiments, the interconnect structure 120 is spaced from the opening 128 (e.g., the plurality of conductive lines 124, the plurality of conductive vias 126, and the plurality of conductive contacts 122 are spaced from the opening 128).

Also shown in the cross-sectional view 300 of FIG. 3, some of the plurality of conductive lines 124 and some of the plurality of conductive vias 126, which are disposed on a first side (e.g., right side) of the opening 128 and which are embedded in the first IMD structure 119, define a first collection 310 of conductive features of the interconnect structure 120. Further, some of the plurality of conductive lines 124 and some of the plurality of conductive vias 126, which are disposed on a second side (opposite the first side) (e.g., left side) and which are embedded in the first IMD structure 119, define a second collection 312 of conductive features of the interconnect structure 120. In some embodiments, the first collection 310 of conductive features is electrically coupled to the second collection 312 of conductive features via a third collection 314 of conductive features of the interconnect structure 120. The third collection 314 of conductive features comprises some of the plurality of conductive lines 124 of the first group of conductive lines $124_{M-3}$.

Figure 4:
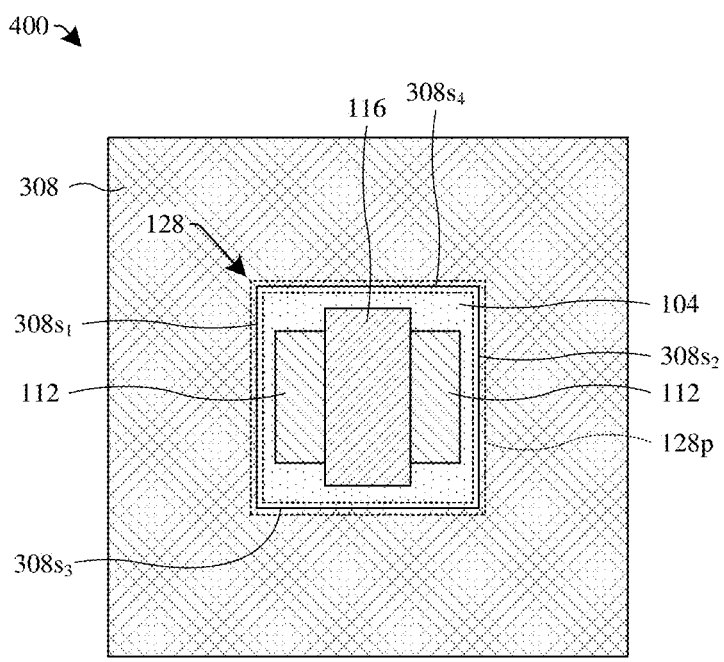
FIG. 4 illustrates a simplified top view of some embodiments of the IC of FIG. 3.

FIG. 4 illustrates a simplified top view 400 of some embodiments of the IC of FIG. 3. The simplified top view 400 of FIG. 4 is "simplified" because portions of the second IMD structure 302, portions of the third IMD structure 304, portions of the interconnect structure 120, and portions of the ILD structure 118 that the opening 128 overlies are omitted from the simplified top view 400 of FIG. 4.

As shown in the top view 400 of FIG. 4, the perimeter 128p of the opening 128 is defined by the sidewalls 308s of the first passivation layer 308. For example, the perimeter 128p of the opening 128 is defined by the first sidewall $308s_1$ of the first passivation layer 308, the second sidewall $308s_2$ of the first passivation layer 308, a third sidewall $308s_3$ of the first passivation layer 308, and a fourth sidewall $308s_4$ of the first passivation layer 308. While not shown in the top view 400 of FIG. 4, it will be appreciated that the perimeter 128p of the opening 128 is defined by both the sidewalls 308s of the first passivation layer 308 and the sidewalls 119s of the first IMD structure 119.

Figure 5:
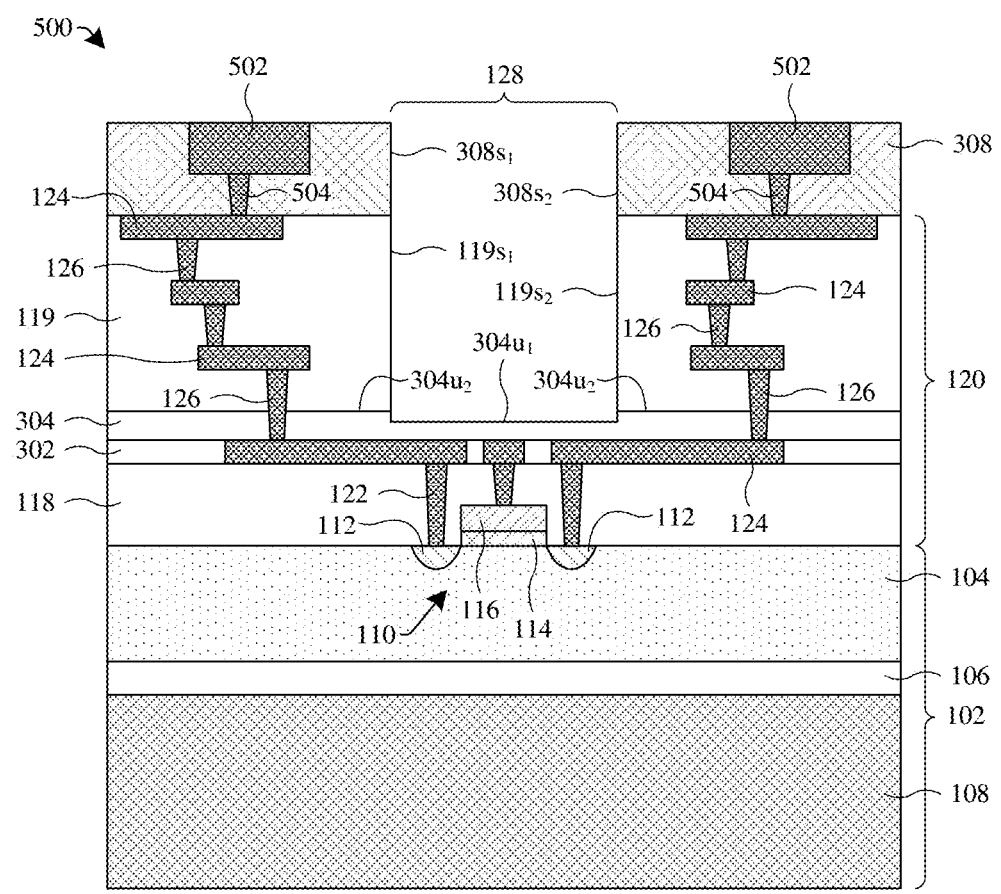
FIG. 5 illustrates a cross-sectional view of some other embodiments of the IC of FIG. 1.

FIG. 5 illustrates a cross-sectional view 500 of some other embodiments of the IC of FIG. 1.

As shown in the cross-sectional view 500 of FIG. 5, one or more input/output (I/O) structures 502 (e.g., bond pads, solder bumps, etc.) are disposed in the first passivation layer 308 and over the first IMD structure 119. In some embodiments, the one or more I/O structures 502 are disposed at least partially over the first passivation layer 308. One or more upper conductive vias 504 are disposed in the first passivation layer 308 and electrically couple the I/O structures 502 to the interconnect structure 120. The I/O structures 502 and the upper conductive vias 504 are or comprise, for example, copper (Cu), aluminum (Al), aluminum copper (AlCu), tungsten (W), gold (Au), silver (Ag), lead (Pb), tin (Sn), zinc (Zn), antimony (Sb), some other conductive material, or a combination of the foregoing.

Also shown in the cross-sectional view 500 of FIG. 5, a first upper surface $304u_1$ of the third IMD structure 304 defines the bottom surface of the opening 128 (e.g., the bottommost surface of the opening 128). The first upper surface $304u_1$ of the third IMD structure 304 is disposed vertically between a second upper surface $304u_2$ of the third IMD structure 304 and the substrate 102. In some embodiments, the first upper surface $304u_1$ of the third IMD structure 304 is disposed laterally between two portions of the second upper surface $304u_2$ of the third IMD structure 304. In further embodiments, the second upper surface $304u_2$ of the third IMD structure 304 may laterally surround the first upper surface $304u_1$ of the third IMD structure 304.

Figure 6:
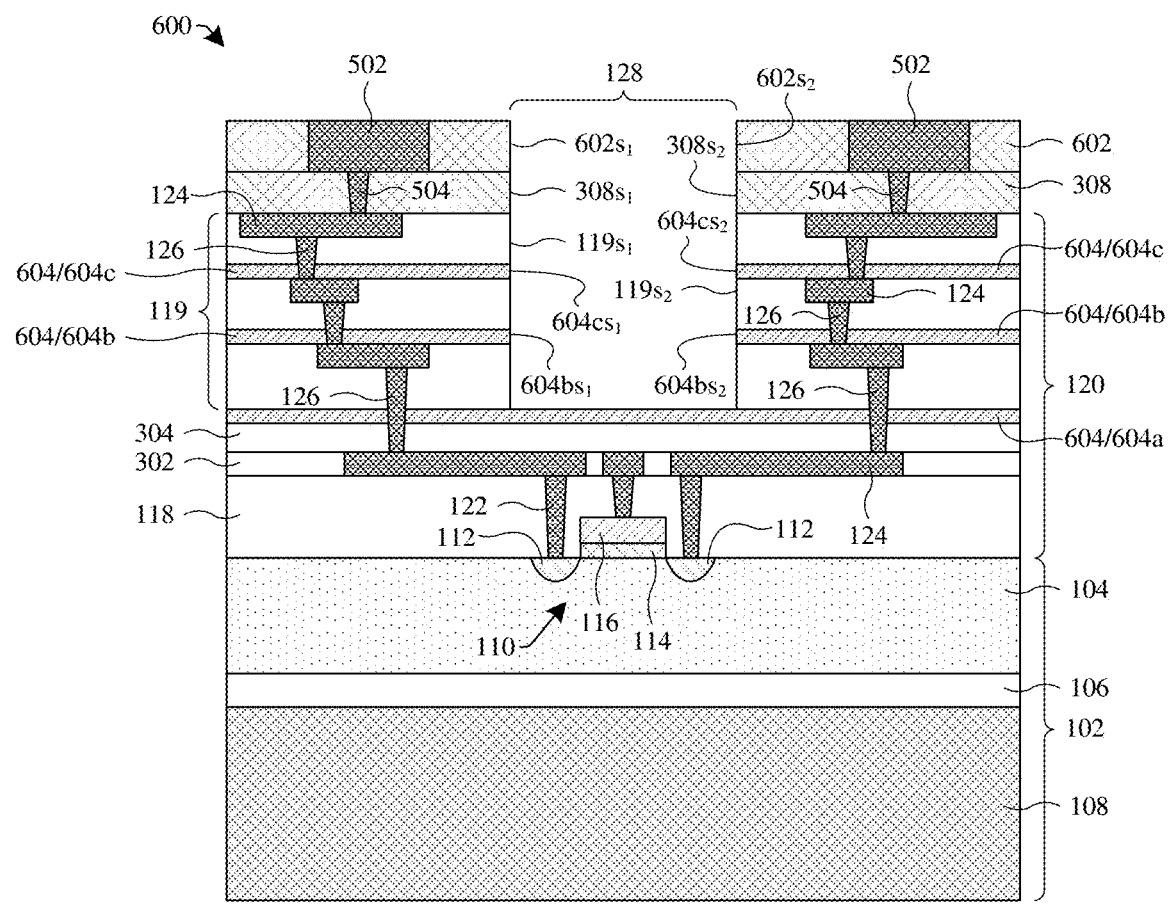
FIG. 6 illustrates a cross-sectional view of some other embodiments of the IC of FIG. 5.

FIG. 6 illustrates a cross-sectional view 600 of some other embodiments of the IC of FIG. 5.

As shown in the cross-sectional view 600 of FIG. 6, a second passivation layer 602 is disposed over the first passivation layer 308. In some embodiments, the second passivation layer 602 is disposed over the upper conductive vias 504. In further embodiments, the I/O structures 502 are disposed at least partially in the second passivation layer 602. The second passivation layer 602 may be or comprise, for example, an oxide (e.g., $SiO_2$), a nitride (e.g., SiN), an oxy-nitride (e.g., $SiO_xN_y$), some other passivation material, or a combination of the foregoing. In some embodiments, the second passivation layer 602 is a different material than the first IMD structure 119 and/or the first passivation layer 308. In further embodiments, the second passivation layer 602 has a planar upper surface.

The sidewalls 119s of the first IMD structure 119, the sidewalls 308s of the first passivation layer 308, and sidewalls 602s of the second passivation layer 602 at least partially define the sidewalls of the opening 128. For example, the first sidewall $119s_1$ of the first IMD structure 119, the first sidewall $308s_1$ of the first passivation layer 308, and a first sidewall $602s_1$ of the sidewalls 602s of the second passivation layer 602 at least partially define the first sidewall of the opening 128, and the second sidewall $119s_2$ of the first IMD structure 119, the second sidewall $308s_2$ of the first passivation layer 308, and a second sidewall $602s_2$ of the sidewalls 602s of the second passivation layer 602 at least partially define the second sidewall of the opening 128.

Also shown in the cross-sectional view 600 of FIG. 6, one or more etch stop layers 604 are disposed over the substrate 102. For example, a first etch stop layer 604a, a second etch stop layer 604b, and a third etch stop layer 604c are disposed over the substrate 102. The interconnect structure 120 is partially disposed in the etch stop layers 604 (e.g., the plurality of conductive vias 126 extend vertically through the etch stop layers 604). The etch stop layers 604 are disposed between (and/or in) the first IMD structure 119, the second IMD structure 302, and the third IMD structure 304. For example, the first etch stop layer 604a is disposed between the third IMD structure 304 and the first IMD structure 119, and the second etch stop layer 604b and the third etch stop layer 604c are disposed in the first IMD structure 119. The etch stop layers 604 may be or comprise, for example, an oxide (e.g., $SiO_2$), a nitride (e.g., SiN), an oxy-nitride (e.g., $SiO_XN_Y$), a carbide (e.g., silicon carbide (SiC)), some other dielectric material, or a combination of the foregoing.

Sidewalls of the etch stop layers 604 may at least partially define the sidewalls of the opening 128. For example, sidewalls 604bs of the second etch stop layer 604b and sidewalls 604cs of the third etch stop layer 604c partially define the sidewalls of the opening 128. More specifically, both a first sidewall $604bs_1$ of the sidewalls 604bs of the second etch stop layer 604b and a first sidewall $604cs_1$ of the sidewalls 604cs of the third etch stop layer 604c partially define the first sidewall of the opening 128, and both a second sidewall $604bs_2$ of the sidewalls 604bs of the second etch stop layer 604b and a second sidewall $604cs_2$ of the sidewalls 604cs of the third etch stop layer 604c partially define the second sidewall of the opening 128. In some embodiments, an upper surface of one of the etch stop layers 604 defines the bottom surface of the opening 128. For example, an upper surface of the first etch stop layer 604a defines the bottom surface of the opening 128.

While FIG. 6 only illustrates three etch stop layers 604, it will be appreciated that the IC may comprise any number of etch stop layers that are disposed over the substrate 102. It will also be appreciated that, while FIG. 6 only illustrates two passivation layers (e.g., the first passivation layer 308 and the second passivation layer 602), any number of passivation layers may be disposed over the substrate 102. It will also be appreciated that the any number of etch stop layers and the any number of passivation layers may be disposed over, in, and/or between the first IMD structure 119, the second IMD structure 302, and/or the third IMD structure 304.

Figure 7:
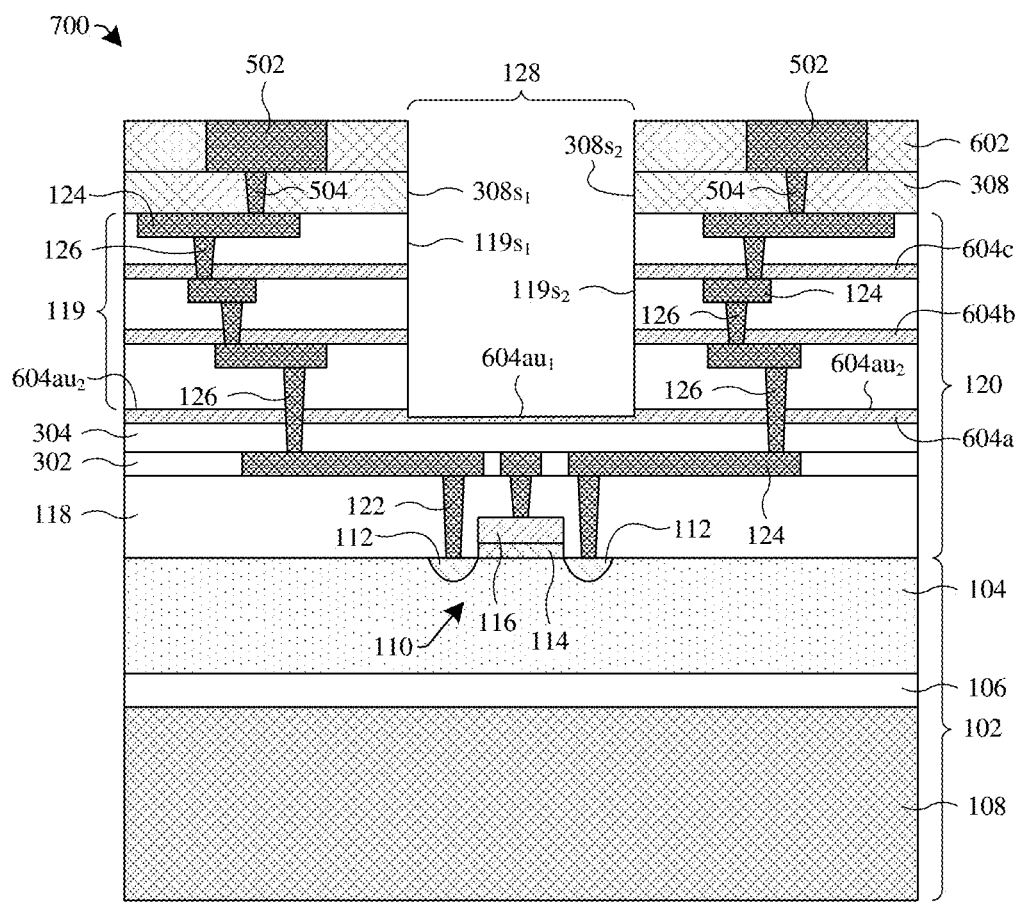
FIG. 7 illustrates a cross-sectional view of some other embodiments of the IC of FIG. 6.

FIG. 7 illustrates a cross-sectional view 700 of some other embodiments of the IC of FIG. 6.

As shown in the cross-sectional view 700 of FIG. 7, an upper surface of one of the etch stop layers 604 may define the bottom surface of the opening 128. For example, a first upper surface $604au_1$ of the first etch stop layer 604a defines the bottom surface of the opening 128. The first upper surface $604au_1$ of the first etch stop layer 604a is disposed vertically between a second upper surface $604au_2$ of the first etch stop layer 604a and the substrate 102. In some embodiments, the first upper surface $604au_1$ of the first etch stop layer 604a is disposed laterally between two portions of the second upper surface $604au_2$ of the first etch stop layer 604a. In further embodiments, the second upper surface $604au_2$ of the first etch stop layer 604a may laterally surround the first upper surface $604au_1$ of the first etch stop layer 604a.

Figure 8:
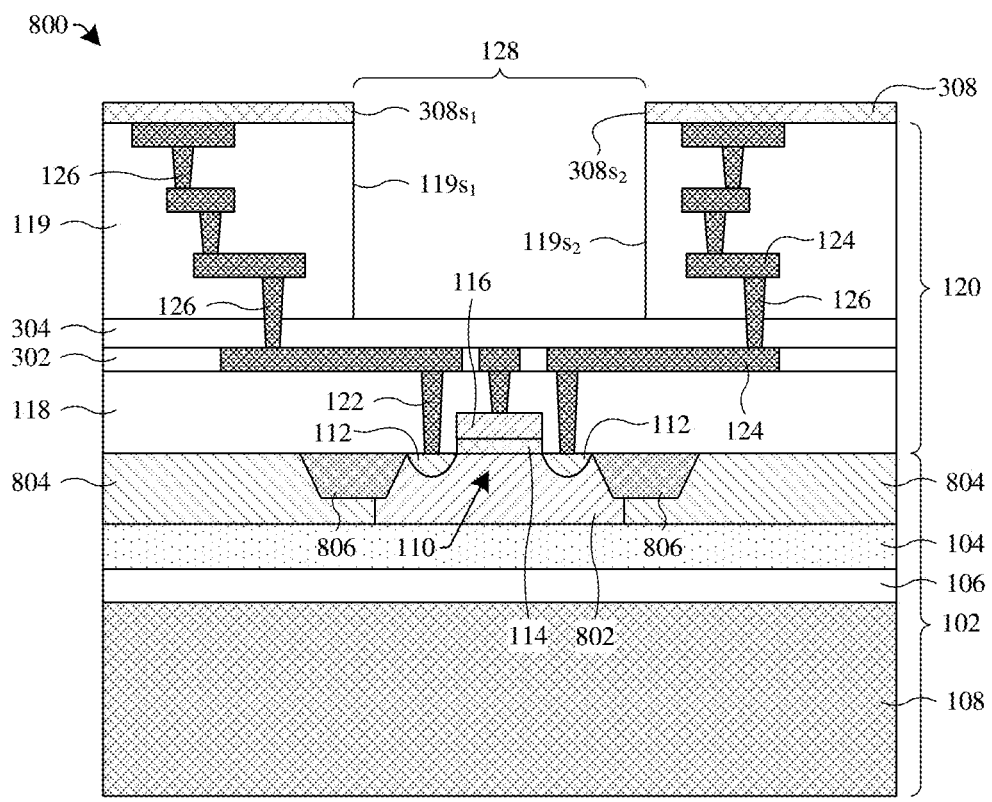
FIG. 8 illustrates a cross-sectional view of some other embodiments of the IC of FIG. 3.

FIG. 8 illustrates a cross-sectional view 800 of some other embodiments of the IC of FIG. 3.

As shown in the cross-sectional view 800 of FIG. 8, a first well region 802 is disposed in the substrate 102. In some embodiments, the first well region 802 is disposed in the device layer 104. The first well region 802 is a region of the device layer 104 having a second doping type (e.g., p-type) opposite the first doping type (e.g., n-type). The pair of source/drain regions 112 are disposed in the first well region 802.

A second well region 804 is disposed in the substrate 102. In some embodiments, the second well region 804 is disposed in the device layer 104. The second well region 804 is a region of the device layer 104 having the first doping type. The first well region 802 is disposed at least partially in the second well region 804.

A first isolation structure 806 is disposed in the substrate 102. In some embodiments, the first isolation structure 806 is disposed in the device layer 104. The first isolation structure 806 is configured to electrically isolate the first semiconductor device 110 from other devices (not shown) of the IC. The first isolation structure 806 may have angled sidewalls. In other embodiments, the sidewalls of the first isolation structure 806 may be substantially straight (e.g., vertical). In some embodiments, the first isolation structure 806 laterally surrounds the first semiconductor device 110. In some embodiments, the first isolation structure 806 may be or comprise, for example, an oxide (e.g., SiO2), a nitride (e.g., SiN), an oxy-nitride (e.g., SiON), a carbide (e.g., SiC), some other dielectric material, or a combination of the foregoing. In some embodiments, the first isolation structure 806 is referred to as a shallow trench isolation (STI) structure.

Figure 9:
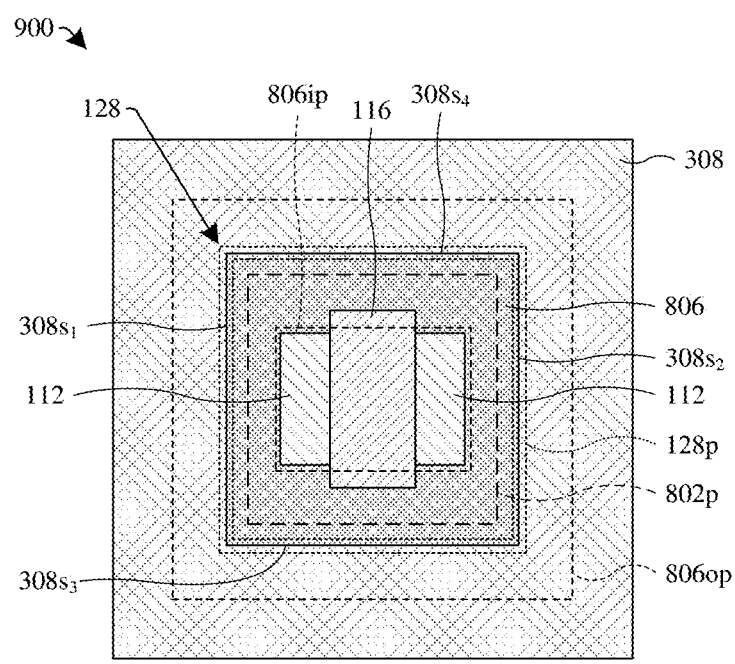
FIG. 9 illustrates a simplified top view of some embodiments of the IC of FIG. 8.

FIG. 9 illustrates a simplified top view 900 of some embodiments of the IC of FIG. 8. The simplified top view 900 of FIG. 9 is "simplified" because portions of the second IMD structure 302, portions of the third IMD structure 304, portions of the interconnect structure 120, and portions of the ILD structure 118 that the opening 128 overlies are omitted from the simplified top view 900 of FIG. 9.

As shown in the top view 900 of FIG. 9, the first well region 802 has a perimeter 802p (e.g., outer perimeter). The perimeter 802p of the first well region 802 is illustrated in phantom (via a dotted line) in the top view 900 of FIG. 9. In some embodiments, the perimeter 128p of the opening 128 laterally surrounds the perimeter 802p of the first well region 802. It will be appreciated that the second well region 804 has an inner perimeter that corresponds to the perimeter 802p of the first well region 802. Thus, it will also be appreciated that, in some embodiments, the perimeter 128p of the opening 128 laterally surrounds the inner perimeter of the second well region 804. Although not shown in the top view 900 of FIG. 9, it will be appreciated that the perimeter 128p of the opening 128 may be disposed laterally between the inner perimeter of the second well region 804 and an outer perimeter of the second well region 804.

Also shown in the top view 900 of FIG. 9, the first isolation structure 806 has an inner perimeter 806ip and an outer perimeter 806op. The inner perimeter 806ip of the first isolation structure 806 and the outer perimeter 806op of the first isolation structure 806 are illustrated in phantom (via dotted lines) in the top view 900 of FIG. 9. In some embodiments, the perimeter 128p of the opening 128 laterally surrounds the inner perimeter 806ip of the first isolation structure 806. In further embodiments, the perimeter 128p of the opening 128 is disposed laterally between the inner perimeter 806ip of the first isolation structure 806 and the outer perimeter 806op of the first isolation structure 806. In other embodiments, the perimeter 128p of the opening 128 laterally surrounds both the inner perimeter 806ip of the first isolation structure 806 and the outer perimeter 806op of the first isolation structure 806.

Figure 10:
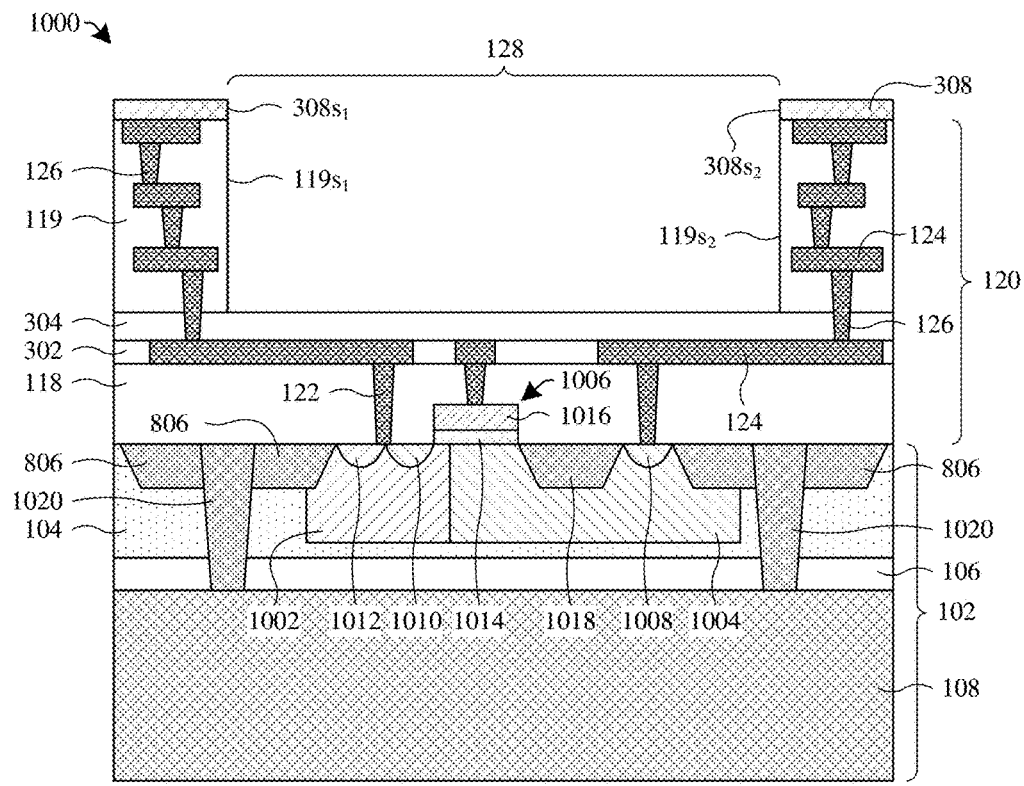
FIG. 10 illustrates a cross-sectional view of some other embodiments of the IC of FIG. 8.

FIG. 10 illustrates a cross-sectional view 1000 of some other embodiments of the IC of FIG. 8.

As shown in the cross-sectional view 1000 of FIG. 10, a third well region 1002 is disposed in the device layer 104. The third well region 1002 is a region of the device layer 104 having the second doping type (e.g., p-type). A fourth well region 1004 is also disposed in the device layer 104. The fourth well region 1004 is a region of the device layer 104 having the first doping type (e.g., n-type).

A second semiconductor device 1006 (e.g., double-diffused MOSFET (DMOS)) is disposed on/over the device layer 104. The second semiconductor device 1006 has a drain region 1008. The drain region 1008 is a region of the device layer 104 having the first doping type. The drain region 1008 is disposed in the fourth well region 1004. A first one of the plurality of conductive contacts 122 is electrically coupled to the drain region 1008. The second semiconductor device 1006 also comprises a source region 1010, a body contact region 1012, a gate dielectric 1014, and a gate electrode 1016. The source region 1010 is a region of the device layer 104 having the first doping type. The source region 1010 is disposed in the third well region 1002. The body contact region 1012 is a region of the device layer 104 having the second doping type. The body contact region 1012 is disposed in the third well region 1002. A second one of the plurality of conductive contacts 122 is electrically coupled to both the source region 1010 and the body contact region 1012. The gate dielectric 1014 is disposed over the device layer 104 and laterally between the source region 1010 and the drain region 1008. The gate electrode 1016 overlies the gate dielectric 1014. A third one of the plurality of conductive contacts 122 is electrically coupled to the gate electrode 1016.

In some embodiments, a second isolation structure 1018 is disposed in the device layer 104. The second isolation structure 1018 is disposed laterally between the drain region 1008 and gate electrode 1016. In some embodiments, the gate dielectric 1014 (and the gate electrode 1016) may partially overlie the second isolation structure 1018. The second isolation structure 1018 may have angled sidewalls. In other embodiments, the sidewalls of the second isolation structure 1018 may be substantially straight (e.g., vertical). In some embodiments, the second isolation structure 1018 may be or comprise, for example, an oxide (e.g., SiO2), a nitride (e.g., SiN), an oxy-nitride (e.g., SiON), a carbide (e.g., SiC), some other dielectric material, or a combination of the foregoing. In further embodiments, the second isolation structure 1018 may be referred to as a STI structure. In yet further embodiments, the second isolation structure 1018 is a portion of the first isolation structure 806.

A third isolation structure 1020 is disposed in the substrate 102. In some embodiments, the third isolation structure 1020 is disposed in the device layer 104. The third isolation structure 1020 extends vertically through the device layer 104 to the insulating layer 106. In some embodiments, the third isolation structure 1020 extends vertically through the device layer 104 and the insulating layer 106 to the handle layer 108. In yet further embodiments, the third isolation structure 1020 extends vertically through the first isolation structure 806.

The third isolation structure 1020 may have angled sidewalls. In other embodiments, the sidewalls of the third isolation structure 1020 may be substantially straight (e.g., vertical). In some embodiments, the third isolation structure 1020 laterally surrounds the second semiconductor device 1006. In some embodiments, the third isolation structure 1020 may be or comprise, for example, an oxide (e.g., SiO2), a nitride (e.g., SiN), an oxy-nitride (e.g., SiON), a carbide (e.g., SiC), some other dielectric material, or a combination of the foregoing. In some embodiments, the third isolation structure 1020 is referred to as a deep trench isolation (DTI) structure.

Figure 11:
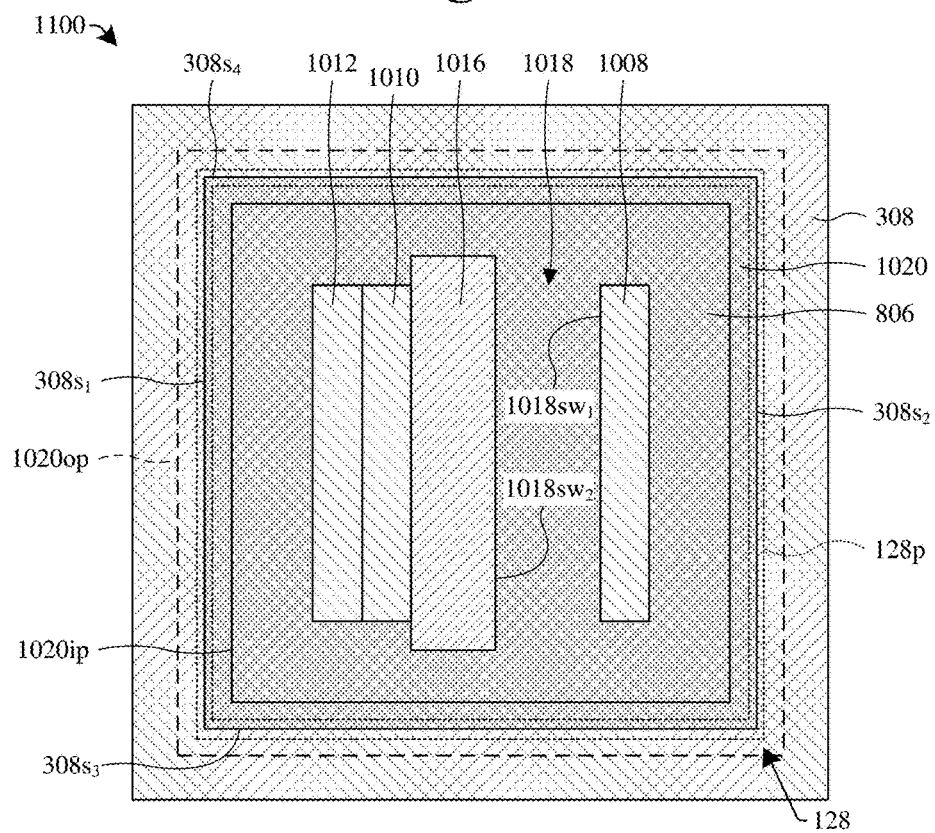
FIG. 11 illustrates a simplified top view of some embodiments of the IC of FIG. 10.

FIG. 11 illustrates a simplified top view 1100 of some embodiments of the IC of FIG. 10. The simplified top view 1100 of FIG. 11 is "simplified" because portions of the second IMD structure 302, portions of the third IMD structure 304, portions of the interconnect structure 120, and portions of the ILD structure 118 that the opening 128 overlies are omitted from the simplified top view 1100 of FIG. 11.

As shown in the top view 1100 of FIG. 11, the perimeter 128$p$ of the opening 128 overlies and is aligned (e.g., center aligned and middle aligned) with a layout of the third isolation structure 1020. Further, the third isolation structure 1020 has an inner perimeter 1020$ip$ and an outer perimeter 1020$op$. The outer perimeter 1020$op$ of the third isolation structure 1020 is illustrated in phantom (via a dotted line) in the top view 1100 of FIG. 11.

In some embodiments, the perimeter 128$p$ of the opening 128 laterally surrounds the inner perimeter 1020$ip$ of the third isolation structure 1020. In further embodiments, the perimeter 128$p$ of the opening 128 is disposed laterally between the inner perimeter 1020$ip$ of the third isolation structure 1020 and the outer perimeter 1020$op$ of the third isolation structure 1020. In other embodiments, the perimeter 128$p$ of the opening 128 laterally surrounds both the inner perimeter 1020$ip$ of the third isolation structure 1020 and the outer perimeter 1020$op$ of the third isolation structure 1020.

Also shown in the top view 1100 of FIG. 11, the second isolation structure 1018 is a portion of the first isolation structure 806. Further, the second isolation structure 1018 has a first sidewall 1018$sw_1$ and a second sidewall 1018$sw_2$ opposite the first sidewall 1018$sw_1$. The perimeter 128$p$ of the opening 128 may laterally surround both the first sidewall 1018$sw_1$ of the second isolation structure 1018 and the second sidewall 1018$sw_2$ of the second isolation structure 1018.

Figure 12:
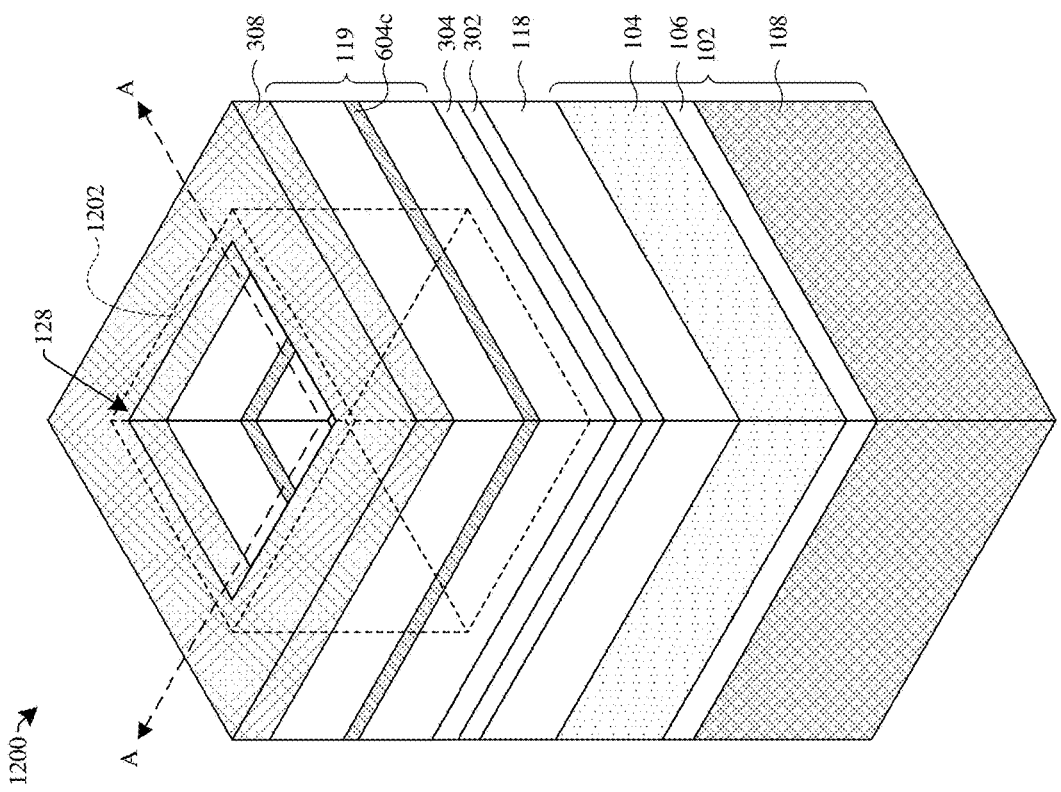
FIG. 12 illustrates a perspective view of some embodiments of the IC of FIG. 6.

FIG. 12 illustrates a perspective view 1200 of some embodiments of the IC of FIG. 6.

As shown in the perspective view 1200 of FIG. 12, the opening 128 is disposed within a zone 1202 of the IC. More specifically, the sidewalls and bottom surface of the opening 128 are disposed within the zone 1202. The zone 1202 is disposed within one or more of the first IMD structure 119, the second IMD structure 302, and the third IMD structure 304. In some embodiments, the zone 1202 is disposed within the first passivation layer 308 (and the second passivation layer 602) and in one or more of the one or more etch stop layers 604. For example, as shown in the perspective view 1200 of FIG. 12, the zone 1202 is disposed within the first IMD structure 119, the third IMD structure 304, the first passivation layer 308, and the third etch stop layer 604$c$. The zone 1202 has a length, width, and height. The length of the zone 1202 is greater than a length of the opening 128. The width of the zone 1202 is greater than a width of the opening 128. The height of the zone 1202 is greater than a height of the opening 128.

Figure 13:
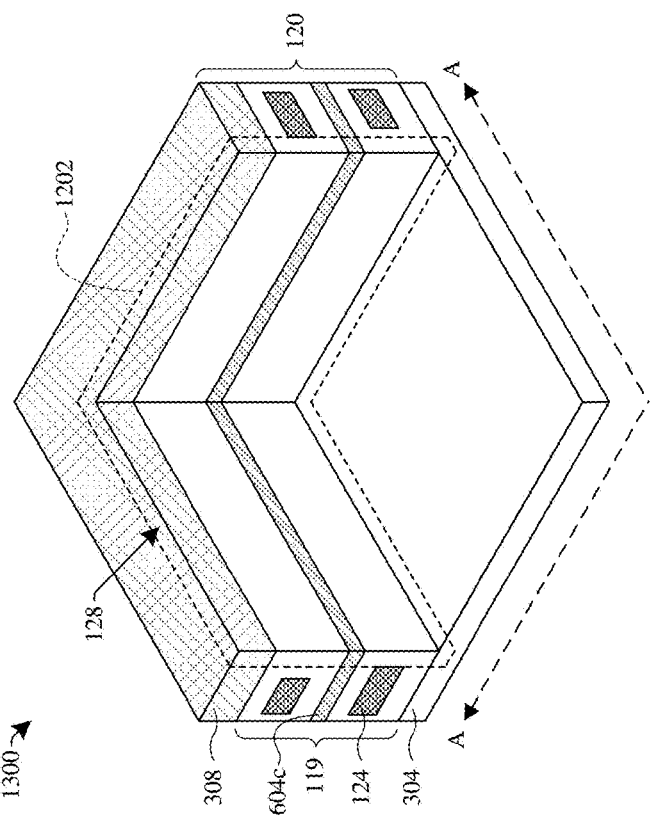
FIG. 13 illustrates a cross-sectional view of some embodiments of the IC of FIG. 12.

FIG. 13 illustrates a cross-sectional view 1300 of some embodiments of the IC of FIG. 12. The cross-sectional view 1300 of FIG. 13 is taken along line A-A of FIG. 12. The cross-sectional view 1300 of FIG. 13 only illustrates features of the IC of FIG. 12 that are disposed over the second IMD structure 302.

As shown in the cross-sectional view 1300 of FIG. 13, the zone 1202 is at least partially defined by an area of the IC in which no conductive features of the interconnect structure 120 are disposed. For example, as shown in the cross-sectional view 1300 of FIG. 13, none of the conductive features (e.g., the plurality of conductive lines 124 and the plurality of conductive vias 126) of the interconnect structure 120 are disposed in the zone 1202. In some embodiments, sides of the zone 1202 are defined by sides of conductive features (e.g., one or more of the plurality of conductive lines 124 and/or one or more of the plurality of conductive vias 126). For example, a first side of the zone 1202 is defined by a sidewall of a first conductive line (and/or a first conductive via) and a second side of the zone 1202 (opposite the first side of the zone 1202) is defined by a sidewall of a second conductive line (and/or a second conductive via). Further, a bottom side of the zone 1202 may be defined by an upper surface of a third conductive line (and/or a third conductive via). Because no conductive features of the interconnect structure 120 are disposed in the zone 1202, and because the opening 128 is disposed within the zone 1202, the opening 128 may not negatively affect the IC (e.g., may not decrease the structural integrity of the interconnect structure 120).

Figure 14:
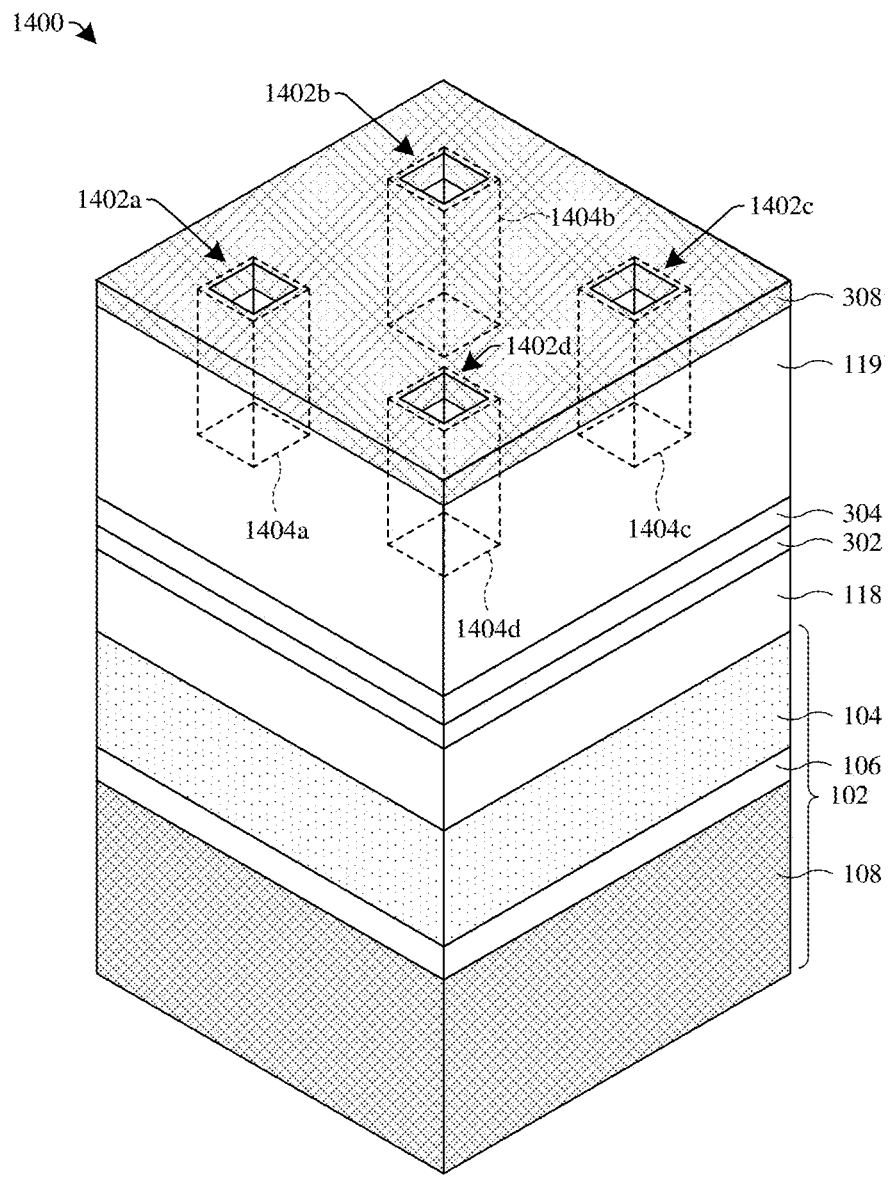
FIG. 14 illustrates a perspective view of some other embodiments of the IC of FIG. 12.

FIG. 14 illustrates a perspective view 1400 of some other embodiments of the IC of FIG. 12.

As shown in the perspective view 1400 of FIG. 14, a plurality of openings 1402a-d are disposed in the first IMD structure 119 and the first passivation layer 308. For example, the plurality of openings 1402a-d comprises a first opening 1402a, a second opening 1402b, a third opening 1402c, and a fourth opening 1402d. In some embodiments, the plurality of openings 1402a-d have substantially similar footprints (e.g., a width, length, and shape of a perimeter of an upper edge of the openings are substantially the same). In further embodiments, the footprints of the plurality of openings 1402a-d may have a square shape, as shown in the perspective view 1400 of FIG. 14. In other embodiments, the footprints of the plurality of openings 1402a-d may have some other geometrical shape (e.g., rectangular, circular, oval, obround, triangular, etc.). In yet further embodiments, the plurality of openings 1402a-d have substantially similar heights (e.g., depths).

The plurality of openings 1402a-d are laterally spaced from one another. The plurality of openings 1402a-d have substantially similar features (e.g., structural features) as the opening 128. Because the IC comprises the plurality of openings 1402a-d, thermal energy generated by the semiconductor devices of the IC may be more efficiently dissipated away (e.g., due to a larger overall area of openings in the first IMD structure 119).

The plurality of openings 1402a-d are disposed within a plurality of zones 1404a-d of the IC, respectively. For example, the first opening 1402a is disposed in a first zone 1404a, the second opening 1402b is disposed in a second zone 1404b, the third opening 1402c is disposed in a third zone 1404c, and the fourth opening 1402d is disposed in a fourth zone 1404d. The plurality of zones 1404a-d have substantially similar features (e.g., structural features) as the zone 1202.

Figure 15:
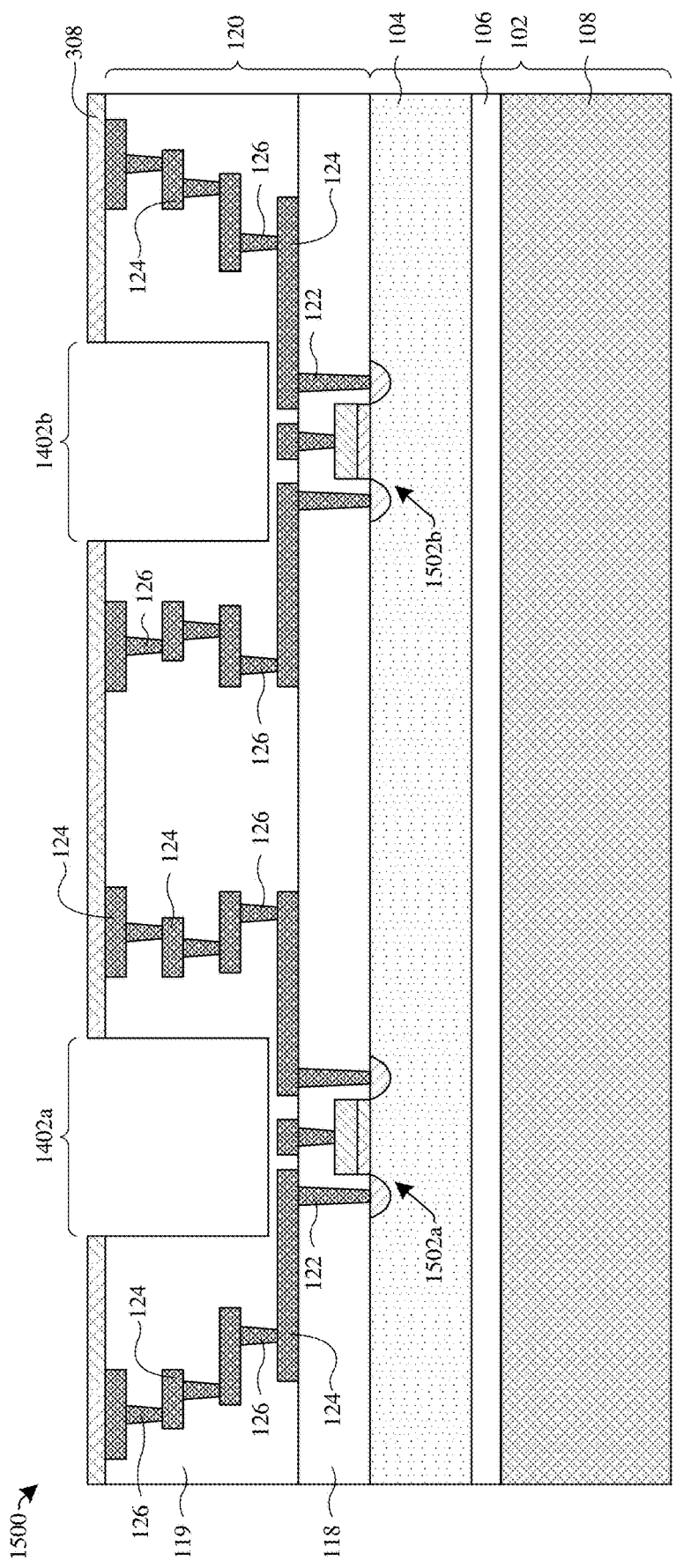
FIG. 15 illustrates a cross-sectional view of some embodiments of the IC of FIG. 14.

FIG. 15 illustrates a cross-sectional view 1500 of some embodiments of the IC of FIG. 14.

As shown in the cross-sectional view 1500 of FIG. 15, a plurality of semiconductor devices 1502a-b (e.g., IGFETs) are disposed on/over the device layer 104. For example, a third semiconductor device 1502a is disposed on/over the device layer 104, and a fourth semiconductor device 1502b is disposed on/over the device layer 104. The plurality of semiconductor devices 1502a-b may have substantially similar features as the first semiconductor device 110 and/or the second semiconductor device 1006.

The first opening 1402a at least partially overlies the third semiconductor device 1502a. The second opening at least partially overlies the fourth semiconductor device 1502b. Because the first opening 1402a at least partially overlies the third semiconductor device 1502a, and because the second opening at least partially overlies the fourth semiconductor device 1502b, thermal energy generated by the plurality of semiconductor devices 1502a-b may be more efficiently dissipated away (e.g., due to the openings being disposed nearer the semiconductor devices).

Figure 16:
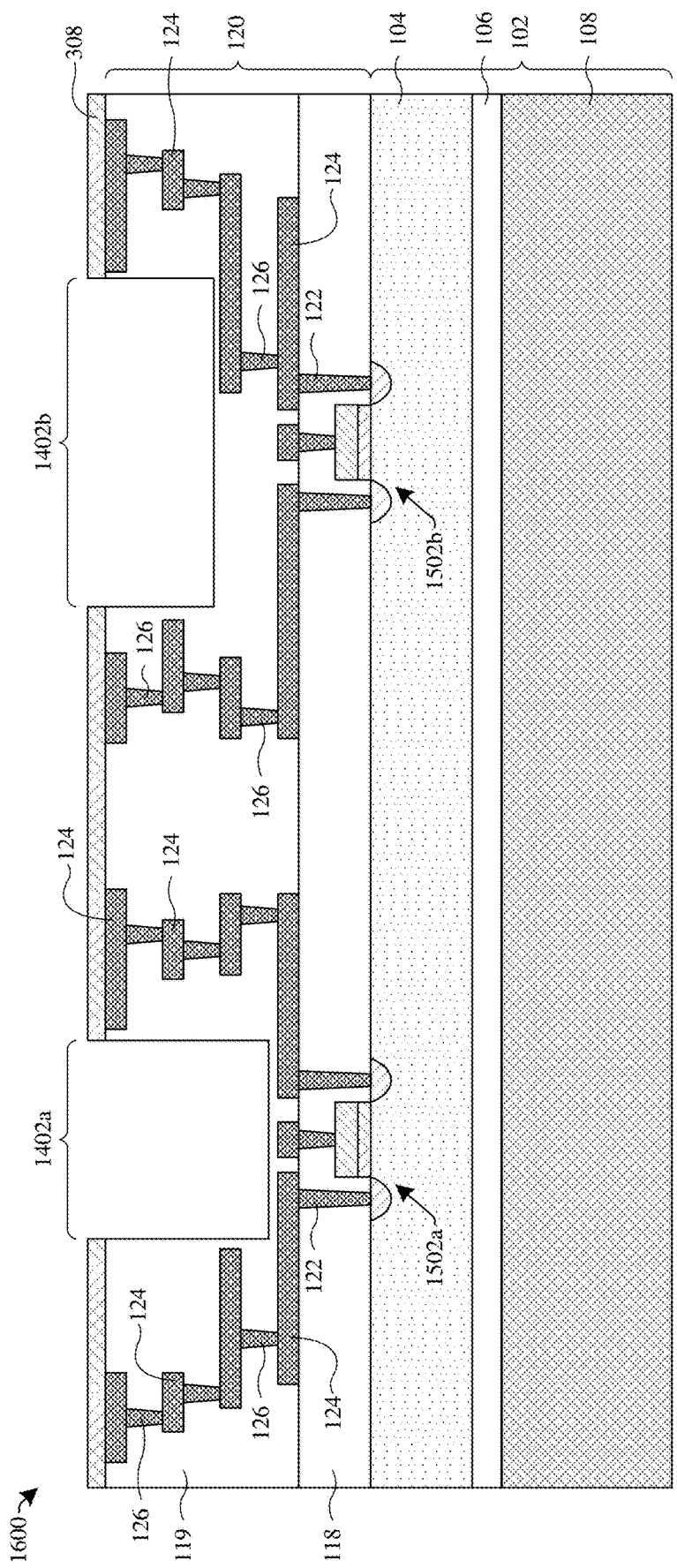
FIG. 16 illustrates a cross-sectional view of some other embodiments of the IC of FIG. 15.

FIG. 16 illustrates a cross-sectional view 1600 of some other embodiments of the IC of FIG. 15.

As shown in the cross-sectional view 1600 of FIG. 16, the first opening 1402a has a different footprint than the second opening 1402b. For example, the first opening 1402a has a first width and the second opening 1402b has a second width that is greater than the first width. Therefore, the first opening 1402a has a different footprint than the second opening 1402b. It will be appreciated that, in some embodiments, the first opening 1402a and the second opening 1402b may have a same width but still have different footprints. For example, the first width and the second width may be substantially the same, but the first opening 1402a may have a different length (and/or general shape) than the second opening 1402b.

Also shown in the cross-sectional view 1600 of FIG. 16, the first opening 1402a has a different height than the second opening 1402b. For example, the first opening 1402a has a first height (e.g., depth) and the second opening has a second height (e.g., depth) that is less than the first height. Although not shown in the cross-sectional view 1600 of FIG. 16, it will be appreciated that, in some embodiments, a bottom surface of the first opening 1402a may be defined by a first etch stop layer (e.g., second etch stop layer 604b), and a bottom surface of the second opening 1402b may be defined by a second etch stop layer (e.g., third etch stop layer 604c) that is vertically spaced from the first etch stop layer. Because the first opening 1402a may have a different footprint and/or height than the second opening 1402b, thermal energy generated by the plurality of semiconductor devices 1502a-b may be more efficiently dissipated away (e.g., the footprints and heights of the openings 1402a-d are based on the sizes of their corresponding zones 1404a-d, which may be different due to the layout of the interconnect structure 120, and not so that each of the openings 1402a-d could fit into the smallest one of the zones 1404a-d).

Figure 17:
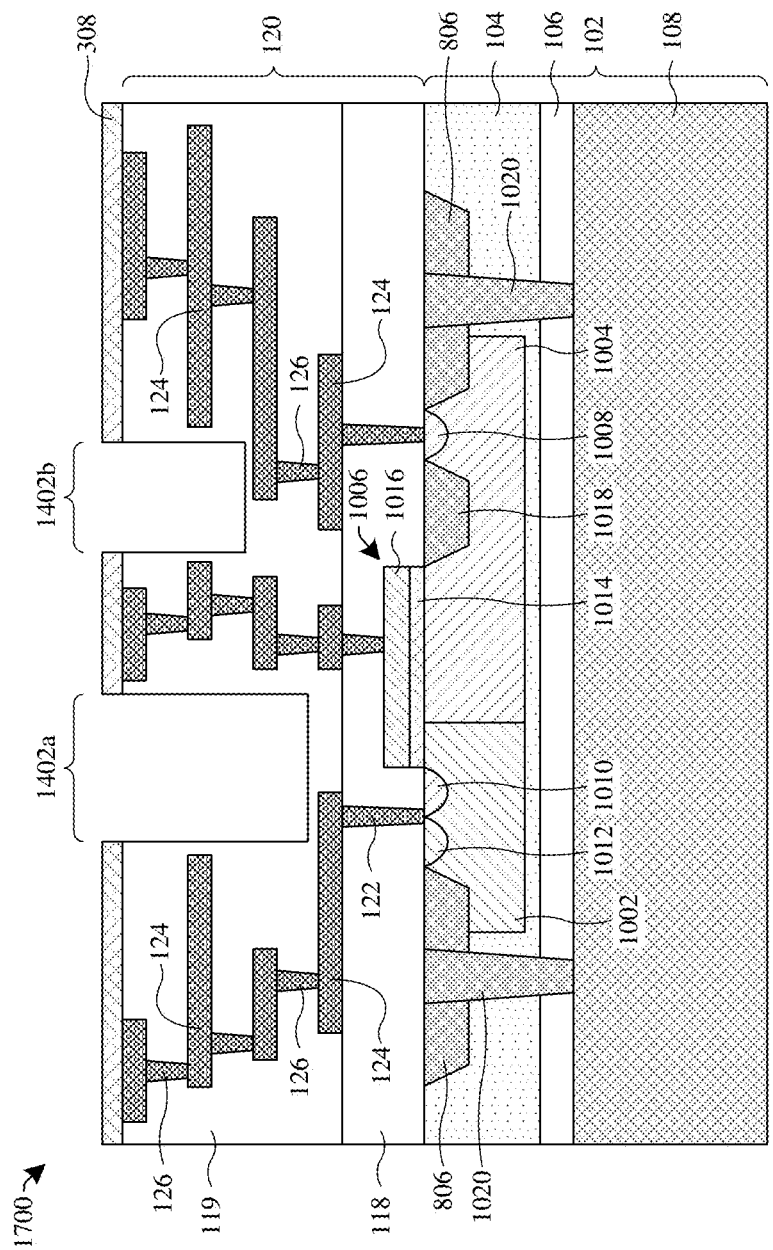
FIG. 17 illustrates a cross-sectional view of some other embodiments of the IC of FIG. 10.

FIG. 17 illustrates a cross-sectional view 1700 of some other embodiments of the IC of FIG. 10.

As shown in the cross-sectional view 1700 of FIG. 17, in some embodiments, both the first opening 1402a and the second opening 1402b at least partially overlie the second semiconductor device 1006. Because both the first opening 1402a and the second opening 1402b at least partially overlie the second semiconductor device 1006, thermal energy generated by the second semiconductor device 1006 may be more efficiently dissipated away. For example, the IC may not have one large zone (see, e.g., zone 1202) that overlies the second semiconductor device 1006, but multiple smaller zones (that are laterally spaced form one another) may be disposed over the second semiconductor device 1006 (e.g., due to the layout of the interconnect structure 120 being such that it prevents the large zone, but allows for multiple smaller zones). Thus, by having both the first opening 1402a and the second opening 1402b at least partially overlie the second semiconductor device 1006, the thermal energy generated by the second semiconductor device 1006 may be more efficiently dissipated away in comparison to having only one small opening (or not having any large openings).

FIGS. 18-23 illustrate a series of cross-sectional views 1800-2300 of some embodiments of a method for forming an integrated chip (IC) comprising a plurality of openings disposed in a first intermetal dielectric (IMD) structure 119. Although FIGS. 18-23 are described with reference to a method, it will be appreciated that the structures shown in FIGS. 18-23 are not limited to the method but rather may stand alone separate of the method.

Figure 18:
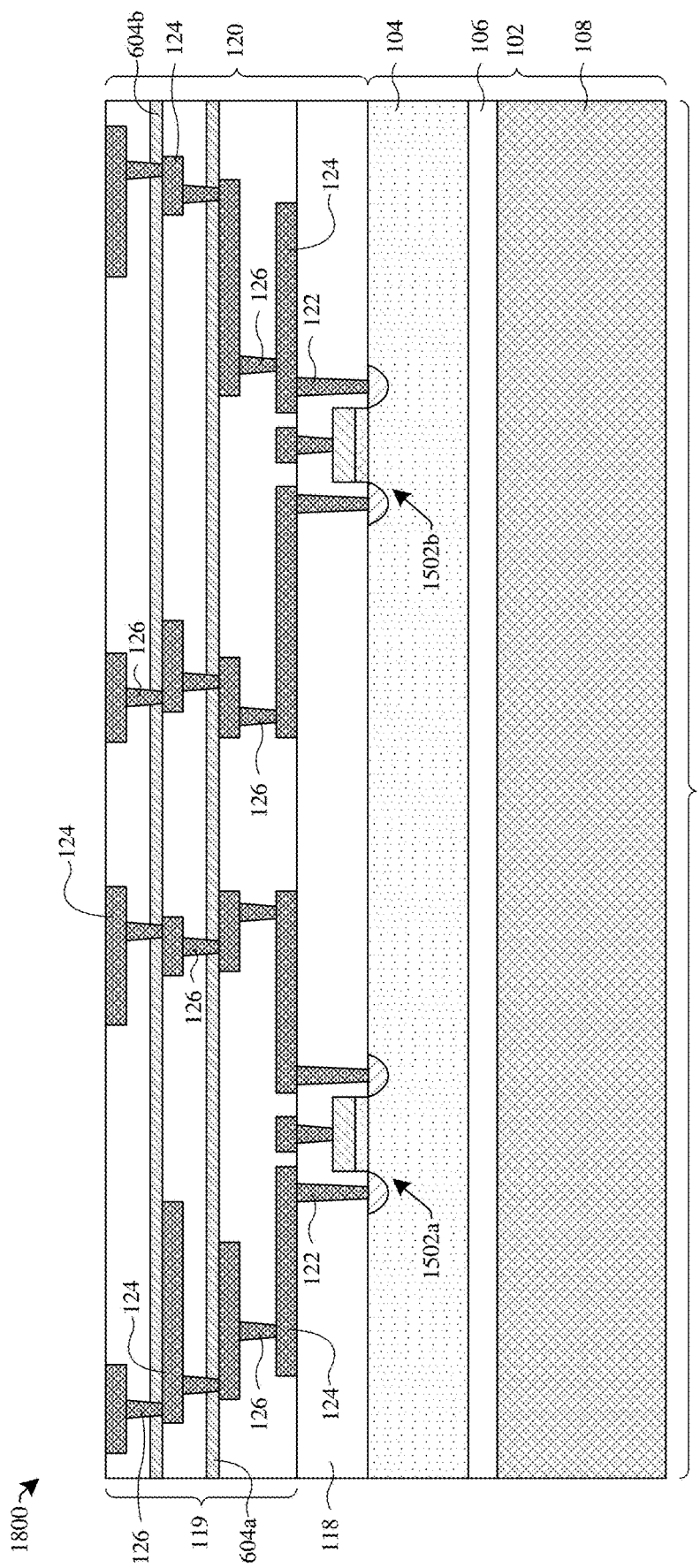
FIGS. 18-23 illustrate a series of cross-sectional views of some embodiments of a method for forming an integrated chip (IC) comprising a plurality of openings disposed in a first intermetal dielectric (IMD) structure.

As shown in the cross-sectional view 1800 of FIG. 18, a workpiece 1802 is received. The workpiece 1802 comprises a substrate 102. In some embodiments, the substrate 102 is a semiconductor-on-insulator (SOI) substrate (e.g., silicon-on-insulator). In such embodiments, the substrate 102 comprises a device layer 104, an insulating layer 106, and a handle layer 108.

A plurality of semiconductor devices 1502a-b are formed on/over the device layer 104. For example, a third semiconductor device 1502a and a fourth semiconductor device 1502b are formed on/over the device layer 104. In some embodiments, the plurality of semiconductor devices 1502a-b each comprise a pair of source/drain regions, a gate dielectric, and a gate electrode. An interlayer dielectric (ILD) structure 118 is formed over both the plurality of semiconductor devices 1502a-b and the device layer 104.

A first intermetal dielectric (IMD) structure 119 is formed over the ILD structure 118 and the plurality of semiconductor devices 1502a-b. One or more etch stop layers 604 are formed over the substrate 102 and in the first IMD structure 119. For example, a first etch stop layer 604a and a second etch stop layer 604b are disposed over the substrate 102 and in the first IMD structure 119. An interconnect structure 120 is formed over the substrate 102 and in the ILD structure 118, in the first IMD structure 119, and in the one or more etch stop layers 604. The interconnect structure 120 comprises a plurality of conductive contacts 122 (e.g., metal contacts), a plurality of conductive lines 124 (e.g., metal wires), and a plurality of conductive vias 126 (e.g., metal vias). In some embodiments, the plurality of conductive contacts 122, the plurality of conductive lines 124, and the plurality of conductive vias 126 are referred to as conductive features (of the interconnect structure 120). The plurality of semiconductor devices 1502a-b, the ILD structure 118, the first IMD structure 119, the one or more etch stop layers 604, and the interconnect structure 120 may be formed by known complementary metal-oxide-semiconductor (CMOS) processes.

Figure 19:
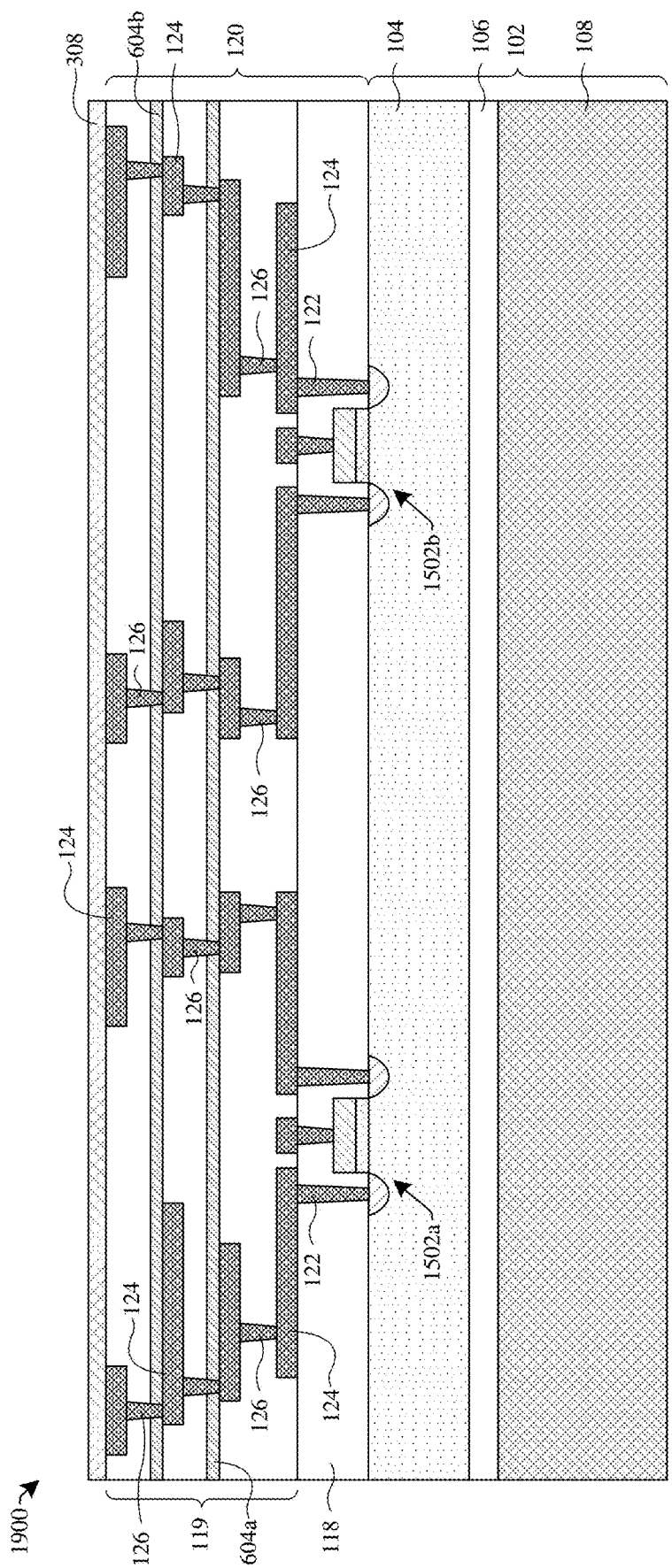

As shown in the cross-sectional view 1900 of FIG. 19, a first passivation layer 308 is formed over the first IMD structure 119 and the interconnect structure 120. The first passivation layer 308 may be formed by, for example, chemical vapor deposition (CVD), physical vapor deposition (PVD), atomic layer deposition (ALD), a spin-on process, some other deposition process, or a combination of the foregoing. In some embodiments, the first passivation layer 308 is formed with a substantially planar upper surface. In further embodiments, the first passivation layer 308 is formed via a blanket deposition process.

Figure 20:
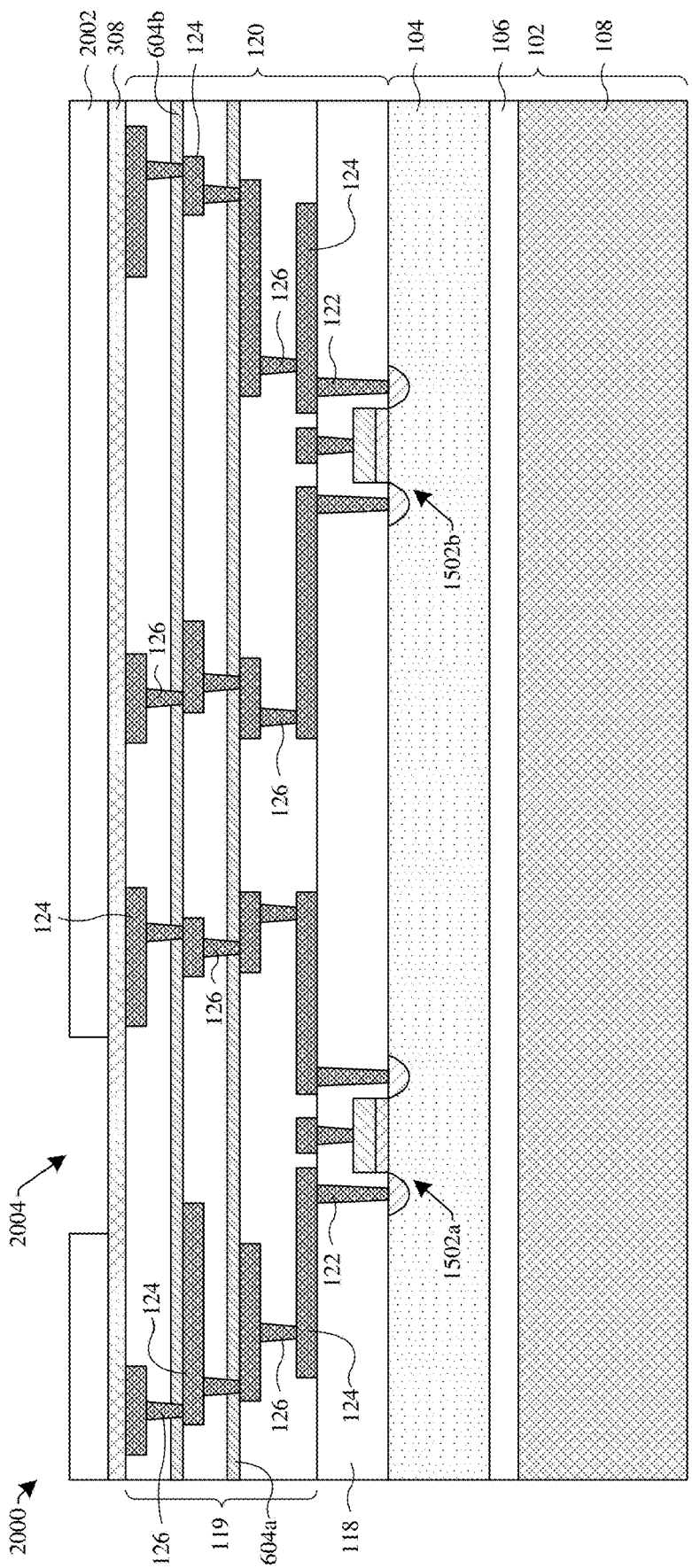

As shown in the cross-sectional view 2000 of FIG. 20, a first patterned masking layer 2002 (e.g., positive/negative photoresist, a hardmask, etc.) is formed over the first passivation layer 308. The first patterned masking layer 2002 comprises a first aperture 2004 (e.g., a first opening). The first aperture 2004 at least partially overlies the third semiconductor device 1502a. The first aperture 2004 also overlies a first portion of the first passivation layer 308 and a first portion of the first IMD structure 119. The conductive features of the interconnect structure 120 are spaced from the first portion of the first passivation layer 308 and the first portion of the first IMD structure 119. Although not shown in the cross-sectional view 2000 of FIG. 20, it will be appreciated that one or more input/output (I/O) structures (see, e.g., FIG. 5) may be formed in/over the first passivation layer 308 before the first patterned masking layer 2002 is formed.

In some embodiments, a process for forming the first patterned masking layer 2002 comprises depositing a masking layer (not shown) on the first passivation layer 308. The masking layer may be deposited by, for example, CVD, PVD, ALD, a spin-on process, some other deposition process, or a combination of the foregoing. Thereafter, the masking layer is exposed to a pattern (e.g., via a lithography process, such as photolithography, extreme ultraviolet lithography, or the like) and developed, thereby forming the first patterned masking layer 2002 over the first passivation layer 308.

Figure 21:
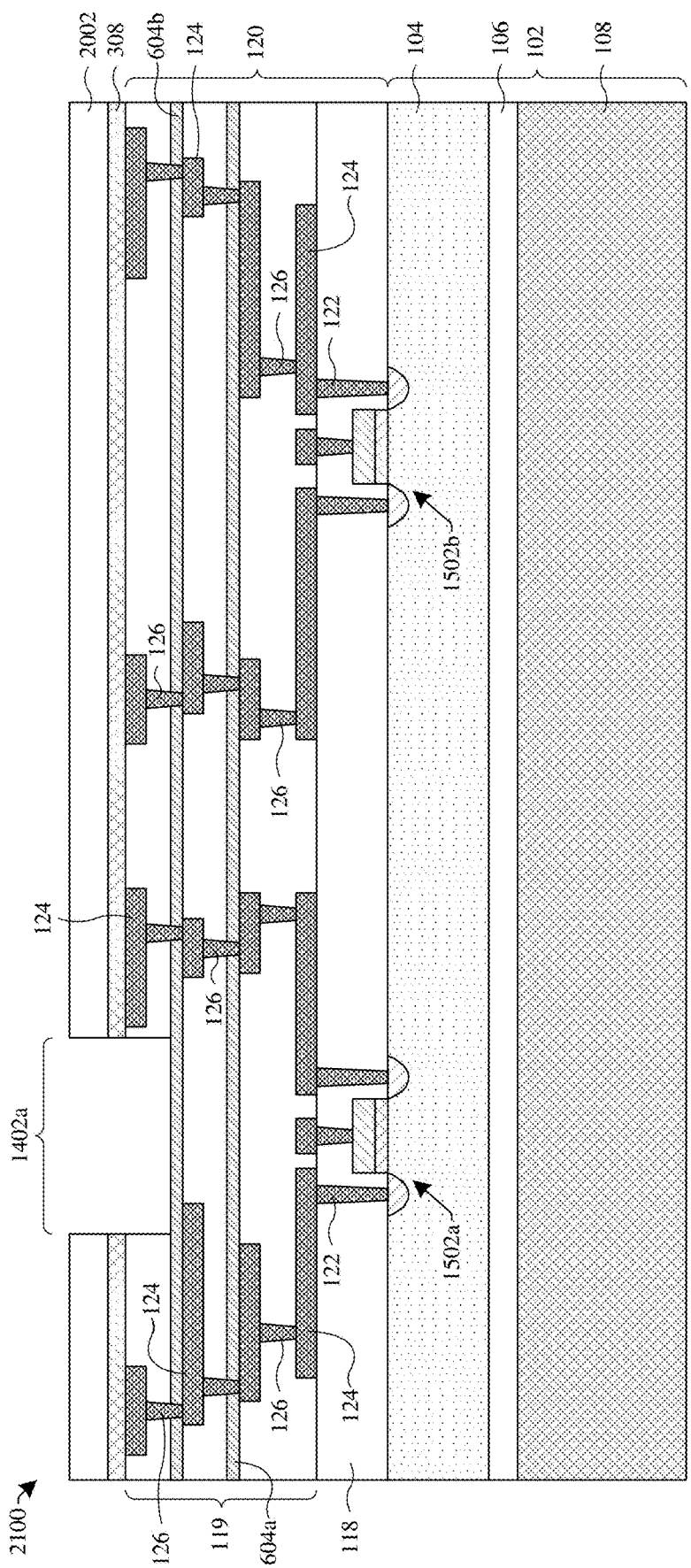

As shown in the cross-sectional view 2100 of FIG. 21, a first opening 1402a is formed in the first passivation layer 308 and the first IMD structure 119. The first opening 1402a is formed overlying at least a portion of the third semiconductor device 1502a. In some embodiments, the first opening 1402a is formed with substantially vertical sidewalls. In further embodiments, the first opening 1402a is formed so that a bottom surface of the first opening 1402a is defined by an upper surface of the second etch stop layer 604b. In other embodiments, the first opening 1402a is formed so that the bottom surface of the first opening 1402a is defined by a first upper surface of the first IMD structure 119 (or some other IMD structure).

In some embodiments, a process for forming the first opening 1402a comprises performing an etching process on the first passivation layer 308 and the first IMD structure 119 with the first patterned masking layer 2002 in place over the first passivation layer 308. The etching process selectively etches the first passivation layer 308 and the first IMD structure 119 according to the first patterned masking layer 2002. Thus, the etching process removes the first portion of the first passivation layer 308 and the first portion of the first IMD structure 119, thereby forming the first opening 1402a. In some embodiments, the etching process stops on the second etch stop layer 604b, such that the bottom surface of the first opening 1402a is defined by the upper surface of the second etch stop layer 604b. In further embodiments, the etching process may be or comprise, for example, a wet etching process, a dry etching process, a reactive ion etching (RIE) process, some other etching process, or a combination of the foregoing. Subsequently, in some embodiments, the first patterned masking layer 2002 is stripped away.

Figure 22:
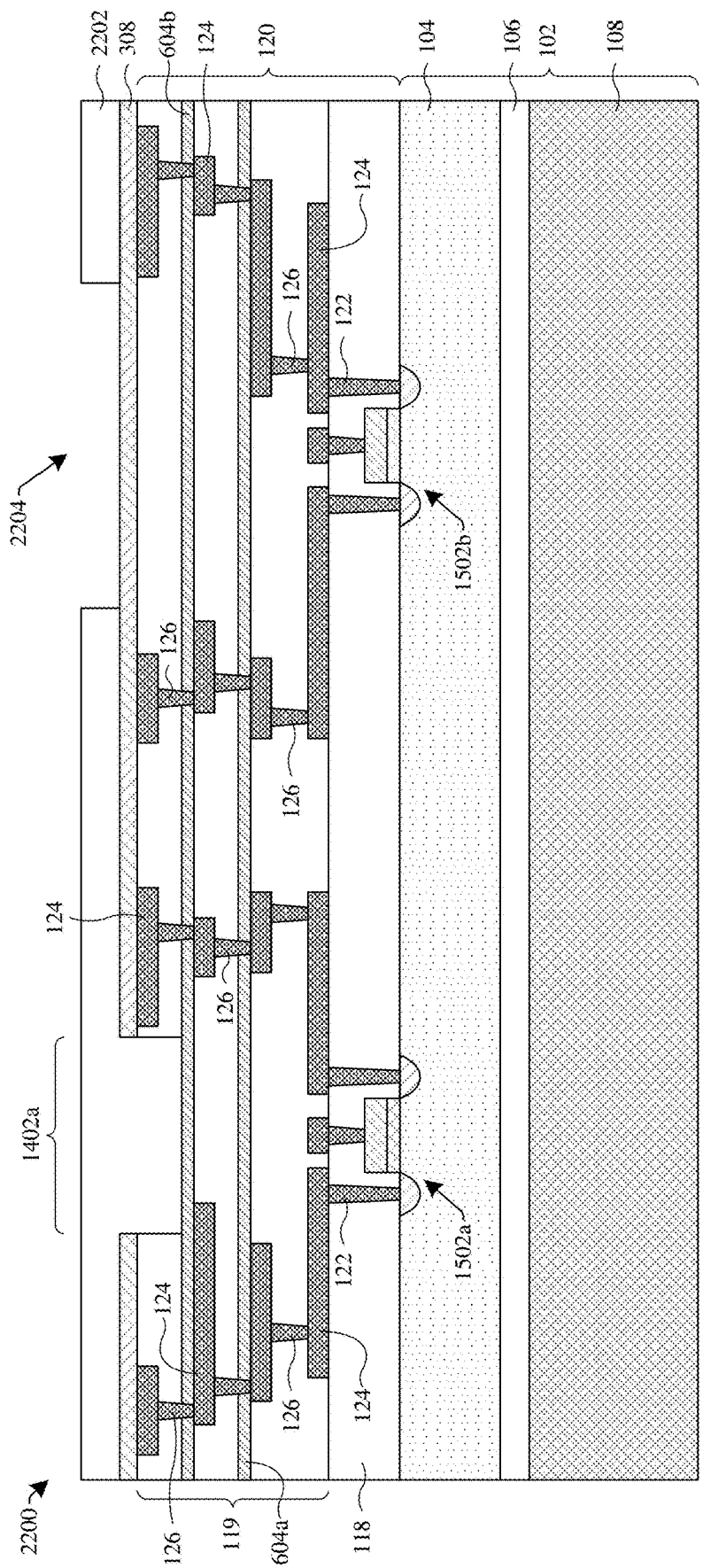

As shown in the cross-sectional view 2200 of FIG. 22, a second patterned masking layer 2202 (e.g., positive/negative photoresist, a hardmask, etc.) is formed over the first passivation layer 308 and in the first opening 1402a. The second patterned masking layer 2202 comprises a second aperture 2204 (e.g., a second opening). The second aperture 2204 at least partially overlies the fourth semiconductor device 1502b.

The second aperture 2204 also overlies a second portion of the first passivation layer 308, a second portion of the first IMD structure 119, a first portion of the second etch stop layer 604b, and a third portion of the first IMD structure 119. The second portion of the first IMD structure 119 overlies the third portion of the first IMD structure 119. The conductive features of the interconnect structure 120 are spaced from the second portion of the first passivation layer 308, the second portion of the first IMD structure 119, the third portion of the first IMD structure 119, the first portion of the second etch stop layer 604b.

In some embodiments, a process for forming the second patterned masking layer 2202 comprises depositing a masking layer (not shown) on the first passivation layer 308 and in the first opening 1402a. The masking layer may be deposited by, for example, CVD, PVD, ALD, a spin-on process, some other deposition process, or a combination of the foregoing. Thereafter, the masking layer is exposed to a pattern (e.g., via a lithography process, such as photolithography, extreme ultraviolet lithography, or the like) and developed, thereby forming the second patterned masking layer 2202 over the first passivation layer 308 and in the first opening 1402a.

Figure 23:
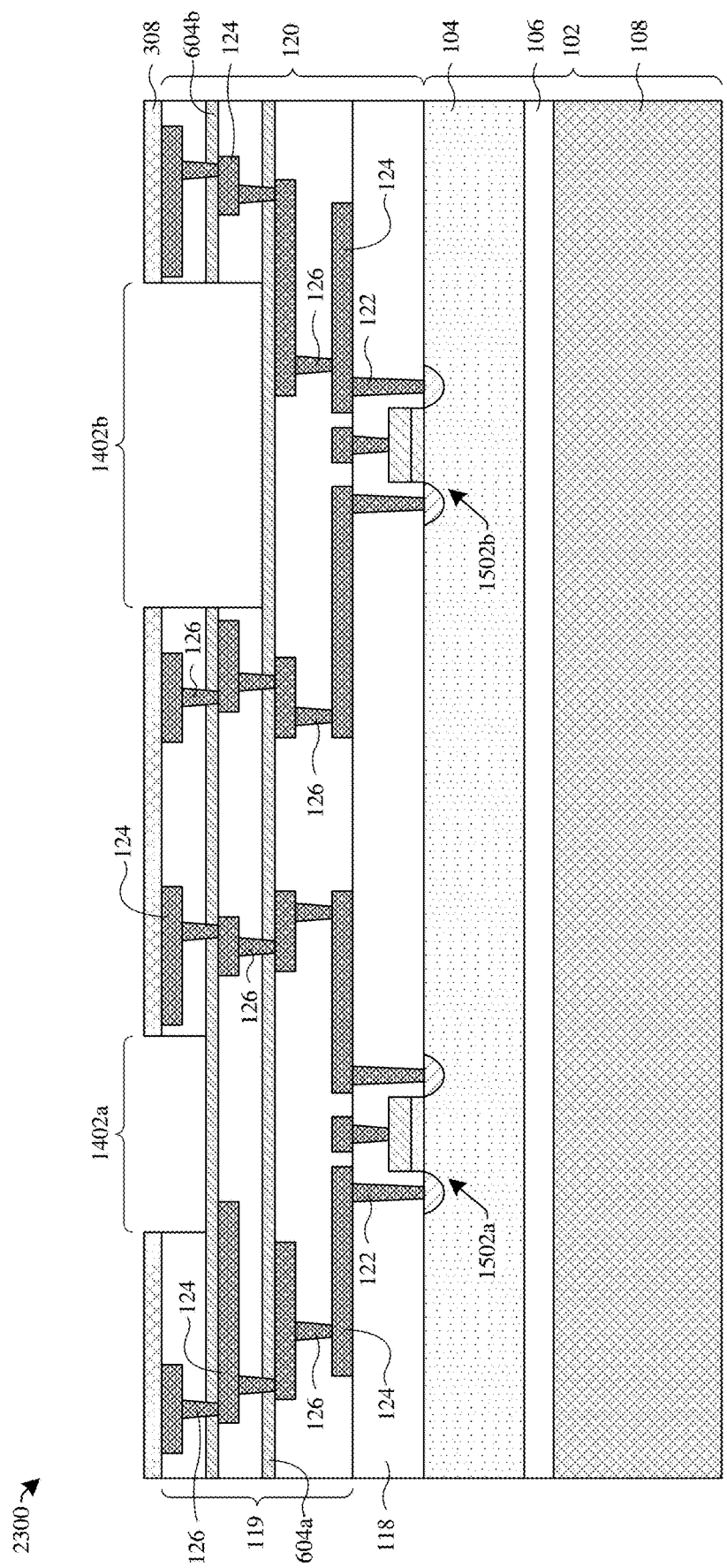

As shown in the cross-sectional view 2300 of FIG. 23, a second opening 1402b is formed in the first passivation layer 308, the first IMD structure 119, and the second etch stop layer 604b. The second opening 1402b is formed overlying at least a portion of the fourth semiconductor device 1502b. The second opening 1402b is formed laterally spaced from the first opening 1402a. In some embodiments, the second opening 1402b is formed with substantially vertical sidewalls. In further embodiments, the second opening 1402b is formed so that a bottom surface of the second opening 1402b is defined by an upper surface of the first etch stop layer 604a. In other embodiments, the second opening 1402b is formed so that the bottom surface of the second opening 1402b is defined by a second upper surface of the first IMD structure 119 (or some other IMD structure).

In some embodiments, a process for forming the second opening 1402b comprises performing a first etching process on the first passivation layer 308 and the first IMD structure 119. The first etching process is performed with the second patterned masking layer 2202 in place over the first passivation layer 308 and in the first opening 1402a. The first etching process selectively etches the first passivation layer 308 and the first IMD structure 119 according to the second patterned masking layer 2202. Thus, the first etching process removes the second portion of the first passivation layer 308 and the second portion of the first IMD structure 119. In some embodiments, the first etching process stops on the second etch stop layer 604b. In further embodiments, the first etching process may be or comprise, for example, a wet etching process, a dry etching process, a RIE process, some other etching process, or a combination of the foregoing.

Thereafter, a second etching process is performed on the second etch stop layer 604b. The second etching process is performed with the second patterned masking layer 2202 in place over the first passivation layer 308 and in the first opening 1402a. The second etching process selectively etches the second etch stop layer 604b according to the second patterned masking layer 2202. Thus, the second etching process removes the first portion of the second etch stop layer 604b. In some embodiments, the second etching process stops on a layer of the first IMD structure 119 that is disposed beneath (e.g., directly beneath) the second etch stop layer 604b. In further embodiments, the second etching process may be or comprise, for example, a wet etching process, a dry etching process, a RIE process, some other etching process, or a combination of the foregoing.

A third etching process is then performed on the first IMD structure 119. The third etching process is performed with the second patterned masking layer 2202 in place over the first passivation layer 308 and in the first opening 1402a. The third etching process selectively etches the first IMD structure 119 according to the second patterned masking layer 2202. Thus, the third etching process removes the third portion of the first IMD structure 119. In some embodiments, the third etching process stops on the first etch stop layer 604a, such that the bottom surface of the second opening 1402b is defined by the upper surface of the first etch stop layer 604a. In further embodiments, the third etching process may be or comprise, for example, a wet etching process, a dry etching process, a RIE process, some other etching process, or a combination of the foregoing. Subsequently, in some embodiments, the second patterned masking layer 2202 is stripped away.

FIGS. 24-27 illustrate a series of cross-sectional views 2400-2700 of some other embodiments of the method illustrated in FIGS. 18-23. Although FIGS. 24-27 are described with reference to a method, it will be appreciated that the structures shown in FIGS. 24-27 are not limited to the method but rather may stand alone separate of the method.

Figure 24:
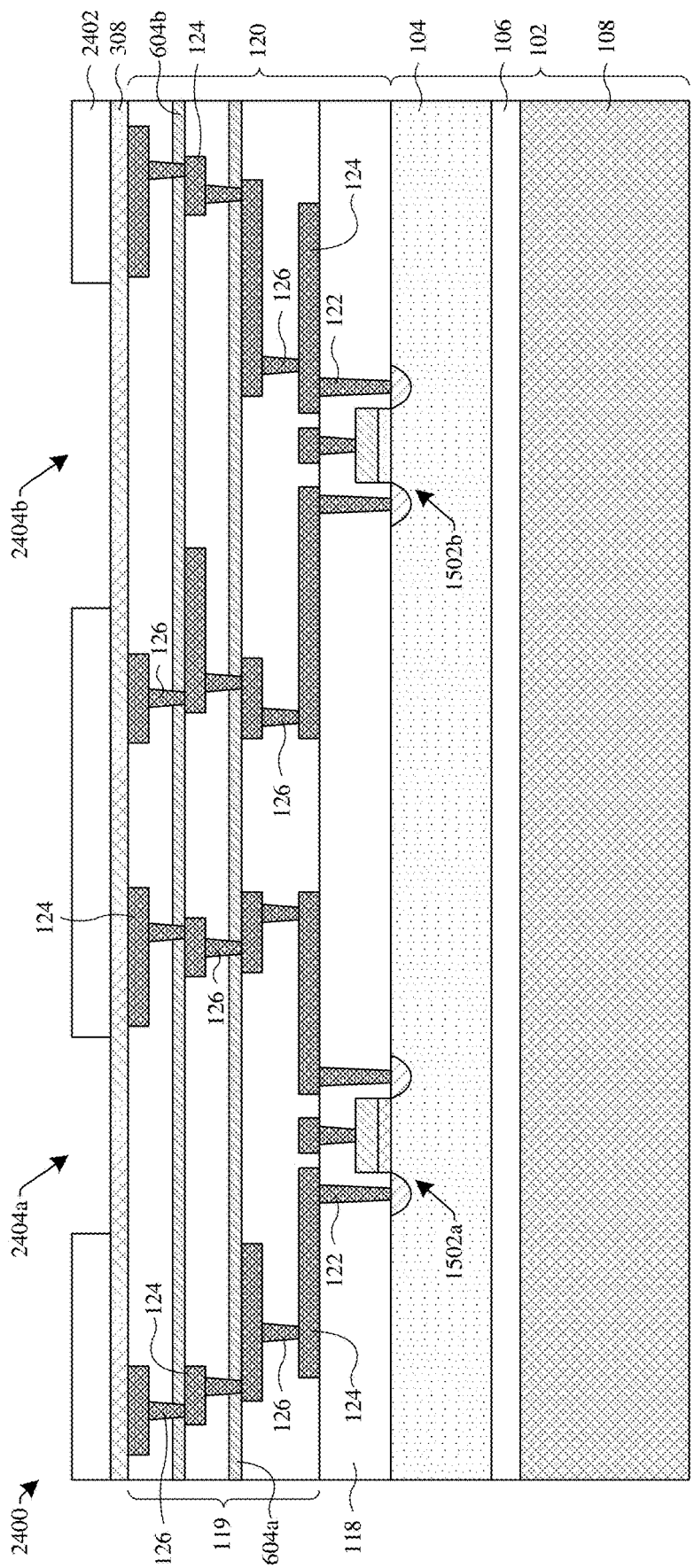
FIGS. 24-27 illustrate a series of cross-sectional views of some other embodiments of the method illustrated in FIGS. 18-23.

As shown in the cross-sectional view 2400 of FIG. 24, a third patterned masking layer 2402 (e.g., positive/negative photoresist, a hardmask, etc.) is formed over the first passivation layer 308. The third patterned masking layer 2402 comprises a plurality of apertures 2404a-b (e.g., openings). For example, the third patterned masking layer 2402 comprises a third aperture 2404a (e.g., first opening) and a fourth aperture 2404b (e.g., second opening). The third aperture 2404a is laterally spaced from the fourth aperture 2404b.

In some embodiments, the plurality of apertures 2404a-b have substantially similar footprints. In other embodiments, the plurality of apertures 2404a-b have different footprints. For example, as shown in the cross-sectional view 2400 of FIG. 24, the third aperture 2404a has a different footprint than the fourth aperture 2404b. In some embodiments, the plurality of apertures 2404a-b at least partially overlie the plurality of semiconductor devices 1502a-b, respectively. In other embodiments, the plurality of apertures 2404a-b may at least partially overlie one of the plurality of semiconductor devices 1502a-b (see, e.g., FIG. 17).

The plurality of apertures 2404a-b overlie portions of the first passivation layer 308 and portions of the first IMD structure 119. For example, the third aperture 2404a overlies a first portion of the first passivation layer 308 and a first portion of the first IMD structure 119; and the fourth aperture 2404b overlies a second portion of the first passivation layer 308 and a second portion of the first IMD structure 119. The conductive features of the interconnect structure 120 are spaced from the first and second portions of the first passivation layer 308 and the first and second portions of the first IMD structure 119.

In some embodiments, a process for forming the third patterned masking layer 2402 comprises depositing a masking layer (not shown) on the first passivation layer 308. The masking layer may be deposited by, for example, CVD, PVD, ALD, a spin-on process, some other deposition process, or a combination of the foregoing. Thereafter, the masking layer is exposed to a pattern (e.g., via a lithography process, such as photolithography, extreme ultraviolet lithography, or the like) and then developed, thereby forming the third patterned masking layer 2402 over the first passivation layer 308.

Figure 25:
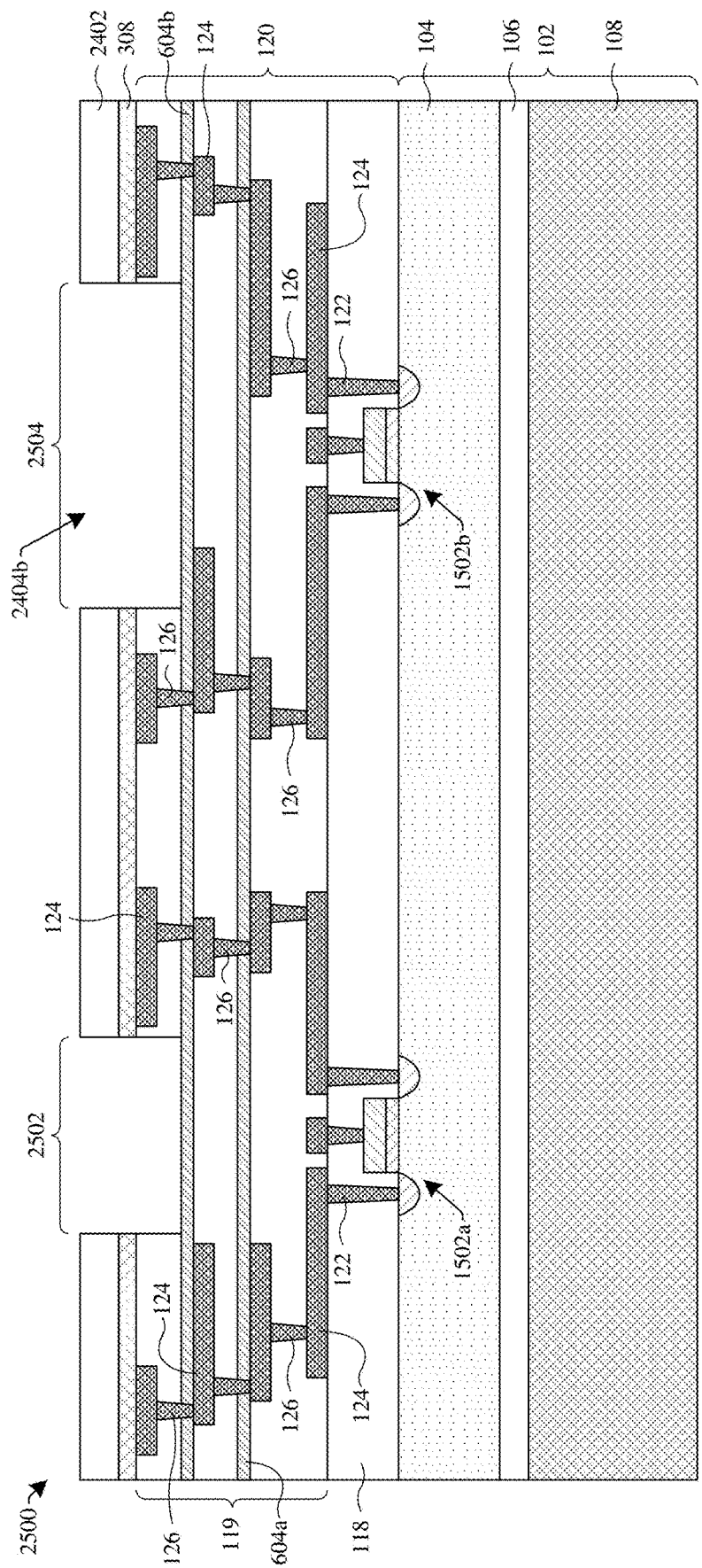

As shown in the cross-sectional view 2500 of FIG. 25, a fifth opening 2502 is formed in the first passivation layer 308 and the first IMD structure 119. In some embodiments, the fifth opening 2502 is formed with substantially vertical sidewalls. In further embodiments, the fifth opening 2502 is formed so that a bottom surface of the fifth opening 2502 is defined by a first upper surface of the second etch stop layer 604b. In other embodiments, the fifth opening 2502 is formed so that the bottom surface of the fifth opening 2502 is defined by a first upper surface of the first IMD structure 119 (or some other IMD structure).

Also shown in the cross-sectional view 2500 of FIG. 25, a sixth opening 2504 is formed in the first passivation layer 308 and the first IMD structure 119. In some embodiments, the sixth opening 2504 is formed with substantially vertical sidewalls. In further embodiments, the sixth opening 2504 is formed so that a bottom surface of the sixth opening 2504 is defined by a second upper surface of the second etch stop layer 604b. In other embodiments, the sixth opening 2504 is formed so that the bottom surface of the sixth opening 2504 is defined by a second upper surface of the first IMD structure 119 (or some other IMD structure).

In some embodiments, a process for forming the fifth opening 2502 and the sixth opening 2504 comprises performing an etching process on the first passivation layer 308 and the first IMD structure 119 with the third patterned masking layer 2402 in place over the first passivation layer 308. The etching process selectively etches the first passivation layer 308 and the first IMD structure 119 according to the third patterned masking layer 2402. Thus, the etching process removes the first and second portions of the first passivation layer 308 and the first and second portions of the first IMD structure 119, thereby forming the fifth opening 2502 and the sixth opening 2504 (e.g., via the same etch). In some embodiments, the etching process stops on the second etch stop layer 604b. In further embodiments, the etching process may be or comprise, for example, a wet etching process, a dry etching process, a RIE process, some other etching process, or a combination of the foregoing.

Figure 26:
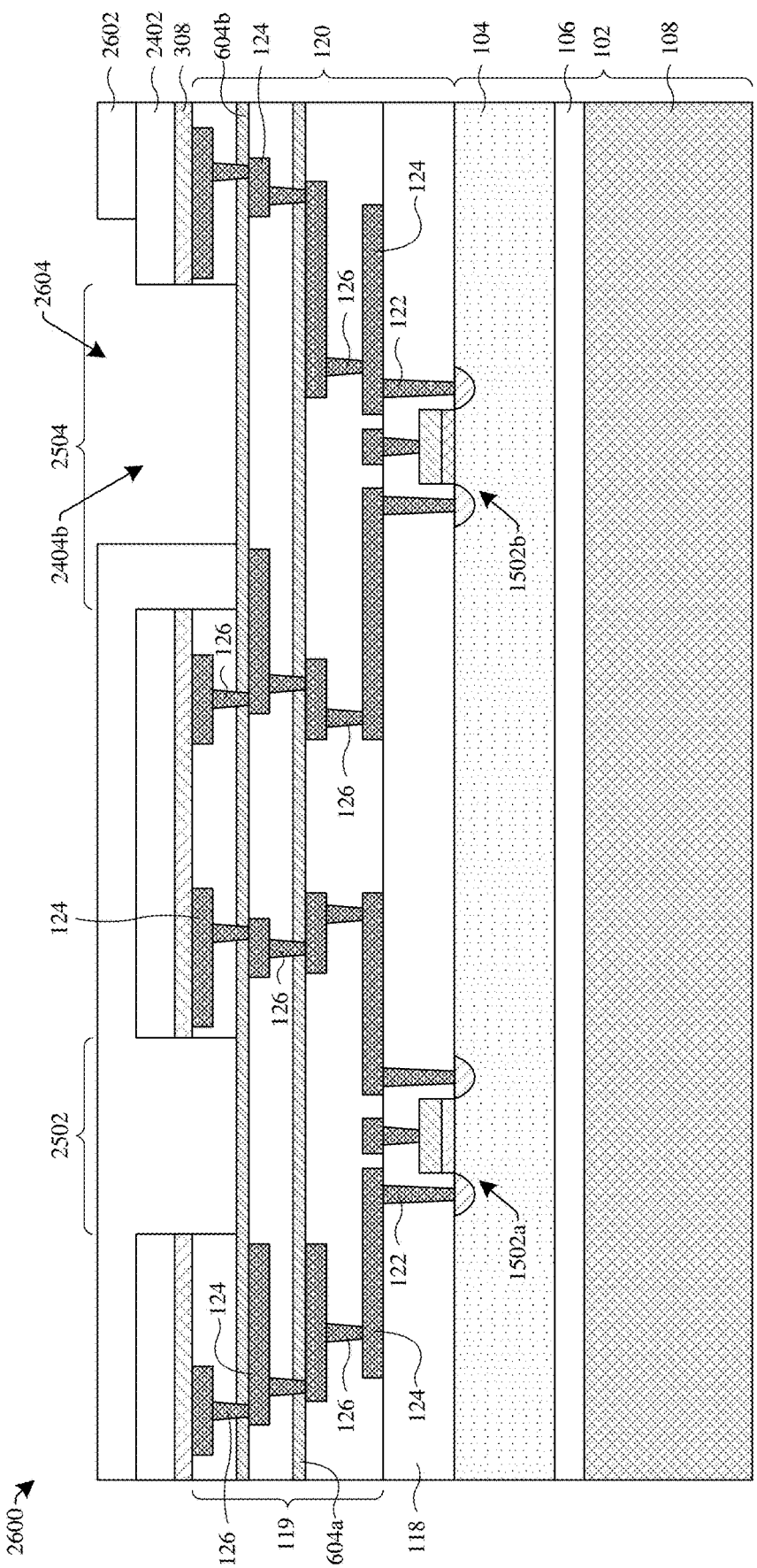

As shown in the cross-sectional view 2600 of FIG. 26, a fourth patterned masking layer 2602 (e.g., positive/negative photoresist, a hardmask, etc.) is formed over the first passivation layer 308 and in the fifth opening 2502. In some embodiments, the fourth patterned masking layer 2602 is formed over the third patterned masking layer 2402. In other embodiments, the third patterned masking layer 2402 is stripped away before the fourth patterned masking layer 2602 is formed.

The fourth patterned masking layer 2602 comprises a fifth aperture 2604 (e.g., a fifth opening). In some embodiments, the fifth aperture 2604 is laterally shifted in relation to the fourth aperture 2404b. In such embodiments, as shown in the cross-sectional view 2600 of FIG. 26, the fourth patterned masking layer 2602 is partially formed within the sixth opening 2504. The fifth aperture 2604 overlies a second portion of the second etch stop layer 604b and a third portion of the first IMD structure 119. The conductive features of the interconnect structure 120 are spaced from the second portion of the second etch stop layer 604b and the third portion of the first IMD structure 119.

In some embodiments, a process for forming the fourth patterned masking layer 2602 comprises depositing a masking layer (not shown) over the first passivation layer 308, in the fifth opening 2502, and in the sixth opening 2504. In further embodiments, the masking layer is also deposited over the third patterned masking layer 2402. The masking layer may be deposited by, for example, CVD, PVD, ALD, a spin-on process, some other deposition process, or a combination of the foregoing. Thereafter, the masking layer is exposed to a pattern (e.g., via a lithography process, such as photolithography, extreme ultraviolet lithography, or the like) and then developed, thereby forming the fourth patterned masking layer 2602 over the first passivation layer 308 (and the third patterned masking layer 2402), in the fifth opening 2502, and partially in the sixth opening 2504.

Figure 27:
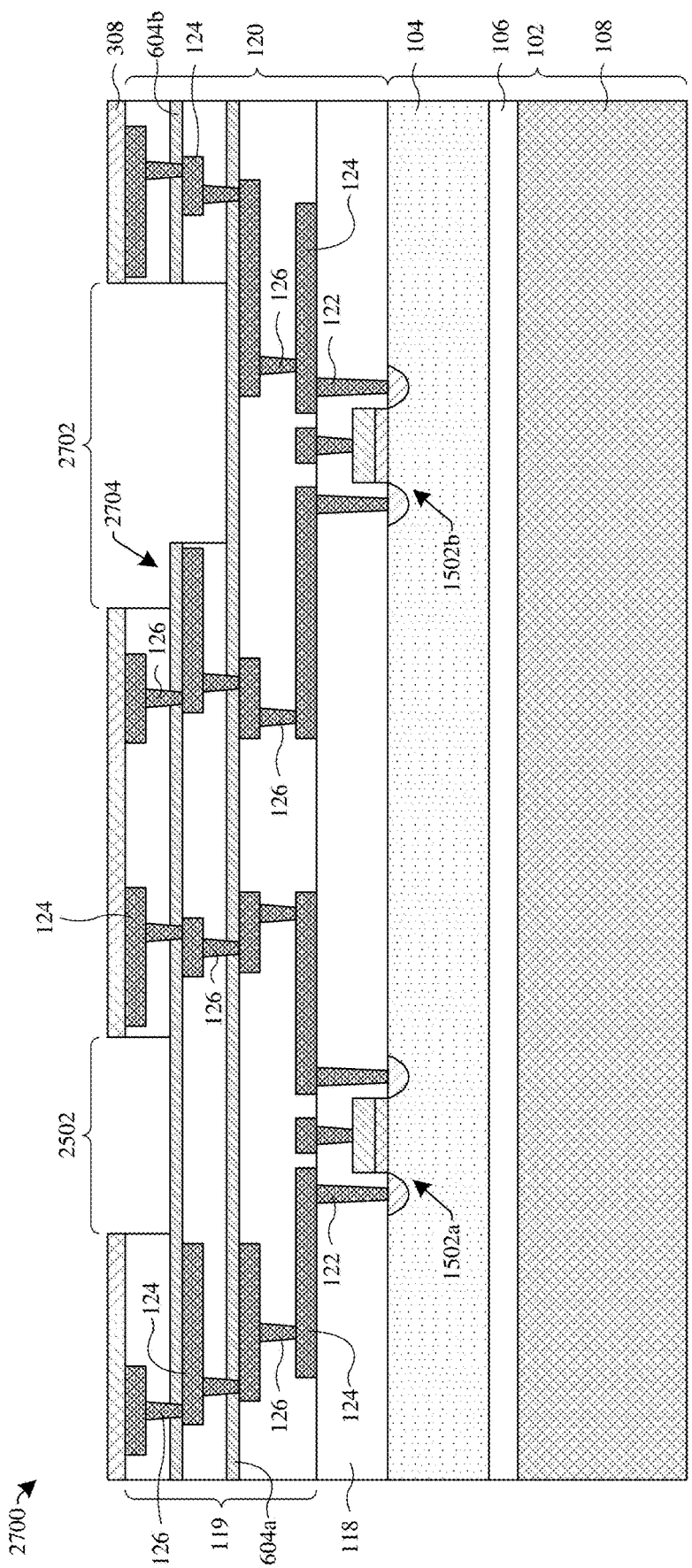

As shown in the cross-sectional view 2700 of FIG. 27, a seventh opening 2702 is formed in the first passivation layer 308 and the first IMD structure 119. The seventh opening 2702 is formed by extending a depth of at least a portion of the sixth opening 2504. In some embodiments, the seventh opening 2702 is formed so that a bottommost surface of the seventh opening 2702 is defined by an upper surface of the first etch stop layer 604a. In other embodiments, the seventh opening 2702 is formed so that the bottommost surface of the seventh opening 2702 is defined by a third upper surface of the first IMD structure 119 (or some other IMD structure).

In some embodiments, the seventh opening 2702 is formed with a shelf 2704. The shelf 2704 comprises a portion of the first IMD structure 119 (and a portion of the second etch stop layer 604b) that is disposed laterally between opposite sidewalls of the sixth opening 2504 (see, e.g., FIG. 25). More specifically, the shelf 2704 comprises the portion of the first IMD structure 119 (and the portion of the second etch stop layer 604b) that the sixth opening 2504 overlies and the fourth patterned masking layer 2602 covers (see, e.g., FIG. 26). In some embodiments, an upper surface of the shelf 2704 is defined by a third upper surface of the second etch stop layer 604b. In other embodiments, the upper surface of the shelf 2704 is defined by a fourth upper surface of the first IMD structure 119 (or some other IMD structure). In some embodiments, the upper surface of the shelf 2704 may overlie one or more conductive features of the interconnect structure 120 that are disposed vertically between the upper surface of the shelf 2704 and the bottommost surface of the seventh opening 2702.

In some embodiments, a process for forming the seventh opening 2702 comprises performing a first etching process on the second etch stop layer 604b. The first etching process is performed with the fourth patterned masking layer 2602 (and the third patterned masking layer 2402) in place over the first passivation layer 308, in the fifth opening 2502, and partially in the sixth opening 2504. The first etching process selectively etches the second etch stop layer 604b according to the fourth patterned masking layer 2602 (and the third patterned masking layer 2402). Thus, the first etching process removes the second portion of the second etch stop layer 604b. In some embodiments, the first etching process stops on a layer of the first IMD structure 119 that is disposed beneath (e.g., directly beneath) the second etch stop layer 604b. In further embodiments, the second etching process may be or comprise, for example, a wet etching process, a dry etching process, a RIE process, some other etching process, or a combination of the foregoing.

A second etching process is then performed on the first IMD structure 119. The second etching process is performed with the fourth patterned masking layer 2602 (and the third patterned masking layer 2402) in place over the first passivation layer 308, in the fifth opening 2502, and partially in the sixth opening 2504. The second etching process selectively etches the first IMD structure 119 according to the fourth patterned masking layer 2602 (and the third patterned masking layer 2402). Thus, the second etching process removes the third portion of the first IMD structure 119. In some embodiments, the second etching process stops on the first etch stop layer 604a, such that the bottommost surface of the seventh opening 2702 is defined by the upper surface of the first etch stop layer 604a. In further embodiments, the second etching process may be or comprise, for example, a wet etching process, a dry etching process, a RIE process, some other etching process, or a combination of the foregoing. Subsequently, in some embodiments, the fourth patterned masking layer 2602 (and the third patterned masking layer 2402) is stripped away.

By forming the seventh opening 2702 in the above described manner, thermal energy generated by the plurality of semiconductor devices 1502a-b may be more efficiently dissipated away. For example, by forming the sixth opening

2504 and then extending the depth of the sixth opening 2504 to form the seventh opening 2702, the seventh opening 2702 may have a greater overall height (e.g., overall depth). As such, the bottommost surface of the seventh opening 2702 may be disposed nearer the fourth semiconductor device 1502b, thereby improving the rate at which thermal energy generated by the fourth semiconductor device 1502b is dissipated away from the fourth semiconductor device 1502b.

Figure 28:
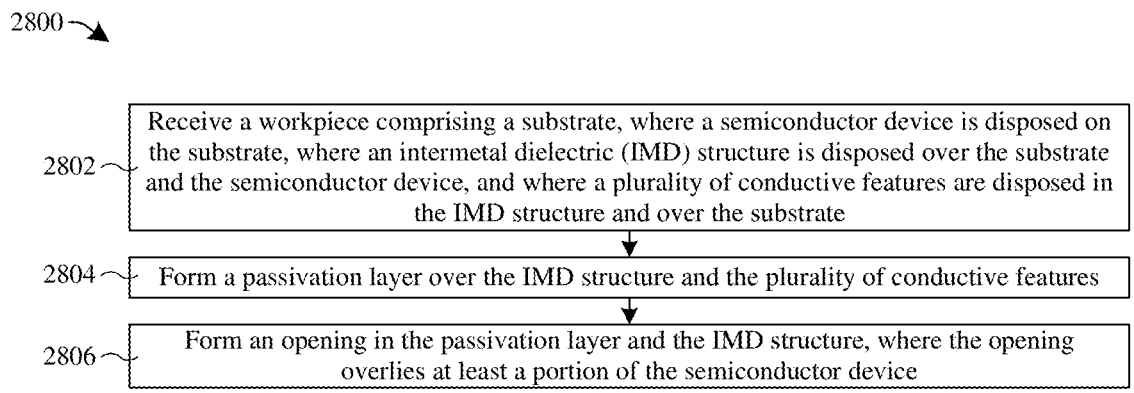
FIG. 28 illustrates a flowchart of some embodiments of a method for forming an integrated chip (IC) comprising an opening disposed in an intermetal dielectric (IMD) structure.

FIG. 28 illustrates a flowchart 2800 of some embodiments of a method for forming an integrated chip (IC) comprising an opening disposed in an intermetal dielectric (IMD) structure. While the flowchart 2800 of FIG. 28 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2802, a workpiece comprising a substrate is received, where a semiconductor device is disposed on the substrate, where an intermetal dielectric (IMD) structure is disposed over the substrate and the semiconductor device, and where a plurality of conductive features are disposed in the IMD structure and over the substrate. FIG. 18 illustrates a cross-sectional view 1800 of some embodiments corresponding to act 2802.

At act 2804, a passivation layer is formed over the IMD structure and the plurality of conductive features. FIG. 19 illustrates a cross-sectional view 1900 of some embodiments corresponding to act 2804.

At act 2806, an opening is formed in the passivation and the IMD structure, where the opening overlies at least a portion of the semiconductor device. FIGS. 20-23 illustrate a series of cross-sectional view 2000-2300 of some embodiments corresponding to act 2806. FIGS. 24-27 illustrate a series of cross-sectional views 2400-2700 of some other embodiments corresponding to act 2806.

In some embodiments, an integrated circuit (IC) may include a high voltage transistor disposed on a front side surface of a substrate. The high voltage transistor comprises a source region and a drain region laterally separated from one another by a gate structure and may have a breakdown voltage greater than about 20 Volts. The IC may include an electrode disposed on a back side surface of the substrate that is configured to enhance the performance of the high voltage transistor by manipulating electric fields (e.g., reducing peak electric fields) in the substrate generated by the high voltage transistor. The electrode directly underlies the high voltage transistor and is separated from the back side surface of the substrate by an insulator layer. By manipulating the electric fields generated by the high voltage transistor, an absolute value of the breakdown voltage of the high voltage transistor may be increased. For example, the electrode may be grounded or held at a suitable bias voltage to improve the breakdown voltage performance of the associated high voltage transistor. Further, a back side dielectric structure may be disposed across an entire bottom surface of the electrode, where the back side dielectric structure directly underlies the high voltage transistor devices. The back side dielectric structure may be part of a back side structure (e.g., an input/output structure) and may be configured to isolate the electrode from other devices and/or structures disposed on the back side surface of the substrate.

During operation of the high voltage transistor high heat may accumulate within the substrate in/around doped regions of the high voltage transistor (e.g., the source region, the drain region, a well region, etc.). The heat will increase as an operating voltage of the high voltage transistor increases and may cause current leakage and/or delamination between layers. The back side dielectric structure and other structures/layers disposed on the bottom surface of the electrode are made of materials (e.g., dielectric materials) that suppress thermal energy generated from the high voltage transistor from easily dissipating out of the IC. Accordingly, by virtue of the back side dielectric structure directly underlying the high voltage transistor and being disposed across the entire bottom surface of the electrode, the IC may have poor thermal dissipation performance (e.g., low dissipation of thermal energy generated by the high voltage transistor). This may reduce the performance of the IC and/or may cause damage/breakdown of the high voltage transistor (e.g., due to thermal runaway).

Accordingly, various embodiments of the present disclosure provide an integrated circuit (IC) having a high voltage transistor with improved thermal dissipation performance. The high voltage transistor is disposed on a front side surface of the substrate. An electrode is disposed below the high voltage transistor and is separated from a back side surface of the substrate by an insulating layer. Further, a back side dielectric structure is disposed under the electrode. The back side dielectric structure has sidewalls defining an opening (e.g., a void in the back side dielectric structure) that exposes at least a portion of a bottom surface of the electrode and directly underlies the high voltage transistor. Because the opening underlies at least a portion of the high voltage transistor, the thermal energy generated by the high voltage transistor may be more efficiently dissipated away from the high voltage transistor (e.g., by having less dielectric material under the electrode and high voltage transistor heat may be more efficiently dissipated from the high voltage transistor to the atmosphere). This, in part, increases thermal dissipation performance of the IC, and reduces damage and/or breakdown of the high voltage transistor.

Figure 29A:
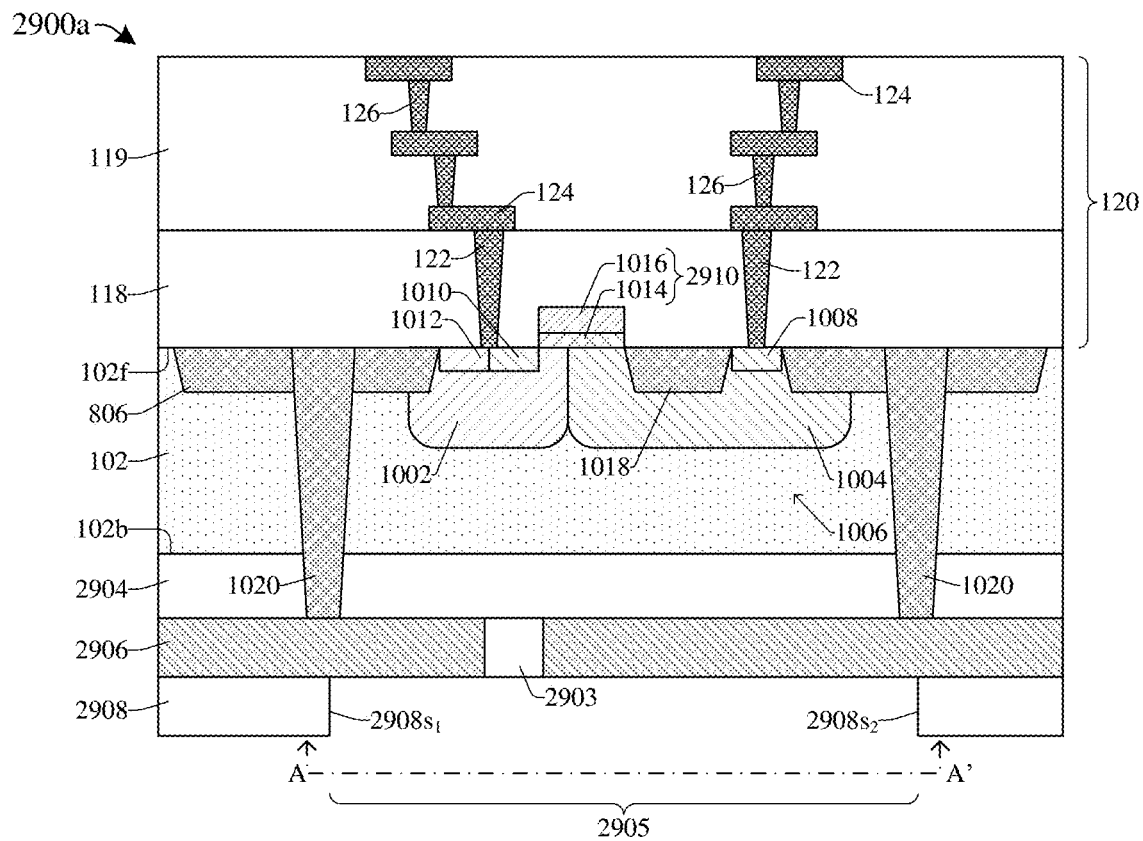
FIG. 29A illustrates a cross-sectional view of some embodiments of an integrated circuit (IC) comprising an opening disposed in a back side dielectric structure that underlies a second semiconductor device.

FIG. 29A illustrates a cross-sectional view 2900a of some embodiments of an integrated circuit (IC) comprising an opening 2905 disposed in a back side dielectric structure 2908 that underlies a second semiconductor device 1006.

As shown in the cross-sectional view 2900a of FIG. 29A, the IC comprises a substrate 102 having a front side surface 102f opposite a back side surface 102b. In some embodiments, the substrate 102 may be or comprise silicon, bulk silicon, a silicon-on-insulator (SOI) substrate, another suitable semiconductor material, or the like. An insulating layer 2904 and a conductive layer 2906 are disposed on the back side surface 102b of the substrate 102. The insulating layer 2904 separates the conductive layer 2906 from the substrate 102. A back side dielectric structure 2908 is disposed on the conductive layer 2906. In various embodiments, the conductive layer 2906 comprises a metal such as copper, aluminum, tungsten, gold, silver, platinum, another metal material, or any combination of the foregoing. In some embodiments, the insulating layer 2904 and the back side dielectric structure 2908 comprise an oxide (e.g., silicon dioxide), silicon nitride, silicon oxynitride, undoped silicate glass, doped silicon dioxide, borosilicate glass, another dielectric material, or any combination of the foregoing. In various embodiments, the back side dielectric structure 2908 is a single continuous layer or comprises two or more dielectric layers.

A first isolation structure 806 extends from the front side surface 102f of the substrate 102 to a point below the front side surface 102f. The first isolation structure 806 may be configured as a shallow trench isolation (STI) structure. Further, a third isolation structure 1020 extends from the front side surface 102f of the substrate 102 to the insulating layer 2904. The third isolation structure 1020 may be configured as a deep trench isolation (DTI) structure. In various embodiments, the first isolation structure 806 and the third isolation structure 1020 may, for example, be or comprise silicon nitride, silicon carbide, silicon oxynitride, silicon dioxide, another dielectric material, or any combination of the foregoing. Further, the second semiconductor device 1006 is disposed on/over the front side surface 102f of the substrate 102. The first and third isolation structures 806, 1020 respectively laterally enclose the second semiconductor device 1006 and are configured to electrically isolate the second semiconductor device 1006 from other devices disposed on/within the substrate 102. In yet further embodiments, one or more through substrate vias (TSVs) (e.g., see FIGS. 30A-30C) are disposed within the third isolation structure and are electrically coupled to the conductive layer 2906.

In some embodiments, the second semiconductor device 1006 comprises a gate structure 2910 disposed on the front side surface 102f, a drain region 1008, a source region 1010, a body contact region 1012, a third well region 1002, and a fourth well region 1004. The gate structure 2910 comprises a gate electrode 1016 over the substrate 102 and a gate dielectric 1014 disposed between the gate electrode 1016 and the substrate 102. The drain region 1008 is laterally separated from the source region 1010 by the gate structure 2910 and a second isolation structure 1018. In some embodiments, the second isolation structure 1018 is a segment of the first isolation structure 806. Further, the body contact region 1012 and the source region 1010 are disposed within the third well region 1002, and the drain region 1008 is disposed within the fourth well region 1004.

Upon receiving a bias voltage, the gate electrode 1016 is configured to generate an electric field that controls the movement of charge carriers within the third well region 1002 between the source region 1010 and the drain region 1008. For example, during operation, a gate to source voltage can be selectively applied to the gate electrode 1016 relative to the source region 1010, thereby forming a conductive channel with the third well region 1002 and laterally between the source region 1010 and the drain region 1008. In some embodiments, the third well region 1002 and the body contact region 1012 respectively comprise a first doping type (e.g., p-type), and the fourth well region 1004, the source region 1010, and the drain region 1008 respectively comprise a second doping type (e.g., n-type) opposite the first doping type. The first doping type is p-type and the second doping type is n-type, or vice versa. In some embodiments, the second semiconductor device 1006 is configured as a high voltage transistor such as a laterally diffused metal oxide semiconductor (LDMOS) device. In yet further embodiments, the second semiconductor device 1006 may be any type of metal-oxide-semiconductor field-effect transistor (MOSFET), a bipolar junction transistor (BJT), another suitable semiconductor device, or the like.

At least a portion of the conductive layer 2906 directly underlying the second semiconductor device 1006 may be referred to as an electrode and is configured to manipulate the electric fields (e.g., reducing peak electric fields) generated by the gate electrode 1016. This, in part, increases an absolute value of the breakdown voltage of the second semiconductor device 1006, thereby increasing overall performance of the IC. For example, during operation, the conductive layer 2906 may be biased at a suitable voltage to improve the breakdown voltage performance of the second semiconductor device 1006. In addition, the conductive layer 2906 comprises sidewalls defining one or more gaps disposed directly beneath the second semiconductor device 1006. In various embodiments, each gap has a shape that corresponds to a shape of an overlying structure of the second semiconductor device 1006 such as the third well region 1002, the fourth well region 1004, the gate structure 2910, the source region 1010, and/or the drain region 1008. The conductive layer 2906 having a gap with the shape and layout as described above improves the uniformity of electric fields (e.g., further reducing peak electric fields) in the substrate 102, thereby further improving the breakdown voltage performance of the second semiconductor device 1006. The gap disposed in the conductive layer 2906 is filled with a non-conductive material such as a first dielectric structure 2903. In some embodiments, the first dielectric structure 2903 may comprise a same material as the insulating layer 2904 or the back side dielectric structure 2908. In yet further embodiments, the first dielectric structure 2903 is air and/or omitted, such that the gap in the conductive layer 2906 is an opening that exposes at least a portion of the bottom surface of the insulating layer 2904.

An interconnect structure 120 is disposed on the front side surface 102f of the substrate 102. In some embodiments the interconnect structure 120 comprises an interlayer dielectric (ILD) structure 118, a first intermetal dielectric (IMD) structure 119, a plurality of conductive contacts 122, a plurality of conductive lines 124 (e.g., plurality of conductive wires), and a plurality of conductive vias 126. The ILD structure 118 overlies the front side surface 102f of the substrate 102 and the second semiconductor device 1006. The first IMD structure 119 overlies the ILD structure 118. The conductive contacts 122 are disposed within the ILD structure 118 and are electrically coupled to the second semiconductor device 1006. Further, the conductive lines 124 and conductive vias 126 are disposed within the first IMD structure 119 and are electrically coupled to the plurality of conductive contacts 122. The ILD structure 118 and the first IMD structure 119 may, for example, be or comprise a low-k dielectric material (e.g., a dielectric material with a dielectric constant less than 3.9), an oxide (e.g., silicon dioxide), silicon nitride, silicon carbide, undoped silicate glass, doped silicon dioxide, another suitable dielectric material, or any combination of the foregoing.

The back side dielectric structure 2908 comprises opposing sidewalls $2908s_1$, $2908s_2$ that at least partially define the opening 2905 disposed within the back side dielectric structure 2908. In various embodiments, a top surface of the opening 2905 is defined by at least a portion of the bottom surface of the conductive layer 2906 and a bottom surface of the first dielectric structure 2903. The opening 2905 underlies the second semiconductor device 1006, such that the second semiconductor device 1006 is spaced laterally between the opposing sidewalls $2908s_1$, $2908s_2$ of the back side dielectric structure 2908. Because the opening 2905 underlies the second semiconductor device 1006, thermal energy generated by the second semiconductor device 1006 (e.g., during operation of the second semiconductor device 1006) may be efficiently dissipated away from the second semiconductor device 1006. For example, by having less material (e.g., less dielectric material) under the conductive layer 2906 and the second semiconductor device 1006 heat may be more efficiently dissipated away from the second semiconductor device 1006 to the atmosphere. This increases the thermal dissipation performance of the IC, and reduces damage and/or breakdown of the second semiconductor device 1006.

Figure 29B:
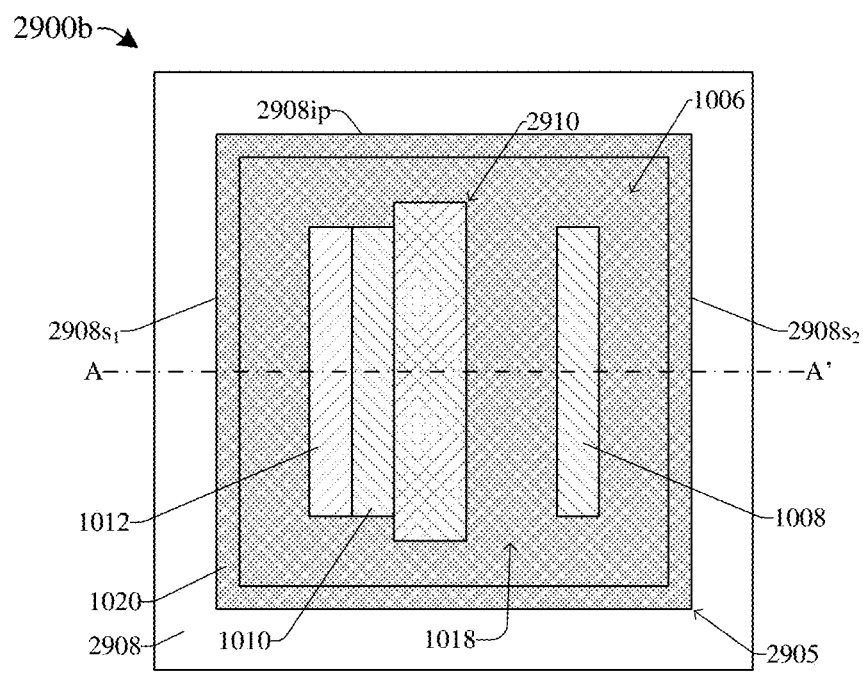
FIGS. 29B-29C illustrate various plan views of the IC of FIG. 29A taken along the line A-A' of FIG. 29A.

FIG. 29B illustrates a plan view 2900b of the IC of FIG. 29A taken along the line A-A' of the cross-sectional view 2900a of FIG. 29A. For ease of illustration the conductive layer 2906, the first dielectric structure 2903, the insulating layer 2904, portions of the substrate 102, the third well region 1002, and the fourth well region 1004 are omitted from the plan view 2900b of FIG. 29B.

As shown in the plan view 2900b of FIG. 29B, the back side dielectric structure 2908 has an inner perimeter 2908ip that defines a perimeter of the opening 2905. In various embodiments, the perimeter of the opening is defined by four sidewalls of the back side dielectric structure 2908. In some embodiments, the perimeter of the opening 2905 has a rectangular shape, a square shape, a circular shape, an oval shape, or some other geometric shape. The perimeter of the opening 2905 laterally encloses the second semiconductor device 1006 in a closed path. For example, the gate structure 2910, the body contact region 1012, the source region 1010, and the drain region 1008 are disposed laterally within the perimeter of the opening 2905. By virtue of the second semiconductor device 1006 being disposed laterally within the perimeter of the opening 2905, thermal energy generated by the second semiconductor device 1006 is more efficiently dissipated away from the second semiconductor device 1006.

Figure 29C:
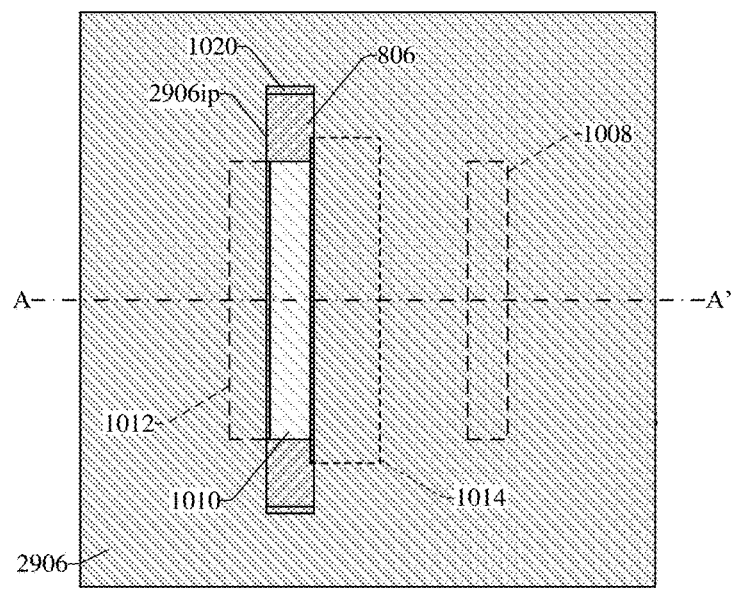

FIG. 29C illustrates a plan view 2900c of the conductive layer 2906 facing the back side surface 102b of the substrate 102 of the IC of FIG. 29A. The plan view 2900c of FIG. 29C is taken along the line A-A' of the cross-sectional view of FIG. 29A, and for ease of illustration, the first dielectric structure 2903, the insulating layer 2904, portions of the substrate 102, the third well region 1002, and the fourth well region 1004 are omitted from the plan view 2900c of FIG. 29C.

As shown in the plan view 2900c of FIG. 29C, the conductive layer 2906 has an inner perimeter 2906ip that defines a perimeter of the gap in the conductive layer 2906. In yet further embodiments, the perimeter of the gap is equal to a perimeter of the first dielectric structure (2903 of FIG. 29A). Further, a shape of the gap in the conductive layer 2906 corresponds to a shape of the source region 1010 in which the gap directly underlies (e.g., see FIG. 29A).

Figure 30A:
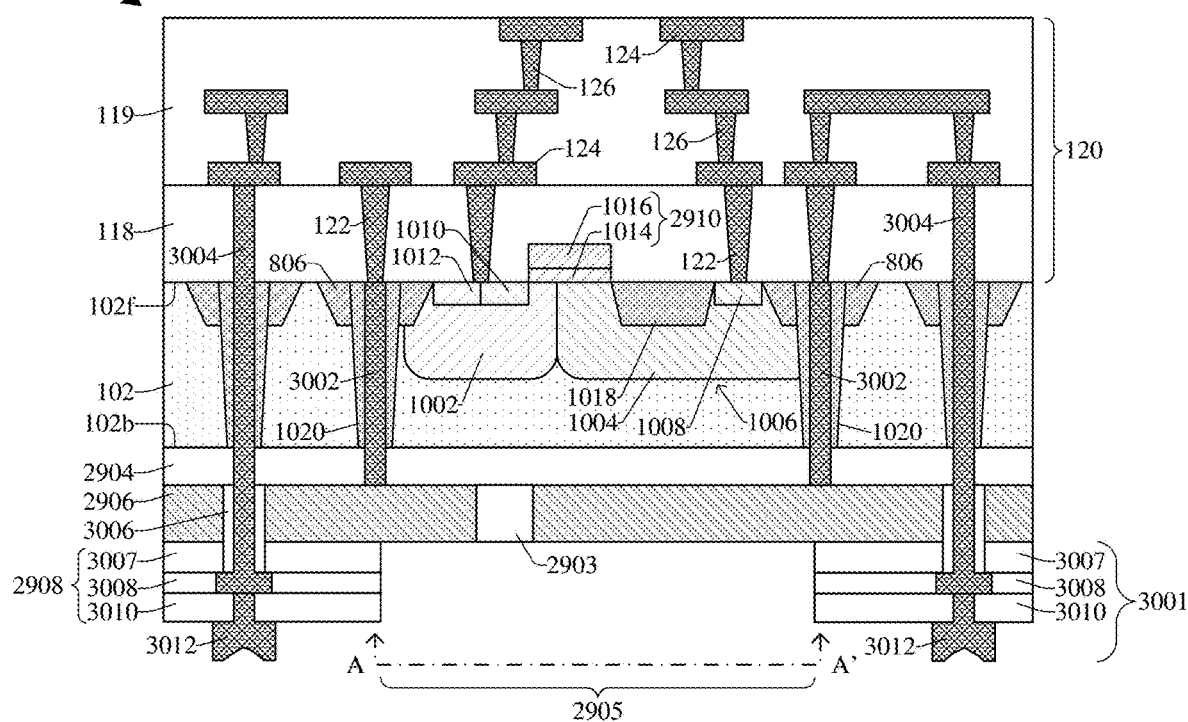
FIG. 30A illustrates a cross-sectional view of some alternative embodiments of the IC of FIG. 29A.

FIG. 30A illustrates a cross-sectional view 3000a of an IC in accordance with some alternative embodiments of the IC of FIGS. 29A-29C, where a first plurality of through substrate vias (TSVs) 3002 laterally enclose the second semiconductor device 1006 and a back side structure 3001 is disposed on the back side surface 102b of the substrate 102.

As shown in the cross-sectional view 3000a of FIG. 30A, in various embodiments, the conductive layer 2906 is electrically coupled to the first plurality of TSVs 3002. The first plurality of TSVs 3002 extends through the third isolation structure 1020 and laterally encloses the second semiconductor device 1006. The back side structure 3001 comprises the back side dielectric structure 2908, a second plurality of TSVs 3004, and a plurality of contact pads 3012. In some embodiments, the back side dielectric structure 2908 comprises a first dielectric layer 3007, a second dielectric layer 3008, and a third passivation layer 3010. At least one TSV in the second plurality of TSVs 3004 is electrically coupled to the first plurality of TSVs 3002 by way of the conductive contacts 122, the conductive lines 124, and the conductive vias 126. Further, the second plurality of TSVs 3004 are electrically coupled to the plurality of contact pads 3012. The second plurality of TSVs 3004 are separated from the conductive layer 2906 by one or more second dielectric structures 3006. In some embodiments, the contact pads 3012 are configured to electrically couple the IC to another IC (not shown). Further, the first dielectric layer 3007, the second dielectric layer 3008, and the third passivation layer 3010 respectively comprise opposing sidewalls that are aligned and define the opening 2905.

Figure 30B:
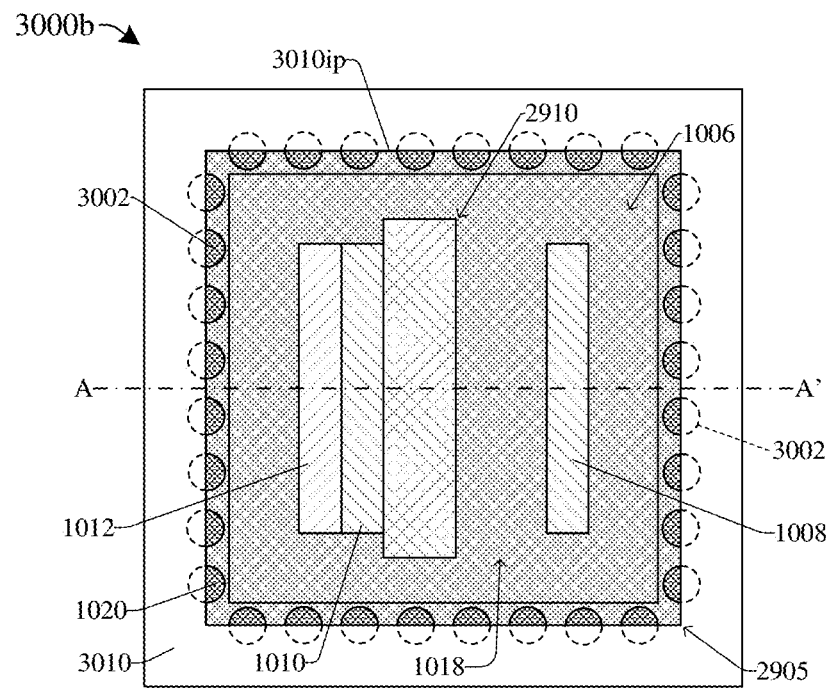
FIGS. 30B and 30C illustrate various plan views of the IC of FIG. 30A taken along the line A-A' of FIG. 30A.

FIG. 30B illustrates a plan view 3000b of the IC of FIG. 30B taken along the line A-A' of the cross-sectional view 3000a of FIG. 30A. For ease of illustration the conductive layer 2906, the first dielectric structure 2903, the insulating layer 2904, portions of the substrate 102, the third well region 1002, and the fourth well region 1004 are omitted from the plan view 3000b of FIG. 30B.

As shown in the plan view 3000b of FIG. 30B, the first plurality of TSVs 3002 may, for example, be circular in shape and are aligned with an inner perimeter 3010ip of the third passivation layer 3010. In some embodiments, the inner perimeter 3010ip of the third passivation layer 3010 defines a perimeter of the opening 2905.

Figure 30C:
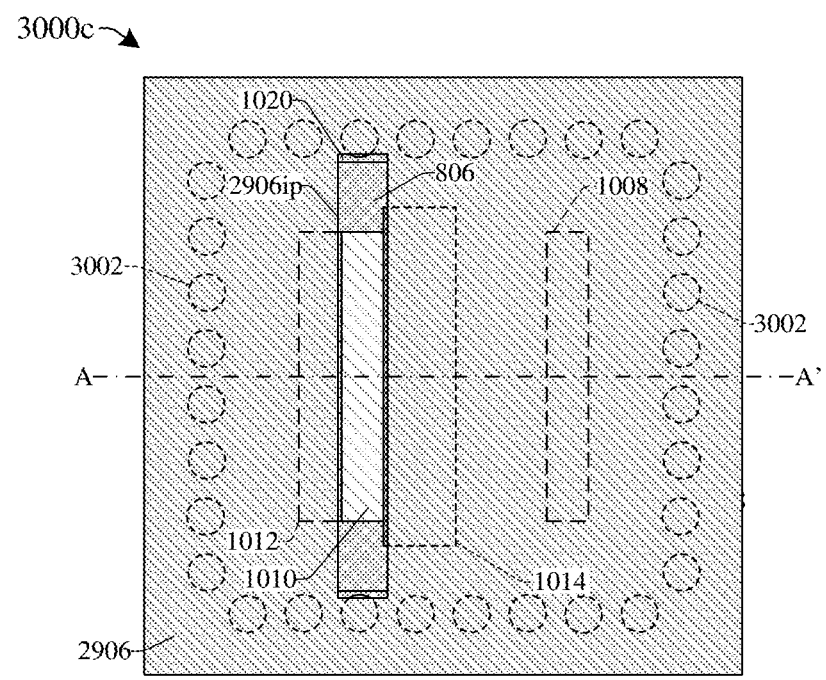

FIG. 30C illustrates a plan view 3000c of the conductive layer 2906 facing the back side surface 102b of the substrate 102 of the IC of FIG. 30A. The plan view 3000c of FIG. 30C is taken along the line A-A' of the cross-sectional view 3000a of FIG. 30A, and for ease of illustration, the first dielectric structure 2903, the insulating layer 2904, portions of the substrate 102, the third well region 1002, and the fourth well region 1004 are omitted from the plan view 3000c of FIG. 30C.

As shown in the plan view 3000c of FIG. 30C, the conductive layer 2906 has an inner perimeter 2906ip that defines a perimeter of the gap in the conductive layer 2906. In various embodiments, at least one TSV in the first plurality of TSVs 3002 is laterally aligned with at least a portion of the inner perimeter 2906ip of the conductive layer 2906.

Figure 31A:
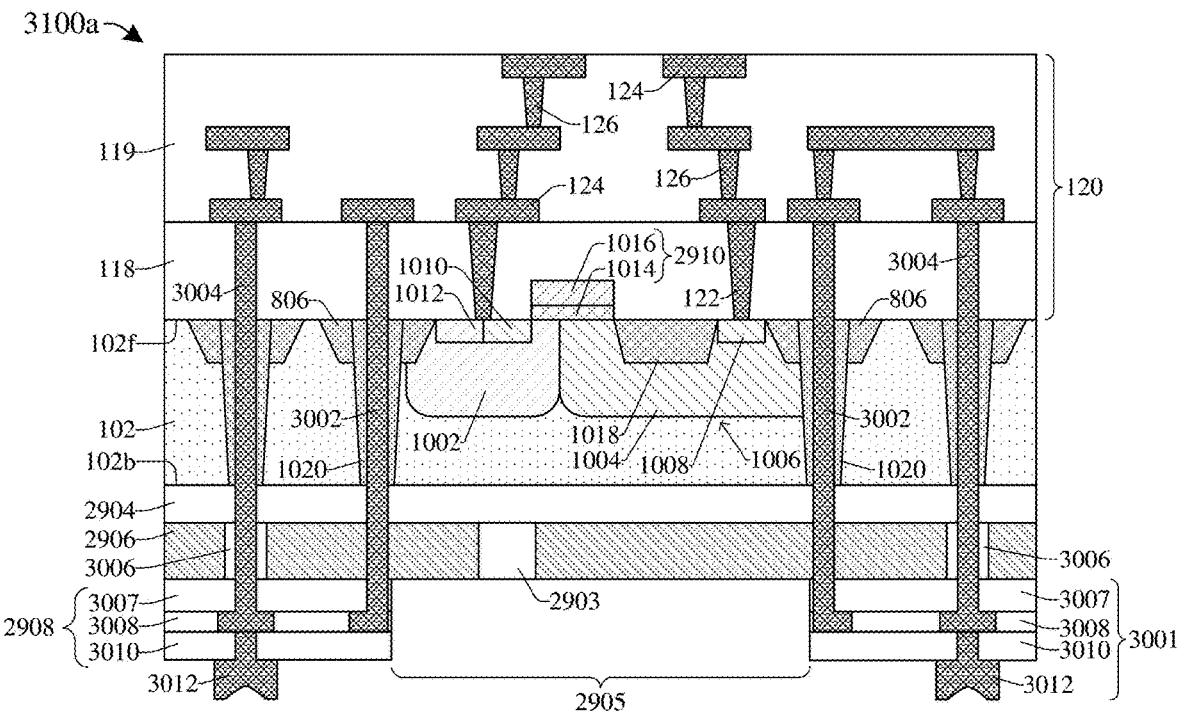
FIGS. 31A-31D illustrate cross-sectional views of various alternative embodiments of the IC of FIG. 30A.

FIG. 31A illustrates a cross-sectional view 3100a of an IC in accordance with some alternative embodiments of the IC of FIG. 30A, in which the first plurality of TSVs 3002 continuously extend from the interconnect structure 120 to a point below the conductive layer 2906. In some embodiments, each TSV in the first plurality of TSVs 3002 respectively directly contact opposing sidewalls of the conductive layer 2906.

Figure 31B:
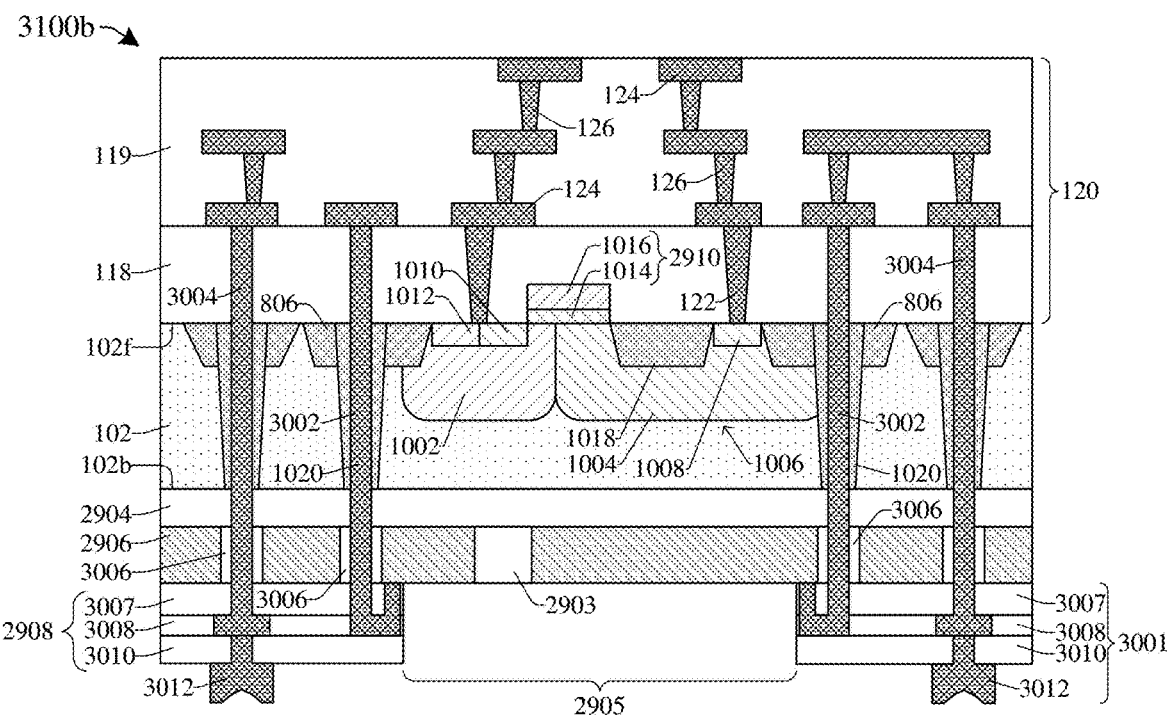

FIG. 31B illustrates a cross-sectional view 3100b of an IC in accordance with some alternative embodiments of the IC of FIG. 30A, in which the first plurality of TSVs 3002 directly contact the bottom surface of the conductive layer 2906. In various embodiments, the first plurality of TSVs 3002 are laterally spaced from the conductive layer 2906 by at least one of the second dielectric structures 3006.

Figure 31C:
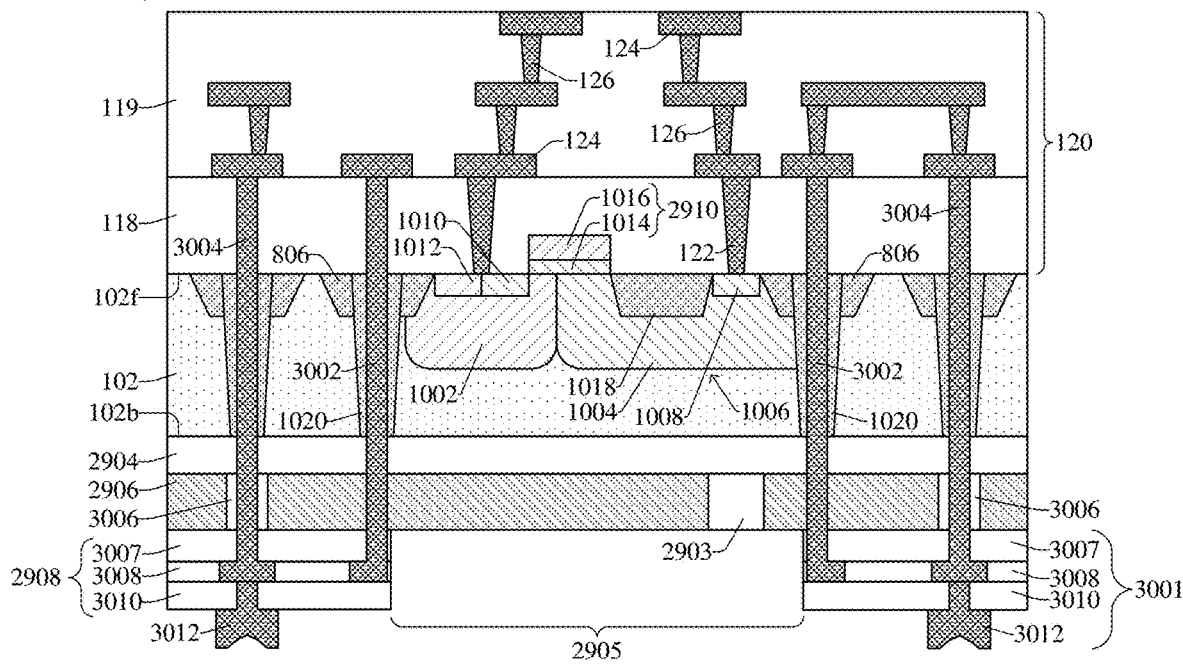

FIG. 31C illustrates a cross-sectional view 3100c of an IC in accordance with some alternative embodiments of the IC of FIG. 30A, in which the gap in the conductive layer 2906 and the first dielectric structure 2903 directly underlie the drain region 1008. In some embodiments, the first dielectric structure 2903 has a same shape as the drain region 1008 when viewed from above and/or has a same width as the drain region 1008. In yet further embodiments, the width of the first dielectric structure 2903 is greater than that of the drain region 1008.

Figure 31D:
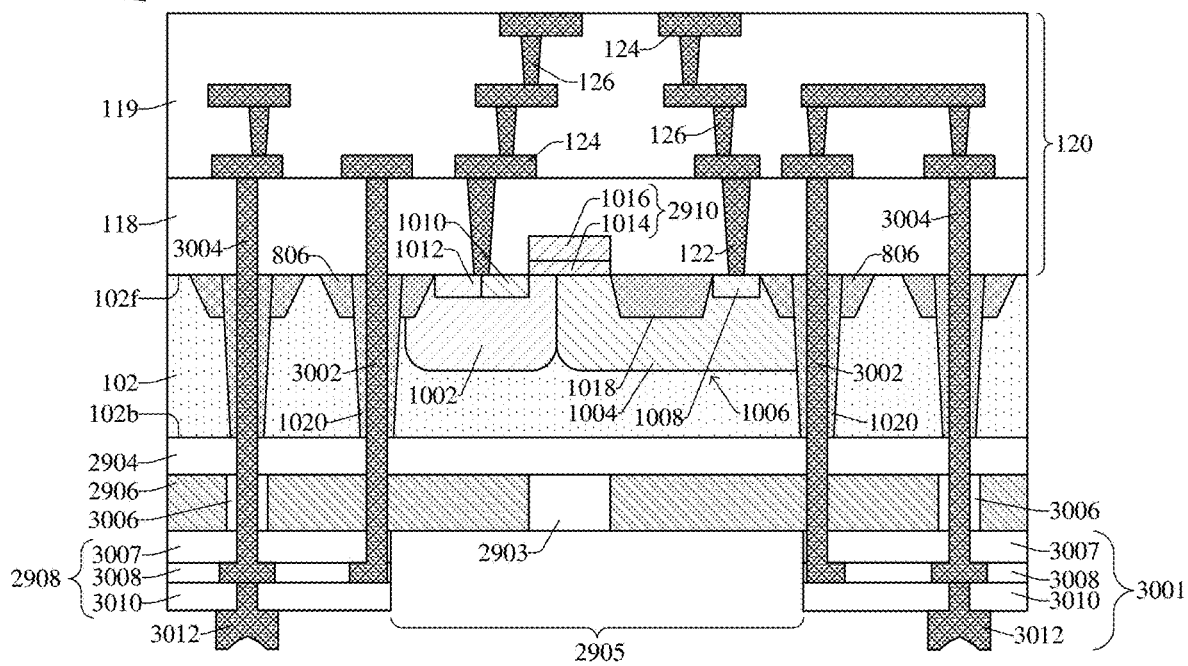

FIG. 31D illustrates a cross-sectional view 3100d of an IC in accordance with some alternative embodiments of the IC of FIG. 30A, in which the gap in the conductive layer 2906 and the first dielectric structure 2903 directly underlie the gate electrode 1016. In some embodiments, the first dielectric structure 2903 has a same shape as the gate electrode 1016 when viewed from above and/or has a same width as the gate electrode 1016. In yet further embodiments, the width of the first dielectric structure 2903 is greater than that of the gate electrode 1016.

FIGS. 32-42 illustrate a series of cross-sectional views 3200-4200 of some embodiments of a method for forming an integrated circuit (IC) comprising an opening disposed in a back side dielectric structure. Although the cross-sectional views 3200-4200 shown in FIGS. 32-42 are described with reference to a method, it will be appreciated that the structures shown in FIGS. 32-42 are not limited to the method but rather may stand alone separate of the method. Although FIGS. 32-42 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 32:
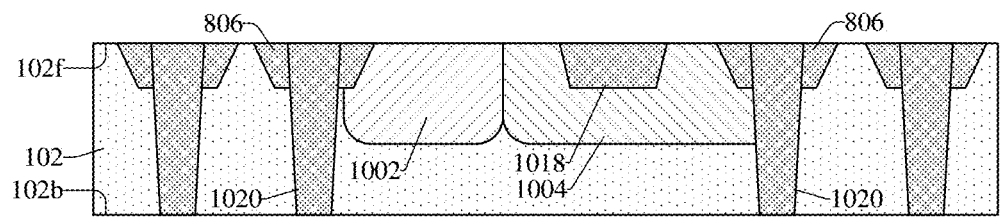
FIGS. 32-42 illustrates a series of cross-sectional views of some embodiments of a method for forming an IC comprising an opening disposed in a back side dielectric structure.

A shown in the cross-sectional view 3200 of FIG. 32, a substrate 102 having a front side surface 102f and a back side surface 102b is received. In some embodiments, the substrate 102 may, for example, be or comprise silicon, bulk silicon, silicon germanium, germanium, gallium arsenide, another suitable semiconductor material, or any combination of the foregoing. In further embodiments, the substrate 102 may comprise a first doping type (e.g., p-type) with a doping concentration within a range of about $10^{14}$ to about $10^{16}$ atoms/cm$^3$.

A first isolation structure 806 and a third isolation structure 1020 are formed within the substrate 102. In some embodiments, a process for forming the first isolation structure 806 includes etching the substrate 102 to define one or more trenches extending into the front side surface 102f of the substrate 102 and filling (e.g., by a chemical vapor deposition (CVD) process, a physical vapor deposition (PVD) process, an atomic layer deposition (ALD) process, etc.) the one or more trenches with a dielectric material. In further embodiments, a process for forming the third isolation structure includes etching the substrate 102 and/or the first isolation structure 806 to define one or more trenches extending into the front side surface 102f of the substrate 102 and filling (e.g., by a CVD process, a PVD process, an ALD process, etc.) the one or more trenches with a dielectric material. The first isolation structure 806 and the third isolation structure 1020 may, for example, respectively be or comprise silicon dioxide, silicon nitride, silicon carbide, another dielectric material, or any combination of the foregoing.

Further, a third well region 1002 and a fourth well region 1004 are formed within the substrate 102. In various embodiments, the third well region 1002 may be formed by a first ion implantation process and the fourth well region 1004 may be formed by a second ion implantation process. In some embodiments, the third well region 1002 and the fourth well region 1004 may be formed before forming the third isolation structure 1020. In further embodiments, the third well region 1002 comprises the first doping type (e.g., p-type) with a doping concentration within a range of about $10^{16}$ to about $10^{18}$ atoms/cm$^3$. In yet further embodiments, the fourth well region 1004 comprises a second doping type (e.g., n-type) with a doping concentration within a range of about $10^{16}$ to about $10^{18}$ atoms/cm$^3$. In various embodiments, the first doping type is n-type and the second doping type is p-type, or vice versa.

Figure 33:
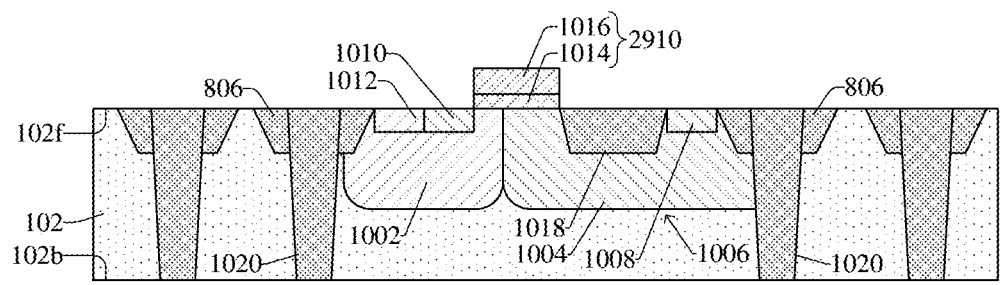

As shown in the cross-sectional view 3300 of FIG. 33, a gate structure 2910, a body contact region 1012, a source region 1010, and a drain region 1008 are formed within/on the substrate 102, thereby forming the second semiconductor device 1006. The gate structure 2910 overlies the front side surface 102f of the substrate 102 and comprises a gate electrode 1016 overlying a gate dielectric 1014. In some embodiments, a process for forming the gate structure 2910 comprises: depositing (e.g., by CVD, PVD, ALD, thermal oxidation, etc.) a gate dielectric material over the front side surface 102f of the substrate 102; depositing (e.g., by CVD, PVD, sputtering, electroplating, etc.) a gate electrode material over the gate dielectric material; and etching the gate dielectric material and the gate electrode material according to the masking layer (not shown) to define the gate dielectric 1014 and the gate electrode 1016. The gate dielectric 1014 may, for example, be or comprise a silicon dioxide, a high-k dielectric material (e.g., a dielectric material with a dielectric constant greater than 3.9), another dielectric material, or any combination of the foregoing. The gate electrode 1016 may, for example, be or comprise titanium, aluminum, tungsten, titanium nitride, tantalum, polysilicon, another conductive material, or any combination of the foregoing.

In some embodiments, the body contact region 1012, the source region 1010, and the drain region 1008 are formed by one or more ion implantation processes. In some embodiments, the body contact region 1012 comprises the first doping type (e.g., p-type) with a doping concentration within a range of about $10^{18}$ to about $10^{20}$ atoms/cm$^3$. In yet further embodiments, the source region 1010 and the drain region 1008 respectively comprise the second doping type (e.g., n-type) with a doping concentration within a range of about $10^{18}$ to about $10^{20}$ atoms/cm$^3$.

Figure 34:
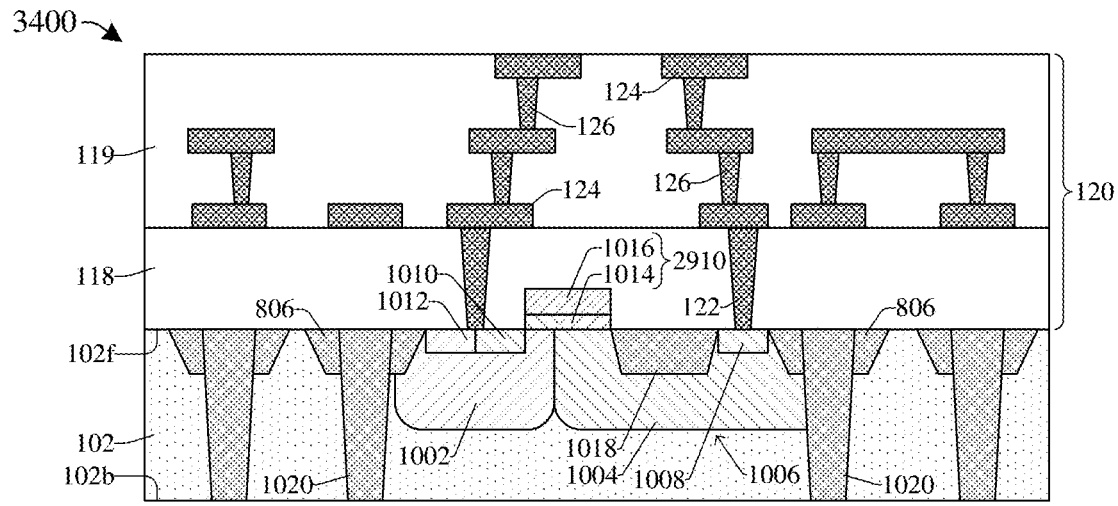

As shown in the cross-sectional view 3400 of FIG. 34, an interconnect structure 120 is formed over the front side surface 102f of the substrate 102. The interconnect structure 120 includes an interlayer dielectric (ILD) structure 118, a first intermetal dielectric (IMD) structure 119, a plurality of conductive contacts 122, a plurality of conductive lines 124, and a plurality of conductive vias 126. In various embodiments, the ILD structure 118 and the first IMD structure 119 may be deposited by a CVD process, a PVD process, an ALD process, or another suitable growth or deposition process. Further, formation of the conductive contacts 122, the conductive lines 124, and the conductive vias 126 may include one or more single damascene and/or dual damascene processes.

Figure 35:
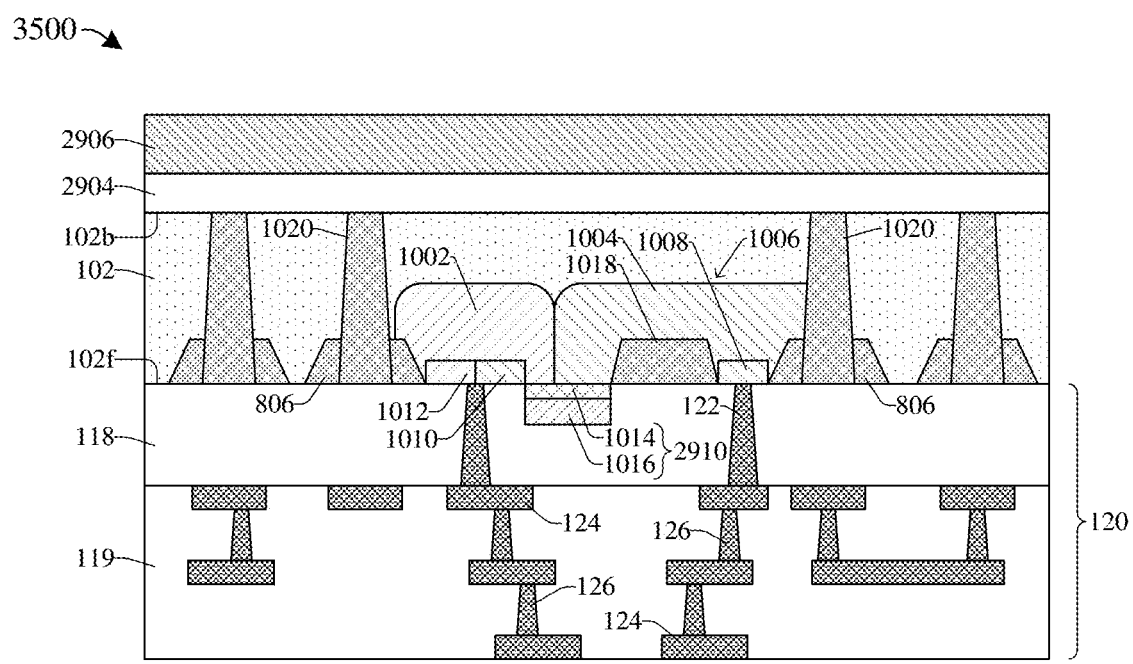

As shown in the cross-sectional view 3500 of FIG. 35, the substrate 102 is flipped and an insulating layer 2904 and a conductive layer 2906 are formed over the back side surface 102b of the substrate 102. The insulating layer 2904 may, for example, be formed by CVD, PVD, ALD, or another suitable deposition or growth process. The conductive layer 2906 may, for example, be formed by CVD, PVD, electroplating, electroless plating, or another suitable deposition or growth process. In yet further embodiments, before forming the insulating layer 2904 and the conductive layer 2906, a thinning process may be performed into the back side surface 102b of the substrate 102 to reduce a thickness of the substrate 102 (not shown).

Figure 36:
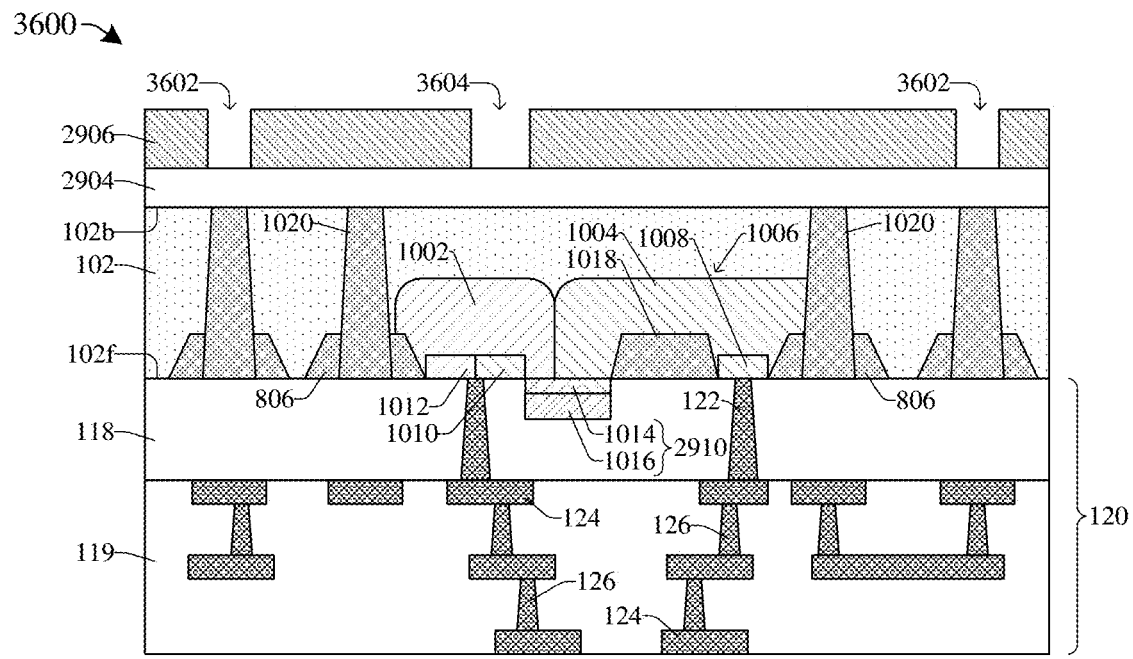

As shown in the cross-sectional view 3600 of FIG. 36, a patterning process is performed on the conductive layer 2906 to form a plurality of openings 3602 and a gap 3604 within the conductive layer 2906. In some embodiments, the patterning process includes: forming a patterned masking layer (not shown) on the conductive layer 2906; etching the conductive layer 2906 according to the patterned masking layer, thereby forming the openings 3602 and the gap 3604; and performing a removal process to remove the patterned masking layer (not shown). In various embodiments, etching may include a wet etch process, a dry etch process, a reactive ion etching (RIE) process, or the like. The gap 3604 may be laterally aligned with the source region 1010 of the second semiconductor device 1006. In further embodiments, the gap 3604 may be laterally aligned with another structure (e.g., the drain region 1008, the gate electrode 1016, etc.) of the second semiconductor device 1006 (e.g., see FIG. 31C or 31D).

Figure 37:
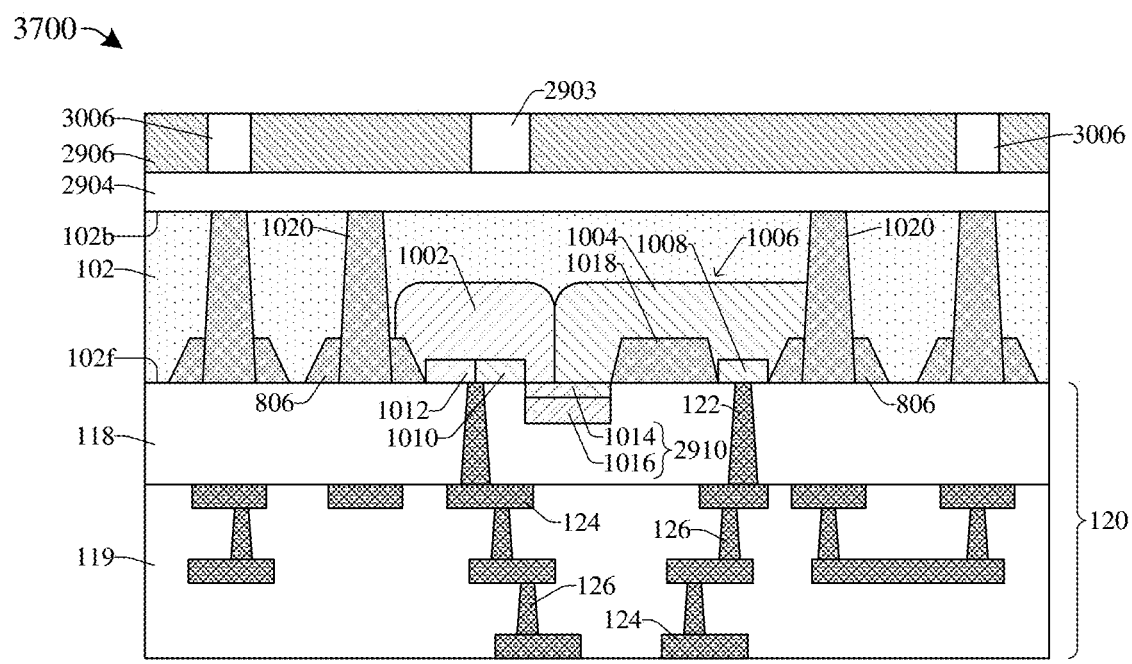

As shown in cross-sectional view 3700 of FIG. 37, a first dielectric structure 2903 and one or more second dielectric structures 3006 are formed within the gap (3604 of FIG. 36) and the openings (3602 of FIG. 36), respectively. In various embodiments, a process for forming the first and second dielectric structures 2903, 3006 comprises: depositing (e.g., by CVD, PVD, ALD, etc.) a dielectric material on the conductive layer 2906 and within the gap (3604 of FIG. 36) and the openings (3602 of FIG. 36); and performing a planarization process (e.g., a chemical mechanical polishing (CMP) or the like) to remove excess dielectric material from above the conductive layer 2906. The first and second dielectric structures 2903, 3006 may, for example, be or comprise silicon dioxide, silicon nitride, silicon carbide, another suitable dielectric material, or any combination of the foregoing. In further embodiments, the first and second dielectric structures 2903, 3006 comprise a same material as and/or are part of the insulating layer 2904.

Figure 38:
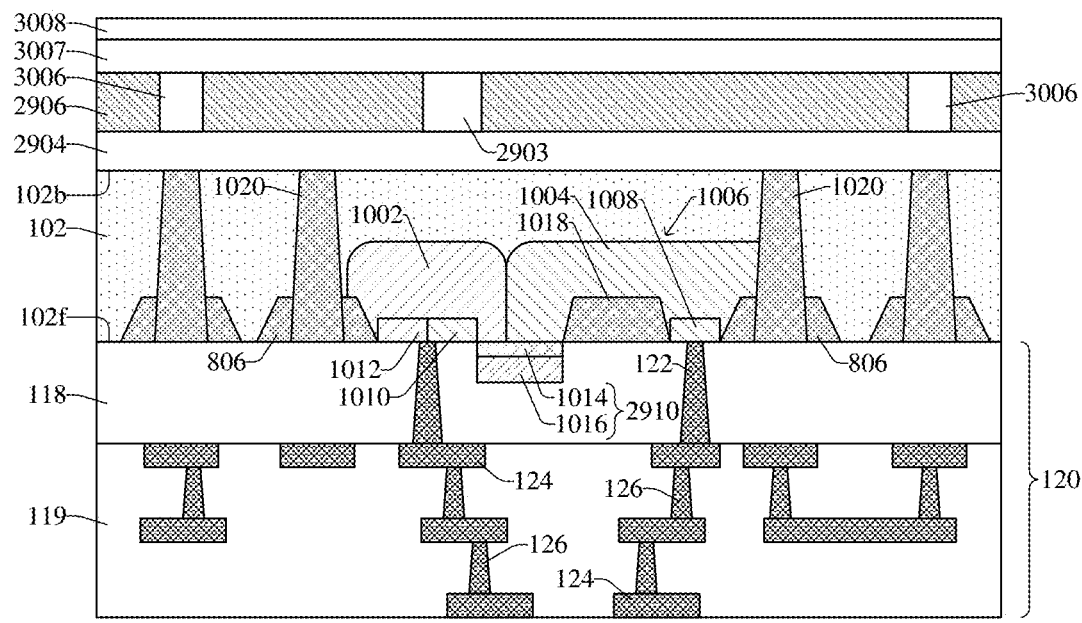

As shown in cross-sectional view 3800 of FIG. 38, a first dielectric layer 3007 is formed on the conductive layer 2906 and a second dielectric layer 3008 is formed on the first dielectric layer 3007. In some embodiments, the first and second dielectric layers 3007, 3008 are deposited by CVD, PVD, ALD, or another suitable deposition or growth process. The first and second dielectric layers 3007, 3008 may, for example, be or comprise silicon dioxide, silicon nitride, a low-k dielectric material, another dielectric material, or any combination of the foregoing.

Figure 39:
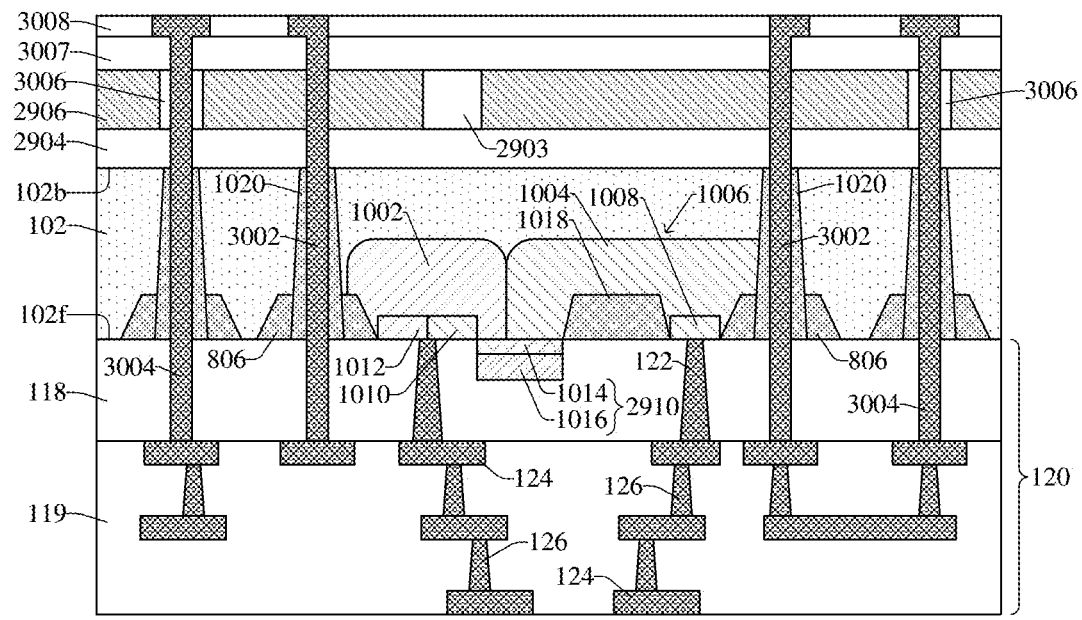

As shown in cross-sectional view 3900 of FIG. 39, a first plurality of TSVs 3002 and a second plurality of TSVs 3004 are formed extending through the conductive layer 2906 and the substrate 102. The first plurality of TSVs 3002 laterally surround the second semiconductor device 1006 and are electrically coupled to the conductive layer 2906. In some embodiments, a process for forming the first and second plurality of TSVs 3002, 3004 comprises: forming a first patterned masking layer (not shown) on the second dielectric layer 3008; patterning the second dielectric layer 3008 and underlying layers/structures to from a plurality of TSV openings; depositing (e.g., by CVD, PVD, electroplating, electroless plating, etc.) a conductive material over the second dielectric layer 3008 and within the plurality of TSV openings; and patterning the conductive material according to a second patterned masking layer (not shown). In various embodiments, the first and second plurality of TSVs 3002, 3004 may, for example, be or comprise polysilicon, doped polysilicon, copper, aluminum, gold, silver, platinum, another suitable conductive material, or any combination of the foregoing.

Figure 40:
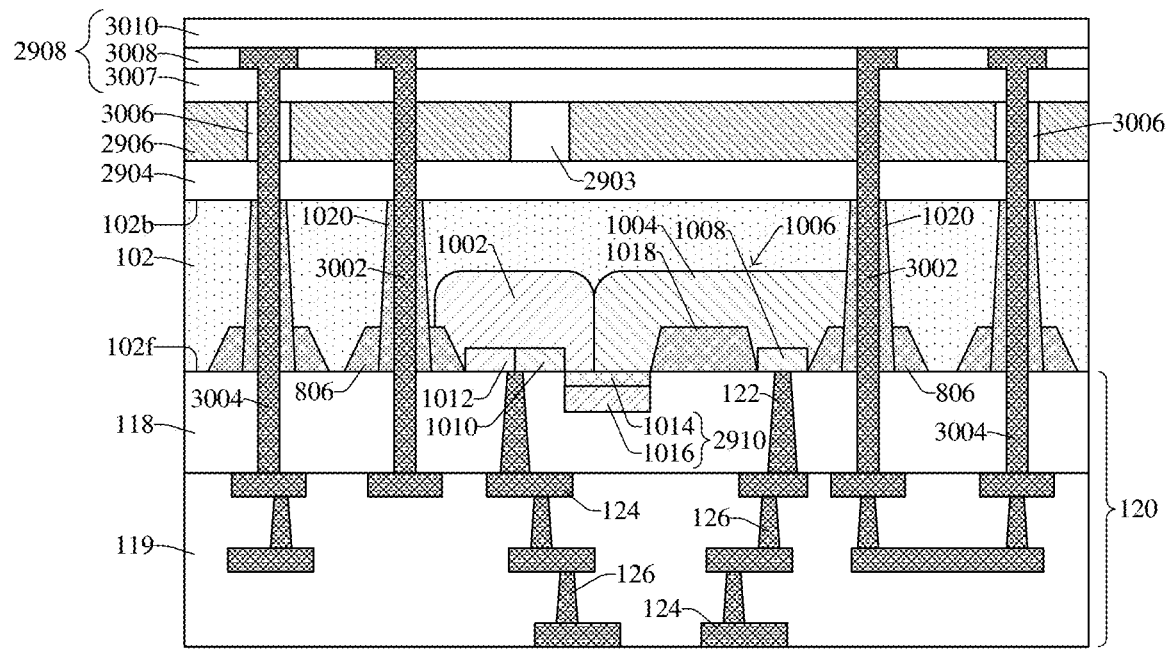

As shown in cross-sectional view 4000 of FIG. 40, a third passivation layer 3010 is formed on the second dielectric layer 3008. In some embodiments, the third passivation layer 3010 is deposited by CVD, PVD, ALD, or another suitable deposition or growth process. The third passivation layer 3010 may, for example, be or comprise silicon dioxide or another suitable dielectric material. In various embodiments, the third passivation layer 3010 is part of a back side dielectric structure 2908, where formation of the back side dielectric structure 2908 includes the processing steps illustrated and/or described in FIGS. 38 and 40.

Figure 41:
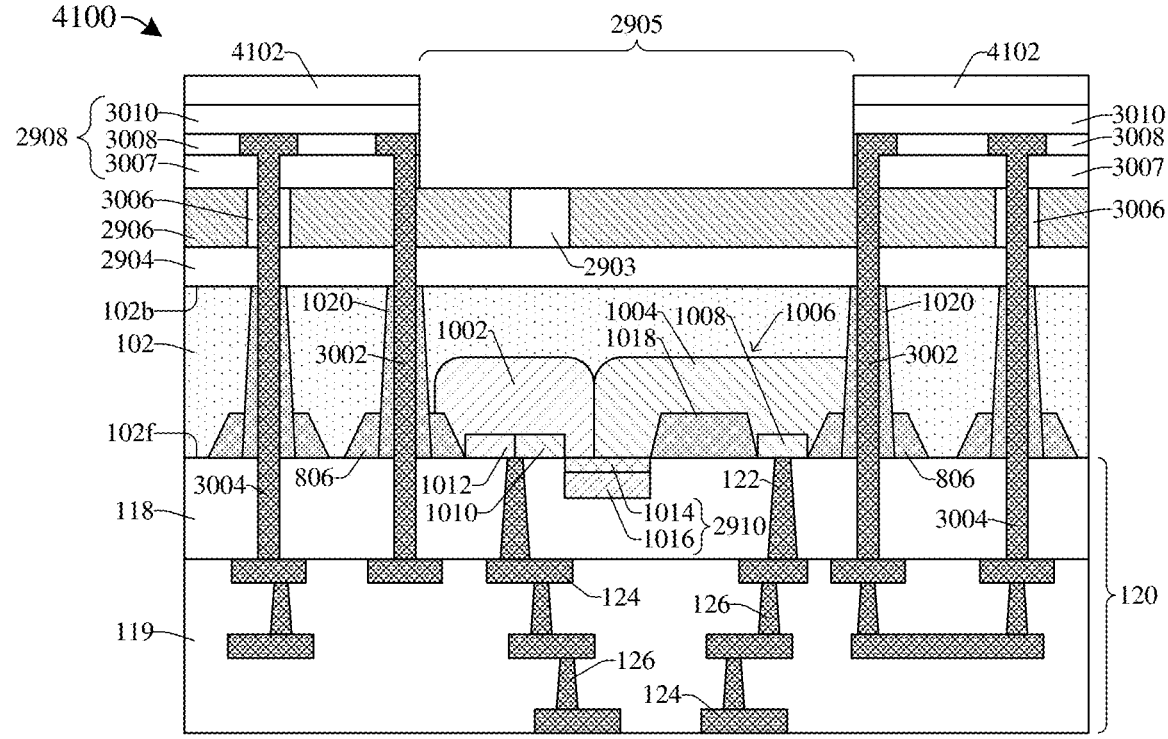

As shown in cross-sectional view 4100 of FIG. 41, a patterning process is performed on the back side dielectric structure 2908 to form an opening 2905 that exposes a surface of the conductive layer 2906 and a surface of the first dielectric structure 2903. In various embodiments, the opening 2905 is defined by sidewalls of the first dielectric layer 3007, sidewalls of the second dielectric layer 3008, sidewalls of the third passivation layer 3010, the surface of the conductive layer 2906, and the surface of the first dielectric structure 2903. In further embodiments, the opening 2905 is laterally aligned with the second semiconductor device 1006 and facilitates dissipating thermal energy generated by the second semiconductor device 1006 away from the substrate 102. In some embodiments, the patterning process includes: forming a patterned masking layer 4102 on the third passivation layer 3010; etching the back side dielectric structure 2908 according to the patterned masking layer 4102; and performing a removal process to remove the patterned masking layer 4102 (not shown). In some embodiments, etching the back side dielectric structure 2908 includes performing a wet etch process, a dry etch process, an RIE process, or the like.

Figure 42:
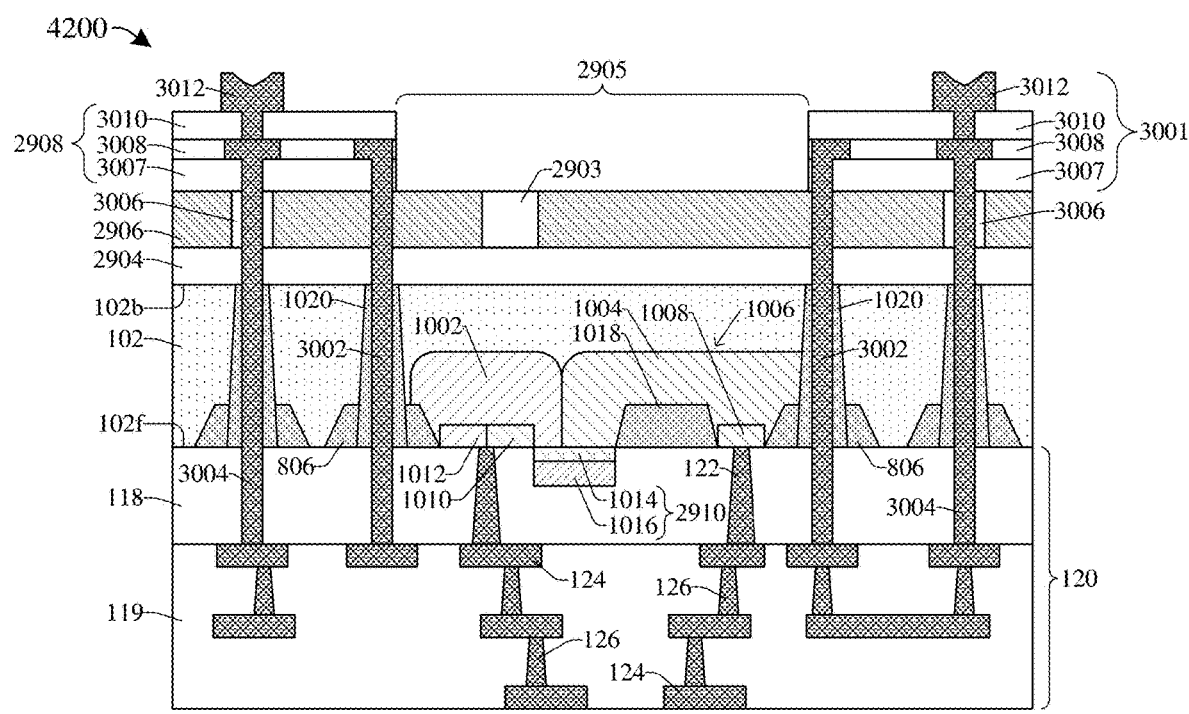

As shown in cross-sectional view 4200 of FIG. 42, a plurality of contact pads 3012 are formed on/within the third passivation layer 3010. The contact pads 3012 may, for example, be or comprise nickel, gold, copper, aluminum, another metal material, or any combination of the foregoing.

Figure 43:
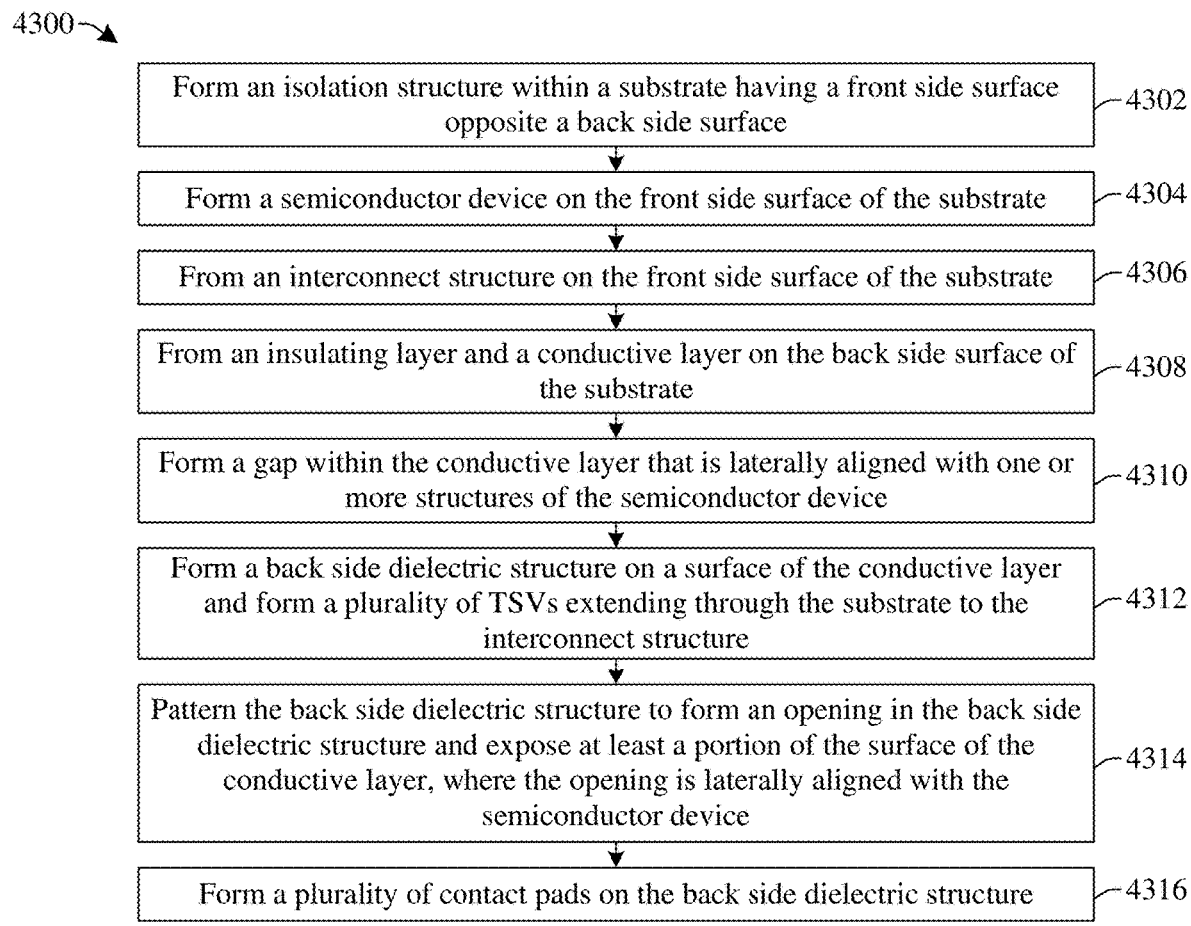
FIG. 43 illustrates a flowchart of some embodiments of a method for forming an IC comprising an opening disposed in a back side dielectric structure.

FIG. 43 illustrates a flowchart 4300 of some embodiments of a method for forming an IC comprising an opening disposed in a back side dielectric structure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 4302, an isolation structure is formed within a substrate having a front side surface opposite a back side surface. FIG. 32 illustrates the cross-sectional view 3200 corresponding to some embodiments of act 4302.

At act 4304, a semiconductor device is formed on the front side surface of the substrate. FIGS. 32 and 33 illustrate cross-sectional views 3200 and 3300 corresponding to some embodiments of act 4304.

At act 4306, an interconnect structure is formed on the front side surface of the substrate. FIG. 34 illustrates the cross-sectional view 3400 corresponding to some embodiments of act 4306.

At act 4308, an insulating layer and a conductive layer are formed on the back side surface of the substrate. FIG. 35 illustrates the cross-sectional view 3500 corresponding to some embodiments of act 4308.

At act 4310, a gap is formed within the conductive layer such that the gap is laterally aligned with one or more structures of the semiconductor device. FIG. 36 illustrates the cross-sectional view 3600 corresponding to some embodiments of act 4310.

At act 4312, a back side dielectric structure is formed on a surface of the conductive layer. Further, a plurality of TSVs is formed extending through the substrate to the interconnect structure. FIGS. 38-40 illustrate cross-sectional views 3800-4000 corresponding to some embodiments of act 4312.

At act 4314, the back side dielectric structure is patterned to form an opening in the back side dielectric structure and expose at least a portion of the surface of the conductive layer. The opening is laterally aligned with the semiconductor device. FIG. 41 illustrates the cross-sectional view 4100 corresponding to some embodiments of act 4314.

At act 4316, a plurality of contact pads is formed on the back side dielectric structure. FIG. 42 illustrates the cross-sectional view 4200 corresponding to some embodiments of act 4316.

Accordingly, in some embodiments, the present application relates to an IC comprising a semiconductor device disposed within/on a front side surface of a substrate. A conductive layer is disposed on a back side surface of the substrate and a back side dielectric structure is disposed on a bottom surface of the conductive layer. The back side dielectric structure comprises sidewalls defining an opening that exposes at least a portion of the bottom surface of the back side dielectric structure, where the opening directly underlies the semiconductor device.

Figure 44:
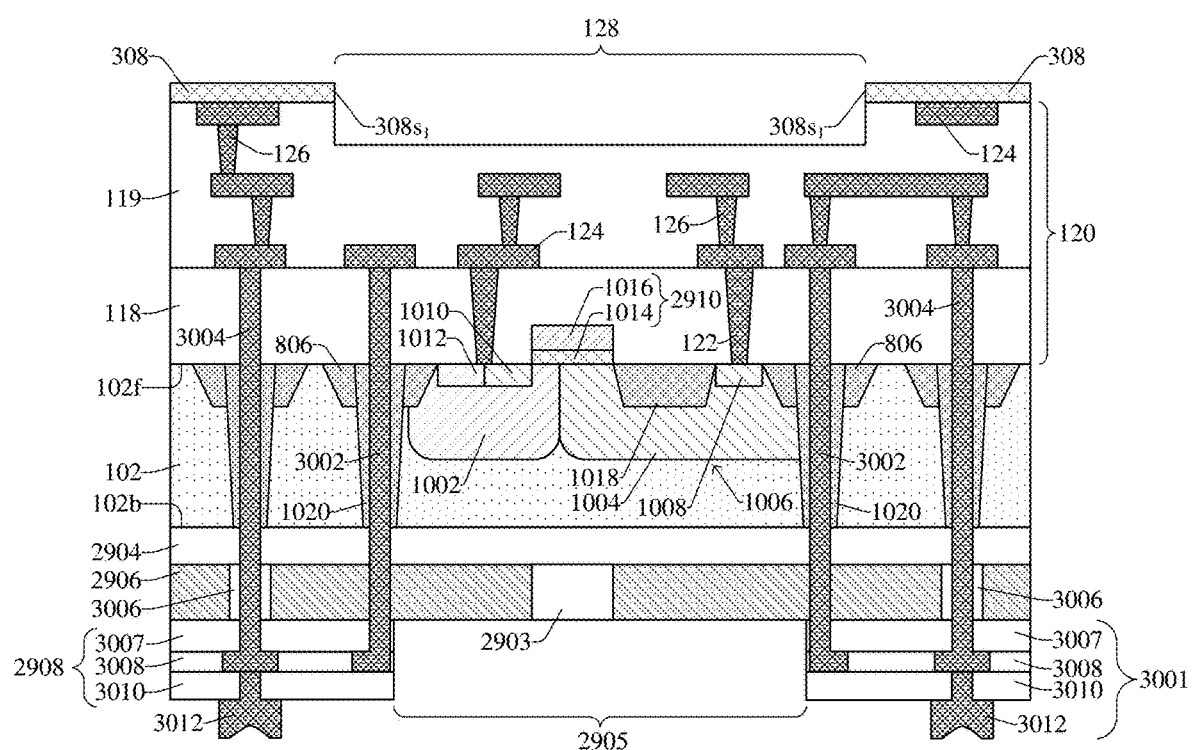
FIG. 44 illustrates a cross-sectional view of an IC in accordance with some alternative embodiments of the IC of FIG. 30A.

FIG. 44 illustrates a cross-sectional view 4400 of an IC in accordance with some alternative embodiments of the IC of FIG. 30A, in which the IC comprises both the opening 2905 and the opening 128. In some embodiments, the opening 128 overlies, at least partially, the opening 2905. In other embodiments, the opening 128 is laterally offset from the opening 2905. In some embodiments, because the IC comprises both the opening 2905 and the opening 128, the thermal energy generated by the second semiconductor device 1006 may be even more efficiently dissipated away from the second semiconductor device 1006.

In some embodiments, the present application provides an integrated chip (IC). The IC comprises a substrate. A semiconductor device is disposed on the substrate. An interlayer dielectric (ILD) structure is disposed over the substrate and the semiconductor device. A first intermetal dielectric (IMD) structure is disposed over the substrate and the ILD structure. An opening is disposed in the first IMD structure, wherein the opening overlies at least a portion of the semiconductor device.

In some embodiments, the present application provides an integrated chip (IC). The IC comprises a semiconductor-on-insulator (SOI) substrate, wherein the SOI substrate comprises a device layer disposed over an insulating layer. A semiconductor device is disposed on the device layer. An interlayer dielectric (ILD) structure is disposed over the substrate and the semiconductor device. An intermetal dielectric (IMD) structure is disposed over the substrate and the ILD structure. A conductive interconnect structure is embedded in the ILD structure and the IMD structure, wherein the conductive interconnect structure is defined by a plurality of conductive features. A passivation layer is disposed over the IMD structure and the conductive interconnect structure. A first opening is disposed in the passivation layer and the IMD structure, wherein the first opening overlies at least a portion of the semiconductor device, and wherein each of the plurality of conductive features are spaced from the first opening.

In some embodiments, the present application provides a method for forming an integrated chip (IC). The method comprises receiving a workpiece comprising a semiconductor-on-insulator (SOI) substrate, wherein a semiconductor device is disposed on a device layer of the SOI substrate, wherein an intermetal dielectric (IMD) structure is disposed over the device layer and the semiconductor device, and wherein a plurality of conductive features are disposed in the IMD structure and over the SOI substrate. A passivation layer is formed over the IMD structure and the plurality of conductive features. An opening is formed in the passivation layer and the IMD structure, wherein the opening overlies at least a portion of the semiconductor device.

In some embodiments, the present application provides an integrated circuit (IC) including: a substrate having a front side surface opposite a back side surface; a semiconductor device disposed on the front side surface of the substrate; an insulating layer disposed on the back side surface of the substrate; a conductive layer disposed on the insulating layer; and a back side dielectric structure disposed along the conductive layer, wherein an opening is disposed within the back side dielectric structure and directly underlies at least a portion of the semiconductor device.

In some embodiments, the present application provides an integrated circuit (IC), including: a high voltage transistor disposed on a front surface of a substrate, wherein the high voltage transistor comprises a gate electrode spaced laterally between a source region and a drain region, wherein a well region is disposed between the source region and the drain region; a conductive layer disposed on a back side surface of the substrate; a first dielectric structure extending through the conductive layer and underlying the high voltage transistor; and a lower dielectric structure disposed on a bottom surface of the conductive layer, wherein the lower dielectric structure comprises sidewalls defining an opening that exposes at least a portion of the bottom surface of the conductive layer below the high voltage transistor.

In some embodiments, the present application provides a method for forming an integrated circuit (IC), including: forming a semiconductor device on a front side surface of a substrate; depositing an insulating layer on a back side surface of the substrate; depositing a conductive layer on the insulating layer; forming a back side dielectric structure on the conductive layer; and patterning the back side dielectric structure to form an opening that extends through the back side dielectric structure and exposes a surface of the conductive layer, wherein the semiconductor device is laterally within a perimeter of the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip (IC), comprising:
   forming a semiconductor device along a first side of a substrate;

forming a plurality of conductive features within an intermetal dielectric (IMD) structure formed on the first side of the substrate;
forming a passivation layer on the substrate, wherein the passivation layer is formed to continuously extend laterally past opposing sides of the semiconductor device;
forming an opening in the passivation layer, wherein the opening is vertically spaced apart from the semiconductor device;
forming a second semiconductor device within the substrate;
forming a second opening that extends through the passivation layer and the IMD structure, the second opening being directly over the second semiconductor device; and
wherein the opening has a different depth than the second opening.

2. The method of claim 1, wherein the passivation layer is vertically separated from the first side of the substrate by the IMD structure.

3. The method of claim 1,
wherein the plurality of conductive features include a first interconnect; and
wherein a bottom of the opening is formed by a horizontally extending surface of the IMD structure that is vertically between a top and a bottom of the first interconnect.

4. The method of claim 1, wherein forming the opening comprises:
etching the passivation layer and the IMD structure, wherein the IMD structure has a smaller height below the opening than laterally outside of the opening.

5. The method of claim 1, wherein the opening vertically extends past two or more of the plurality of conductive features.

6. The method of claim 1, wherein a perimeter of the opening laterally surrounds the semiconductor device in a closed loop path.

7. A method for forming an integrated chip (IC), comprising:
forming a semiconductor device along a first side of a substrate;
forming a plurality of conductive features within an intermetal dielectric (IMD) structure formed on the first side of the substrate;
forming a passivation layer on the substrate, wherein the passivation layer is formed to continuously extend laterally past opposing sides of the semiconductor device;
forming an opening in the passivation layer, wherein the opening is vertically spaced apart from the semiconductor device in a cross-sectional view;
wherein a perimeter of the opening laterally surrounds the semiconductor device in a closed loop in a plan-view; and
wherein one or more of the plurality of conductive features are vertically arranged directly between the opening and the semiconductor device.

8. The method of claim 7, further comprising:
etching the IMD structure according to the passivation layer to form a first opening within the IMD structure, wherein the first opening vertically extends past two or more of the plurality of conductive features.

9. The method of claim 8, further comprising:
forming a masking layer over the passivation layer and within the first opening; and
etching the passivation layer and the IMD structure according to the masking layer to form a second opening within the IMD structure, wherein the second opening is laterally separated from the first opening by one or more of the plurality of conductive features.

10. The method of claim 9, wherein the first opening extends into the IMD structure to a different depth than the second opening.

11. The method of claim 7, further comprising:
forming a second semiconductor device within the substrate; and
forming a second opening in the passivation layer, wherein the second opening is directly over the second semiconductor device and laterally separated from the opening by the passivation layer.

12. The method of claim 11, wherein the second opening has a different size than the opening.

13. A method for forming an integrated chip (IC), comprising:
forming a semiconductor device along a first side of a substrate;
forming a plurality of conductive features within an intermetal dielectric (IMD) structure formed on the first side of the substrate;
forming a passivation layer on the substrate, wherein the passivation layer is formed to continuously extend laterally past opposing sides of the semiconductor device;
forming an opening in the passivation layer and the IMD structure, wherein the opening is vertically spaced apart from the semiconductor device and laterally separated from one or more of the plurality of conductive features by the IMD structure; and
wherein the IMD structure comprises a plurality of inter-metal dielectric layers interleaved between a plurality of etch stop layers, the opening extending through two of the plurality of inter-metal dielectric layers and one of the plurality of etch stop layers.

14. The method of claim 13, wherein the plurality of conductive features comprise a conductive line, the passivation layer being formed to contact upper surfaces of both the conductive line and the IMD structure.

15. The method of claim 14, wherein the passivation layer has a lower surface that continuously extends past opposing sides of the conductive line in a cross-section after etching the passivation layer to form the opening.

16. The method of claim 13, wherein the opening laterally extends past the opposing sides of the semiconductor device.

17. The method of claim 13, wherein one or more of the plurality of conductive features are vertically arranged directly between the opening and the semiconductor device.

18. The method of claim 13, wherein the opening comprises a lower region having a first width and an upper region having a second width that is larger than the first width.

19. The method of claim 13, wherein one of the plurality of etch stop layers forms a bottom of the opening.

20. The method of claim 13, further comprising:
forming a second semiconductor device within the substrate;
forming a second opening that extends through the passivation layer and the IMD structure, the second opening being directly over the second semiconductor device; and wherein the opening has a different depth than the second opening.

\* \* \* \* \*